US010909804B2

(12) United States Patent
Arnone et al.

(10) Patent No.: US 10,909,804 B2
(45) Date of Patent: *Feb. 2, 2021

(54) MULTI-DIRECTIONAL SHOOTING INTERLEAVED WAGERING SYSTEM

(71) Applicant: Gamblit Gaming, LLC, Glendale, CA (US)

(72) Inventors: Miles Arnone, Sherborn, MA (US); Eric Meyerhofer, Pasadena, CA (US); Timothy Isaacson, Monrovia, CA (US); Edvard Toth, Santa Monica, CA (US); Carlos Schulte, Simi Valley, CA (US)

(73) Assignee: Gamblit Gaming, LLC, Monrovia, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/196,512

(22) Filed: Nov. 20, 2018

(65) Prior Publication Data

US 2019/0088084 A1 Mar. 21, 2019

Related U.S. Application Data

(63) Continuation of application No. 15/804,413, filed on Nov. 6, 2017, now Pat. No. 10,134,233, which is a continuation of application No. 14/995,151, filed on Jan. 13, 2016, now Pat. No. 9,811,974.

(60) Provisional application No. 62/103,544, filed on Jan. 14, 2015.

(51) Int. Cl.

| | |
|---|---|
| *G07F 17/32* | (2006.01) |
| *G07F 17/38* | (2006.01) |

(52) U.S. Cl.
CPC .......... *G07F 17/3244* (2013.01); *G07F 17/38* (2013.01); *H05K 999/99* (2013.01)

(58) Field of Classification Search
None
See application file for complete search history.

(56) References Cited

U.S. PATENT DOCUMENTS

| | | | |
|---|---|---|---|
| 5,413,357 | A | 5/1995 | Schulze et al. |
| 5,718,429 | A | 2/1998 | Keller |
| 5,785,592 | A | 7/1998 | Jacobsen |
| 5,853,324 | A | 12/1998 | Kami et al. |
| 5,963,745 | A | 10/1999 | Collins et al. |
| 6,050,895 | A | 4/2000 | Luciano |
| 6,165,071 | A | 12/2000 | Weiss |
| 6,227,974 | B1 | 5/2001 | Eilat |
| 6,267,669 | B1 | 7/2001 | Luciano |

(Continued)

FOREIGN PATENT DOCUMENTS

JP 20040097610 A1 5/2004

OTHER PUBLICATIONS

U.S. Appl. No. 14/815,764 Arnone, et al. filed Jul. 31, 2015.

(Continued)

*Primary Examiner* — Ronald Laneau
(74) *Attorney, Agent, or Firm* — Frank Cire

(57) ABSTRACT

An electronic gaming machine including an interactive processing device, a process controller and a wager controller that operate together to provide an interactive application, trigger a wager request based on user input, generate bonus items based on a wager result, allow additional input by a user, and generate a bonus item event based on the user inputs.

14 Claims, 23 Drawing Sheets

(56) References Cited

U.S. PATENT DOCUMENTS

| | | | |
|---|---|---|---|
| 6,302,791 | B1 | 10/2001 | Frohm et al. |
| 6,685,563 | B1 | 2/2004 | Meekins et al. |
| 6,712,693 | B1 | 3/2004 | Hettinger |
| 6,761,632 | B2 | 7/2004 | Bansemer et al. |
| 6,761,633 | B2 | 7/2004 | Riendeau |
| 6,764,397 | B1 | 7/2004 | Robb |
| 6,811,482 | B2 | 11/2004 | Letovsky |
| 7,118,105 | B2 | 10/2006 | Benevento |
| 7,294,058 | B1 | 11/2007 | Slomiany |
| 7,326,115 | B2 | 2/2008 | Baerlocher |
| 7,361,091 | B2 | 4/2008 | Letovsky |
| 7,517,282 | B1 | 4/2009 | Pryor |
| 7,575,517 | B2 | 8/2009 | Parham et al. |
| 7,682,239 | B2 | 3/2010 | Friedman et al. |
| 7,720,733 | B2 | 5/2010 | Jung |
| 7,753,770 | B2 | 7/2010 | Walker et al. |
| 7,753,790 | B2 | 7/2010 | Nguyen |
| 7,766,742 | B2 | 8/2010 | Bennett et al. |
| 7,775,885 | B2 | 8/2010 | Van Luchene |
| 7,798,896 | B2 | 9/2010 | Katz |
| 7,828,657 | B2 | 11/2010 | Booth |
| 7,917,371 | B2 | 3/2011 | Jung et al. |
| 7,931,531 | B2 | 4/2011 | Oberberger |
| 7,938,727 | B1 | 5/2011 | Konkle |
| 7,950,993 | B2 | 5/2011 | Oberberger |
| 7,967,674 | B2 | 6/2011 | Baerlocher |
| 7,980,948 | B2 | 7/2011 | Rowe |
| 7,996,264 | B2 | 8/2011 | Kusumoto et al. |
| 8,012,023 | B2 | 9/2011 | Gates |
| 8,047,908 | B2 | 11/2011 | Walker |
| 8,047,915 | B2 | 11/2011 | Lyle |
| 8,060,829 | B2 | 11/2011 | Jung et al. |
| 8,075,383 | B2 | 12/2011 | Friedman et al. |
| 8,087,999 | B2 | 1/2012 | Oberberger |
| 8,113,938 | B2 | 2/2012 | Friedman et al. |
| 8,118,654 | B1 | 2/2012 | Nicolas |
| 8,128,487 | B2 | 3/2012 | Hamilton et al. |
| 8,135,648 | B2 | 3/2012 | Oram |
| 8,137,193 | B1 | 3/2012 | Kelly et al. |
| 8,142,272 | B2 | 3/2012 | Walker |
| 8,157,653 | B2 | 4/2012 | Buhr |
| 8,167,695 | B2 | 5/2012 | Rowe |
| 8,167,699 | B2 | 5/2012 | Inamura |
| 8,177,628 | B2 | 5/2012 | Manning |
| 8,182,338 | B2 | 5/2012 | Thomas |
| 8,182,339 | B2 | 5/2012 | Anderson |
| 8,187,068 | B2 | 5/2012 | Slomiany |
| 8,206,210 | B2 | 6/2012 | Walker |
| 8,308,544 | B2 | 11/2012 | Friedman |
| 8,430,735 | B2 | 4/2013 | Oberberger |
| 8,475,266 | B2 | 7/2013 | Arnone |
| 8,480,470 | B2 | 7/2013 | Napolitano et al. |
| 8,485,893 | B2 | 7/2013 | Rowe |
| 8,622,809 | B1 | 1/2014 | Arora et al. |
| 8,864,564 | B2 | 10/2014 | Oberberger |
| 8,998,694 | B2 | 4/2015 | Rowe |
| 9,070,257 | B1 | 6/2015 | Scalise |
| 9,092,946 | B2 | 7/2015 | Rowe |
| 9,111,412 | B2 | 8/2015 | Rowe |
| 9,454,873 | B2 | 9/2016 | Rowe |
| 10,083,575 | B2 * | 9/2018 | Arnone ............... G07F 17/3262 |
| 2001/0004609 | A1 | 6/2001 | Walker et al. |
| 2001/0019965 | A1 | 9/2001 | Ochi |
| 2002/0022509 | A1 | 2/2002 | Nicastro et al. |
| 2002/0090990 | A1 | 7/2002 | Joshi et al. |
| 2002/0175471 | A1 | 11/2002 | Faith |
| 2003/0060286 | A1 | 3/2003 | Walker et al. |
| 2003/0119576 | A1 | 6/2003 | McClintic et al. |
| 2003/0139214 | A1 | 7/2003 | Wolf et al. |
| 2003/0171149 | A1 | 9/2003 | Rothschild |
| 2003/0204565 | A1 | 10/2003 | Guo et al. |
| 2003/0211879 | A1 | 11/2003 | Englman |
| 2004/0092313 | A1 | 5/2004 | Saito et al. |
| 2004/0102238 | A1 | 5/2004 | Taylor |
| 2004/0121839 | A1 | 6/2004 | Webb |

| | | | |
|---|---|---|---|
| 2004/0225387 | A1 | 11/2004 | Smith |
| 2005/0003878 | A1 | 1/2005 | Updike |
| 2005/0096124 | A1 | 5/2005 | Stronach |
| 2005/0116411 | A1 | 6/2005 | Herrmann et al. |
| 2005/0192087 | A1 | 9/2005 | Friedman et al. |
| 2005/0233791 | A1 | 10/2005 | Kane |
| 2005/0233806 | A1 | 10/2005 | Kane et al. |
| 2005/0239538 | A1 | 10/2005 | Dixon |
| 2005/0269778 | A1 | 12/2005 | Samberg |
| 2005/0288101 | A1 | 12/2005 | Lockton et al. |
| 2006/0003823 | A1 | 1/2006 | Zhang |
| 2006/0003830 | A1 | 1/2006 | Walker et al. |
| 2006/0035696 | A1 | 2/2006 | Walker |
| 2006/0040735 | A1 | 2/2006 | Baerlocher |
| 2006/0068913 | A1 | 3/2006 | Walker et al. |
| 2006/0084499 | A1 | 4/2006 | Moshal |
| 2006/0084505 | A1 | 4/2006 | Yoseloff |
| 2006/0135250 | A1 | 6/2006 | Rossides |
| 2006/0154710 | A1 | 7/2006 | Serafat |
| 2006/0166729 | A1 | 7/2006 | Saffari et al. |
| 2006/0189371 | A1 | 8/2006 | Walker et al. |
| 2006/0223611 | A1 | 10/2006 | Baerlocher |
| 2006/0234791 | A1 | 10/2006 | Nguyen et al. |
| 2006/0240890 | A1 | 10/2006 | Walker |
| 2006/0246403 | A1 | 11/2006 | Monpouet et al. |
| 2006/0258433 | A1 | 11/2006 | Finocchio et al. |
| 2007/0026924 | A1 | 2/2007 | Taylor |
| 2007/0035548 | A1 | 2/2007 | Jung et al. |
| 2007/0038559 | A1 | 2/2007 | Jung et al. |
| 2007/0064074 | A1 | 3/2007 | Silverbrook et al. |
| 2007/0087799 | A1 | 4/2007 | Van Luchene |
| 2007/0093299 | A1 | 4/2007 | Bergeron |
| 2007/0099696 | A1 | 5/2007 | Nguyen et al. |
| 2007/0117641 | A1 | 5/2007 | Walker et al. |
| 2007/0129149 | A1 | 6/2007 | Walker |
| 2007/0142108 | A1 | 6/2007 | Linard |
| 2007/0156509 | A1 | 7/2007 | Jung et al. |
| 2007/0167212 | A1 | 7/2007 | Nguyen |
| 2007/0167239 | A1 | 7/2007 | O'Rourke |
| 2007/0173311 | A1 | 7/2007 | Morrow et al. |
| 2007/0191104 | A1 | 8/2007 | Van Luchene |
| 2007/0202941 | A1 | 8/2007 | Miltenberger |
| 2007/0203828 | A1 | 8/2007 | Jung et al. |
| 2007/0207847 | A1 | 9/2007 | Thomas |
| 2007/0259717 | A1 | 11/2007 | Mattice |
| 2007/0293306 | A1 | 12/2007 | Nee et al. |
| 2008/0004107 | A1 | 1/2008 | Nguyen et al. |
| 2008/0014835 | A1 | 1/2008 | Weston et al. |
| 2008/0015004 | A1 | 1/2008 | Gatto et al. |
| 2008/0064488 | A1 | 3/2008 | Oh |
| 2008/0070659 | A1 | 3/2008 | Naicker |
| 2008/0070690 | A1 | 3/2008 | Van Luchene |
| 2008/0070702 | A1 | 3/2008 | Kaminkow |
| 2008/0096665 | A1 | 4/2008 | Cohen |
| 2008/0108406 | A1 | 5/2008 | Oberberger |
| 2008/0108425 | A1 | 5/2008 | Oberberger |
| 2008/0113704 | A1 | 5/2008 | Jackson |
| 2008/0119283 | A1 | 5/2008 | Baerlocher |
| 2008/0146308 | A1 | 6/2008 | Okada |
| 2008/0161081 | A1 | 7/2008 | Berman |
| 2008/0176619 | A1 | 7/2008 | Kelly |
| 2008/0191418 | A1 | 8/2008 | Lutnick et al. |
| 2008/0195481 | A1 | 8/2008 | Lutnick |
| 2008/0248850 | A1 | 10/2008 | Schugar |
| 2008/0254893 | A1 | 10/2008 | Patel |
| 2008/0274796 | A1 | 11/2008 | Lube |
| 2008/0274798 | A1 | 11/2008 | Walker et al. |
| 2008/0311980 | A1 | 12/2008 | Cannon |
| 2008/0318668 | A1 | 12/2008 | Ching |
| 2009/0011827 | A1 | 1/2009 | Englman |
| 2009/0023489 | A1 | 1/2009 | Toneguzzo |
| 2009/0023492 | A1 | 1/2009 | Erfanian |
| 2009/0061974 | A1 | 3/2009 | Lutnick et al. |
| 2009/0061975 | A1 | 3/2009 | Ditchev |
| 2009/0061991 | A1 | 3/2009 | Popovich |
| 2009/0061997 | A1 | 3/2009 | Popovich |
| 2009/0061998 | A1 | 3/2009 | Popovich |
| 2009/0061999 | A1 | 3/2009 | Popovich |
| 2009/0082093 | A1 | 3/2009 | Okada |

(56) References Cited

U.S. PATENT DOCUMENTS

| | | | |
|---|---|---|---|
| 2009/0088239 | A1 | 4/2009 | Iddings |
| 2009/0098934 | A1 | 4/2009 | Amour |
| 2009/0118006 | A1 | 5/2009 | Kelly et al. |
| 2009/0124344 | A1 | 5/2009 | Mitchell et al. |
| 2009/0131158 | A1 | 5/2009 | Brunet De Courssou et al. |
| 2009/0131175 | A1 | 5/2009 | Kelly et al. |
| 2009/0143141 | A1 | 6/2009 | Wells |
| 2009/0149233 | A1 | 6/2009 | Strause et al. |
| 2009/0156297 | A1 | 6/2009 | Andersson et al. |
| 2009/0176560 | A1 | 7/2009 | Herrmann et al. |
| 2009/0176566 | A1 | 7/2009 | Kelly |
| 2009/0181777 | A1 | 7/2009 | Christiani |
| 2009/0221355 | A1 | 9/2009 | Dunaevsky et al. |
| 2009/0239610 | A1 | 9/2009 | Olive |
| 2009/0247272 | A1 | 10/2009 | Abe |
| 2009/0270164 | A1 | 10/2009 | Seelig |
| 2009/0275393 | A1 | 11/2009 | Kisenwether |
| 2009/0291755 | A1 | 11/2009 | Walker et al. |
| 2009/0309305 | A1 | 12/2009 | May |
| 2009/0312093 | A1 | 12/2009 | Walker et al. |
| 2009/0325686 | A1 | 12/2009 | Davis |
| 2010/0004058 | A1 | 1/2010 | Acres |
| 2010/0016056 | A1 | 1/2010 | Thomas et al. |
| 2010/0029373 | A1 | 2/2010 | Graham et al. |
| 2010/0035674 | A1 | 2/2010 | Slomiany |
| 2010/0056247 | A1 | 3/2010 | Nicely |
| 2010/0056260 | A1 | 3/2010 | Fujimoto |
| 2010/0062836 | A1 | 3/2010 | Young |
| 2010/0093420 | A1 | 4/2010 | Wright |
| 2010/0093444 | A1 | 4/2010 | Biggar et al. |
| 2010/0105454 | A1 | 4/2010 | Weber |
| 2010/0120525 | A1 | 5/2010 | Baerlocher et al. |
| 2010/0124983 | A1 | 5/2010 | Gowin et al. |
| 2010/0137047 | A1 | 6/2010 | Englman et al. |
| 2010/0174593 | A1 | 7/2010 | Cao |
| 2010/0184509 | A1 | 7/2010 | Sylla et al. |
| 2010/0203940 | A1 | 8/2010 | Alderucci et al. |
| 2010/0210344 | A1 | 8/2010 | Edidin et al. |
| 2010/0227672 | A1 | 9/2010 | Amour |
| 2010/0227688 | A1 | 9/2010 | Lee |
| 2010/0240436 | A1 | 9/2010 | Wilson et al. |
| 2010/0285869 | A1 | 11/2010 | Walker |
| 2010/0304825 | A1 | 12/2010 | Davis |
| 2010/0304839 | A1 | 12/2010 | Johnson |
| 2010/0304842 | A1 | 12/2010 | Friedman et al. |
| 2011/0009177 | A1 | 1/2011 | Katz |
| 2011/0009178 | A1 | 1/2011 | Gerson |
| 2011/0045896 | A1 | 2/2011 | Sak et al. |
| 2011/0070945 | A1 | 3/2011 | Walker |
| 2011/0077087 | A1 | 3/2011 | Walker et al. |
| 2011/0082571 | A1 | 4/2011 | Murdock et al. |
| 2011/0105206 | A1 | 5/2011 | Rowe et al. |
| 2011/0107239 | A1 | 5/2011 | Adoni |
| 2011/0109454 | A1 | 5/2011 | McSheffrey |
| 2011/0111820 | A1 | 5/2011 | Filipour |
| 2011/0111837 | A1 | 5/2011 | Gagner |
| 2011/0111841 | A1 | 5/2011 | Tessmer |
| 2011/0118011 | A1 | 5/2011 | Filipour et al. |
| 2011/0201413 | A1 | 8/2011 | Oberberger |
| 2011/0207523 | A1 | 8/2011 | Filipour et al. |
| 2011/0212766 | A1 | 9/2011 | Bowers |
| 2011/0212767 | A1 | 9/2011 | Barclay |
| 2011/0218028 | A1 | 9/2011 | Acres |
| 2011/0218035 | A1 | 9/2011 | Thomas |
| 2011/0230258 | A1 | 9/2011 | Van Luchene |
| 2011/0230260 | A1 | 9/2011 | Morrow et al. |
| 2011/0230267 | A1 | 9/2011 | Van Luchene |
| 2011/0244944 | A1 | 10/2011 | Baerlocher |
| 2011/0263312 | A1 | 10/2011 | De Waal |
| 2011/0269522 | A1 | 11/2011 | Nicely et al. |
| 2011/0275440 | A1 | 11/2011 | Faktor |
| 2011/0287828 | A1 | 11/2011 | Anderson et al. |
| 2011/0287841 | A1 | 11/2011 | Watanabe |
| 2011/0312408 | A1 | 12/2011 | Okuaki |
| 2011/0319169 | A1 | 12/2011 | Lam |
| 2012/0004747 | A1 | 1/2012 | Kelly |
| 2012/0028718 | A1 | 2/2012 | Barclay et al. |
| 2012/0058814 | A1 | 3/2012 | Lutnick |
| 2012/0077569 | A1 | 3/2012 | Watkins |
| 2012/0108323 | A1 | 5/2012 | Kelly |
| 2012/0135793 | A1 | 5/2012 | Antonopoulos |
| 2012/0202587 | A1 | 8/2012 | Allen |
| 2012/0302311 | A1 | 11/2012 | Luciano |
| 2012/0322545 | A1 | 12/2012 | Arnone et al. |
| 2013/0029760 | A1* | 1/2013 | Wickett .................. A63F 13/12 463/29 |
| 2013/0131848 | A1 | 5/2013 | Arnone et al. |
| 2013/0190074 | A1 | 7/2013 | Arnone et al. |
| 2013/0260869 | A1 | 10/2013 | Leandro et al. |
| 2014/0087801 | A1 | 3/2014 | Nicely et al. |
| 2014/0087808 | A1* | 3/2014 | Basallo ............... G07F 17/3262 463/16 |
| 2014/0087809 | A1 | 3/2014 | Leupp et al. |
| 2014/0357350 | A1 | 12/2014 | Weingardt et al. |
| 2017/0148271 | A1 | 5/2017 | Graboyes Goldman et al. |

OTHER PUBLICATIONS

U.S. Appl. No. 14/815,774 Arnone, et al. filed Jul. 31, 2015.
U.S. Appl. No. 14/817,032 Arnone, et al. filed Aug. 3, 2015.
U.S. Appl. No. 14/822,890 Arnone, et al. filed Aug. 10, 2015.
U.S. Appl. No. 14/823,951 Arnone, et al. filed Aug. 11, 2015.
U.S. Appl. No. 14/823,987 Arnone, et al. filed Aug. 11, 2015.
U.S. Appl. No. 14/825,056 Arnone, et al. filed Aug. 12, 2015.
U.S. Appl. No. 14/835,590 Arnone, et al. filed Aug. 25, 2015.
U.S. Appl. No. 14/836,902 Arnone, et al. filed Aug. 26, 2015.
U.S. Appl. No. 14/839,647 Arnone, et al. filed Aug. 28, 2015.
U.S. Appl. No. 14/842,684 Arnone, et al. filed Sep. 1, 2015.
U.S. Appl. No. 14/842,785 Arnone, et al. filed Sep. 1, 2015.
U.S. Appl. No. 14/854,021 Arnone, et al. filed Sep. 14, 2015.
U.S. Appl. No. 14/855,322 Arnone, et al. filed Sep. 15, 2015.
U.S. Appl. No. 14/859,065 Arnone, et al. filed Sep. 18, 2015.
U.S. Appl. No. 14/865,422 Arnone, et al. filed Sep. 25, 2015.
U.S. Appl. No. 14/867,809 Arnone, et al. filed Sep. 28, 2015.
U.S. Appl. No. 14/868,287 Arnone, et al. filed Sep. 28, 2015.
U.S. Appl. No. 14/868,364 Arnone, et al. filed Sep. 28, 2015.
U.S. Appl. No. 14/869,809 Arnone, et al. filed Sep. 29, 2015.
U.S. Appl. No. 14/869,819 Arnone, et al. filed Sep. 29, 2015.
U.S. Appl. No. 14/885,894 Arnone, et al. filed Oct. 16, 2015.
U.S. Appl. No. 14/919,665 Arnone, et al. filed Oct. 21, 2015.
U.S. Appl. No. 14/942,844 Arnone, et al. filed Nov. 16, 2015.
U.S. Appl. No. 14/942,883 Arnone, et al. filed Nov. 16, 2015.
U.S. Appl. No. 14/949,759 Arnone, et al. filed Nov. 23, 2015.
U.S. Appl. No. 14/952,758 Arnone, et al. filed Nov. 25, 2015.
U.S. Appl. No. 14/952,769 Arnone, et al. filed Nov. 25, 2015.
U.S. Appl. No. 14/954,922 Arnone, et al. filed Nov. 30, 2015.
U.S. Appl. No. 14/954,931 Arnone, et al. filed Nov. 30, 2015.
U.S. Appl. No. 14/955,000 Arnone, et al. filed Nov. 30, 2015.
U.S. Appl. No. 14/956,301 Arnone, et al. filed Dec. 1, 2015.
U.S. Appl. No. 14/965,231 Arnone, et al. filed Dec. 10, 2015.
U.S. Appl. No. 14/965,846 Arnone, et al. filed Dec. 10, 2015.
U.S. Appl. No. 14/981,640 Arnone, et al. filed Dec. 28, 2015.
U.S. Appl. No. 14/981,775 Arnone, et al. filed Dec. 28, 2015.
U.S. Appl. No. 14/984,943 Arnone, et al. filed Dec. 30, 2015.
U.S. Appl. No. 14/984,965 Arnone, et al. filed Dec. 30, 2015.
U.S. Appl. No. 14/984,978 Arnone, et al. filed Dec. 30, 2015.
U.S. Appl. No. 14/985,107 Arnone, et al. filed Dec. 30, 2015.
U.S. Appl. No. 14/995,151 Arnone, et al. filed Jan. 13, 2016.
U.S. Appl. No. 14/974,432 Arnone, et al. filed Dec. 18, 2015.
U.S. Appl. No. 14/997,413 Arnone, et al. filed Jan. 15, 2016.
U.S. Appl. No. 15/002,233 Arnone, et al. filed Jan. 20, 2016.
U.S. Appl. No. 15/005,944 Arnone, et al. filed Jan. 25, 2016.
U.S. Appl. No. 15/011,322 Arnone, et al. filed Jan. 29, 2016.
U.S. Appl. No. 15/051,535 Arnone, et al. filed Feb. 23, 2016.
U.S. Appl. No. 15/053,236 Arnone, et al. filed Feb. 25, 2016.
U.S. Appl. No. 15/057,095 Arnone, et al. filed Feb. 29, 2016.
U.S. Appl. No. 15/060,502 Arnone, et al. filed Mar. 3, 2016.
U.S. Appl. No. 16/108,049 Arnone, et al. filed Aug. 21, 2018.
U.S. Appl. No. 16/108,052 Arnone, et al. filed Aug. 21, 2018.

(56) References Cited

OTHER PUBLICATIONS

U.S. Appl. No. 16/108,056 Arnone, et al. filed Aug. 21, 2018.
U.S. Appl. No. 16/113,494 Arnone, et al. filed Aug. 27, 2018.
U.S. Appl. No. 16/113,612 Arnone, et al. filed Aug. 27, 2018.
U.S. Appl. No. 16/120,619 Arnone, et al. filed Sep. 4, 2018.
U.S. Appl. No. 16/120,691 Arnone, et al. filed Sep. 4, 2018.
U.S. Appl. No. 16/126,151 Arnone, et al. filed Sep. 10, 2018.
U.S. Appl. No. 16/126,547 Arnone, et al. filed Sep. 10, 2018.
U.S. Appl. No. 16/127,184 Arnone, et al. filed Sep. 10, 2018.
U.S. Appl. No. 16/128,364 Arnone, et al. filed Sep. 11, 2018.
U.S. Appl. No. 16/128,484 Arnone, et al. filed Sep. 11, 2018.
U.S. Appl. No. 16/129,752 Arnone, et al. filed Sep. 12, 2018.
U.S. Appl. No. 16/141,208 Arnone, et al. filed Sep. 25, 2018.
U.S. Appl. No. 16/141,222 Arnone, et al. filed Sep. 25, 2018.
U.S. Appl. No. 16/149,065 Arnone, et al. filed Oct. 1, 2018.
U.S. Appl. No. 16/149,675 Arnone, et al. filed Oct. 2, 2018.
U.S. Appl. No. 16/149,940 Arnone, et al. filed Oct. 2, 2018.
U.S. Appl. No. 16/161,009 Arnone, et al. filed Oct. 11, 2018.
U.S. Appl. No. 16/161,011 Arnone, et al. filed Oct. 15, 2018.
U.S. Appl. No. 14/205,303 Arnone, et al., filed Mar. 11, 2014.
U.S. Appl. No. 14/205,306 Arnone, et al., filed Mar. 11, 2014.
U.S. Appl. No. 14/209,485 Arnone, et al., filed Mar. 13, 2014.
U.S. Appl. No. 14/214,310 Arnone, et al., filed Mar. 14, 2014.
U.S. Appl. No. 14/222,520 Arnone, et al., filed Mar. 21, 2014.
U.S. Appl. No. 14/253,813 Arnone, et al., filed Apr. 15, 2014.
U.S. Appl. No. 14/255,253 Arnone, et al., filed Apr. 17, 2014.
U.S. Appl. No. 14/255,919 Arnone, et al. filed Apr. 17, 2014.
U.S. Appl. No. 14/263,988 Arnone, et al. filed Apr. 28, 2014.
U.S. Appl. No. 14/270,335 Arnone, et al. filed May 5, 2014.
U.S. Appl. No. 14/271,360 Arnone, et al. filed May 6, 2014.
U.S. Appl. No. 13/961,849 Arnone, et al. filed Aug. 7, 2013.
U.S. Appl. No. 13/746,850 Arnone, et al. filed Jan. 22, 2013.
U.S. Appl. No. 14/288,169 Arnone, et al. filed May 27, 2014.
U.S. Appl. No. 14/304,027 Arnone, et al. filed Jun. 13, 2014.
U.S. Appl. No. 14/306,187 Arnone, et al. filed Jun. 16, 2014.
U.S. Appl. No. 14/312,623 Arnone, et al. filed Jun. 23, 2014.
U.S. Appl. No. 14/330,249 Arnone, et al. filed Jul. 14, 2014.
U.S. Appl. No. 14/339,142 Arnone, et al. filed Jul. 23, 2014.
U.S. Appl. No. 14/458,206 Arnone, et al. filed Aug. 12, 2014.
U.S. Appl. No. 14/461,344 Arnone, et al. filed Aug. 15, 2014.
U.S. Appl. No. 14/462,516 Arnone, et al. filed Aug. 18, 2014.
U.S. Appl. No. 14/467,646 Meyerhofer, et al. filed Aug. 25, 2014.
U.S. Appl. No. 14/474,023 Arnone, et al. filed Aug. 29, 2014.
U.S. Appl. No. 14/486,895 Arnone, et al. filed Sep. 15, 2014.
U.S. Appl. No. 14/507,206 Arnone, et al. filed Oct. 6, 2014.
U.S. Appl. No. 14/521,338 Arnone, et al. filed Oct. 22, 2014.
U.S. Appl. No. 14/535,808 Arnone, et al. filed Nov. 7, 2014.
U.S. Appl. No. 14/535,816 Arnone, et al. filed Nov. 7, 2014.
U.S. Appl. No. 14/536,231 Arnone, et al. filed Nov. 7, 2014.
U.S. Appl. No. 14/536,280 Arnone, et al. filed Nov. 7, 2014.
U.S. Appl. No. 14/549,137 Arnone, et al. filed Nov. 20, 2014.
U.S. Appl. No. 14/550,802 Arnone, et al. filed Nov. 21, 2014.
U.S. Appl. No. 14/555,401 Arnone, et al. filed Nov. 26, 2014.
U.S. Appl. No. 14/559,840 Arnone, et al. filed Dec. 3, 2014.
U.S. Appl. No. 14/564,834 Arnone, et al. filed Dec. 9, 2014.
U.S. Appl. No. 14/570,746 Arnone, et al. filed Dec. 15, 2014.
U.S. Appl. No. 14/570,857 Arnone, et al. filed Dec. 15, 2014.
U.S. Appl. No. 14/586,626 Arnone, et al. filed Dec. 30, 2014.
U.S. Appl. No. 14/586,639 Arnone, et al. filed Dec. 30, 2014.
U.S. Appl. No. 14/185,847 Arnone, et al., filed Feb. 20, 2014.
U.S. Appl. No. 14/203,459 Arnone, et al., filed Mar. 10, 2014.
U.S. Appl. No. 14/205,272 Arnone, et al., filed Mar. 11, 2014.
U.S. Appl. No. 13/854,658, Arnone, et al., filed Apr. 1, 2013.
U.S. Appl. No. 13/855,676, Arnone, et al., filed Apr. 2, 2013.
U.S. Appl. No. 13/872,946, Arnone, et al., filed Apr. 29, 2013.
U.S. Appl. No. 13/886,245, Arnone, et al., filed May 2, 2013.
U.S. Appl. No. 13/888,326, Arnone, et al., filed May 6, 2013.
U.S. Appl. No. 13/890,207, Arnone, et al., filed May 8, 2013.
U.S. Appl. No. 13/896,783, Arnone, et al., filed May 17, 2013.
U.S. Appl. No. 13/898,222, Arnone, et al., filed May 20, 2013.
U.S. Appl. No. 13/900,363, Arnone, et al., filed May 22, 2013.
U.S. Appl. No. 13/903,895, Arnone, et al., filed May 28, 2013.
U.S. Appl. No. 13/917,513, Arnone, et al., filed Jun. 13, 2013.
U.S. Appl. No. 13/917,529, Arnone, et al., filed Jun. 13, 2013.
U.S. Appl. No. 13/920,031, Arnone, et al., filed Jun. 17, 2013.
U.S. Appl. No. 13/928,166, Arnone, et al., filed Jun. 26, 2013.
U.S. Appl. No. 13/935,410, Arnone, et al., filed Jul. 3, 2013.
U.S. Appl. No. 13/935,468, Arnone, et al., filed Jul. 3, 2013.
U.S. Appl. No. 13/686,876, Arnone, et al., filed Nov. 27, 2012.
U.S. Appl. No. 13/944,662, Arnone, et al., filed Jul. 17, 2013.
U.S. Appl. No. 13/962,815, Arnone, et al., filed Aug. 8, 2013.
U.S. Appl. No. 13/962,839, Meyerhofer, et al., filed Aug. 8, 2013.
U.S. Appl. No. 14/018,315, Arnone, et al., filed Sep. 4, 2013.
U.S. Appl. No. 14/019,384, Arnone, et al., filed Sep. 5, 2013.
U.S. Appl. No. 14/023,432, Arnone, et al., filed Sep. 10, 2013.
U.S. Appl. No. 13/600,671, Arnone, et al., filed Aug. 31, 2012.
U.S. Appl. No. 13/582,408, Arnone, et al., filed Sep. 26, 2012.
U.S. Appl. No. 13/849,458, Arnone, et al., filed Mar. 22, 2013.
U.S. Appl. No. 14/135,562, Arnone, et al., filed Dec. 19, 2013.
U.S. Appl. No. 14/080,767, Arnone, et al., filed Nov. 14, 2013.
U.S. Appl. No. 14/043,838, Arnone, et al., filed Oct. 1, 2013.
U.S. Appl. No. 14/162,735, Arnone, et al., filed Jan. 23, 2014.
U.S. Appl. No. 14/161,230, Arnone, et al., filed Jan. 22, 2014.
U.S. Appl. No. 14/083,331, Arnone, et al., filed Nov. 18, 2013.
U.S. Appl. No. 14/014,310, Arnone, et al., filed Aug. 29, 2013.
U.S. Appl. No. 14/152,953, Arnone, et al., filed Jan. 10, 2014.
U.S. Appl. No. 14/162,724, Arnone, et al., filed Jan. 23, 2014.
U.S. Appl. No. 14/104,897, Arnone, et al., filed Dec. 12, 2013.
U.S. Appl. No. 14/174,813 Arnone, et al., filed Feb. 6, 2014.
U.S. Appl. No. 14/175,986 Arnone, et al., filed Feb. 7, 2014.
U.S. Appl. No. 14/176,014 Arnone, et al., filed Feb. 7, 2014.
U.S. Appl. No. 14/179,487 Arnone, et al., filed Feb. 12, 2014.
U.S. Appl. No. 14/179,492 Arnone, et al., filed Feb. 12, 2014.
U.S. Appl. No. 14/181,190 Arnone, et al., filed Feb. 14, 2014.
U.S. Appl. No. 14/186,393 Arnone, et al., filed Feb. 21, 2014.
U.S. Appl. No. 14/188,587 Arnone, et al., filed Feb. 24, 2014.
U.S. Appl. No. 15/920,374 Arnone, et al. filed Mar. 13, 2018.
U.S. Appl. No. 15/920,380 Arnone, et al. filed Mar. 13, 2018.
U.S. Appl. No. 15/920,388 Arnone, et al. filed Mar. 13, 2018.
U.S. Appl. No. 15/920,390 Arnone, et al. filed Mar. 13, 2018.
U.S. Appl. No. 15/922,816 Arnone, et al. filed Mar. 15, 2018.
U.S. Appl. No. 15/922,905 Arnone, et al. filed Mar. 15, 2018.
U.S. Appl. No. 15/925,268 Arnone, et al. filed Mar. 19, 2018.
U.S. Appl. No. 15/925,751 Arnone, et al. filed Mar. 19, 2018.
U.S. Appl. No. 15/933,319 Arnone, et al. filed Mar. 22, 2018.
U.S. Appl. No. 15/935,956 Arnone, et al. filed Mar. 26, 2018.
U.S. Appl. No. 15/943,207 Arnone, et al. filed Apr. 2, 2018.
U.S. Appl. No. 15/948,607 Arnone, et al. filed Apr. 9, 2018.
U.S. Appl. No. 15/949,812 Arnone, et al. filed Apr. 10, 2018.
U.S. Appl. No. 15/951,155 Arnone, et al. filed Apr. 11, 2018.
U.S. Appl. No. 15/954,094 Arnone, et al. filed Apr. 16, 2018.
U.S. Appl. No. 15/954,136 Arnone, et al. filed Apr. 16, 2018.
U.S. Appl. No. 15/961,375 Arnone, et al. filed Apr. 24, 2018.
U.S. Appl. No. 15/961,382 Arnone, et al. filed Apr. 24, 2018.
U.S. Appl. No. 15/966,590 Arnone, et al. filed Apr. 30, 2018.
U.S. Appl. No. 15/968,723 Arnone, et al. filed May 1, 2018.
U.S. Appl. No. 15/971,288 Arnone, et al. filed May 4, 2018.
U.S. Appl. No. 15/978,087 Arnone, et al. filed May 11, 2018.
U.S. Appl. No. 15/979,391 Arnone, et al. filed May 14, 2018.
U.S. Appl. No. 15/984,168 Arnone, et al. filed May 18, 2018.
U.S. Appl. No. 15/991,576 Arnone, et al. filed May 29, 2018.
U.S. Appl. No. 15/991,594 Arnone, et al. filed May 29, 2018.
U.S. Appl. No. 15/996,906 Arnone, et al. filed Jun. 4, 2018.
U.S. Appl. No. 16/005,017 Arnone, et al. filed Jun. 11, 2018.
U.S. Appl. No. 16/005,108 Arnone, et al. filed Jun. 11, 2018.
U.S. Appl. No. 16/011,110 Arnone, et al. filed Jun. 18, 2018.
U.S. Appl. No. 16/011,116 Arnone, et al. filed Jun. 18, 2018.
U.S. Appl. No. 16/017,976 Arnone, et al. filed Jun. 25, 2018.
U.S. Appl. No. 16/025,380 Arnone, et al. filed Jul. 2, 2018.
U.S. Appl. No. 16/030,289 Arnone, et al. filed Jul. 9, 2018.
U.S. Appl. No. 16/030,294 Arnone, et al. filed Jul. 9, 2018.
U.S. Appl. No. 16/036,269 Arnone, et al. filed Jul. 16, 2018.
U.S. Appl. No. 16/036,388 Arnone, et al. filed Jul. 16, 2018.

(56) References Cited

OTHER PUBLICATIONS

U.S. Appl. No. 16/036,393 Arnone, et al. filed Jul. 16, 2018.
U.S. Appl. No. 16/036,925 Arnone, et al. filed Jul. 16, 2018.
U.S. Appl. No. 16/039,322 Arnone, et al. filed Jul. 18, 2018.
U.S. Appl. No. 16/040,485 Arnone, et al. filed Jul. 19, 2018.
U.S. Appl. No. 16/042,488 Arnone, et al. filed Jul. 23, 2018.
U.S. Appl. No. 16/042,493 Arnone, et al. filed Jul. 23, 2018.
U.S. Appl. No. 16/048,893 Arnone, et al. filed Jul. 30, 2018.
U.S. Appl. No. 16/049,029 Arnone, et al. filed Jul. 30, 2018.
U.S. Appl. No. 16/057,400 Arnone, et al. filed Aug. 7, 2018.
U.S. Appl. No. 16/057,403 Arnone, et al. filed Aug. 7, 2018.
U.S. Appl. No. 16/102,003 Arnone, et al. filed Aug. 13, 2018.
U.S. Appl. No. 16/102,010 Arnone, et al. filed Aug. 13, 2018.
U.S. Appl. No. 16/102,044 Arnone, et al. filed Aug. 13, 2018.
U.S. Appl. No. 15/362,660 Arnone, et al. filed Nov. 28, 2016.
U.S. Appl. No. 15/365,628 Arnone, et al. filed Nov. 30, 2016.
U.S. Appl. No. 15/367,541 Arnone, et al. filed Dec. 2, 2016.
U.S. Appl. No. 15/369,394 Arnone, et al. filed Dec. 5, 2016.
U.S. Appl. No. 15/370,425 Arnone, et al. filed Dec. 6, 2016.
U.S. Appl. No. 15/375,711 Arnone, et al. filed Dec. 12, 2016.
U.S. Appl. No. 15/387,117 Arnone, et al. filed Dec. 21, 2016.
U.S. Appl. No. 15/392,887 Arnone, et al. filed Dec. 28, 2016.
U.S. Appl. No. 15/393,212 Arnone, et al. filed Dec. 28, 2016.
U.S. Appl. No. 15/394,257 Arnone, et al. filed Dec. 29, 2016.
U.S. Appl. No. 15/396,352 Arnone, et al. filed Dec. 30, 2016.
U.S. Appl. No. 15/396,354 Arnone, et al. filed Dec. 30, 2016.
U.S. Appl. No. 15/396,365 Arnone, et al. filed Dec. 30, 2016.
U.S. Appl. No. 15/406,474 Arnone, et al. filed Jan. 13, 2017.
U.S. Appl. No. 15/413,322 Arnone, et al. filed Jan. 23, 2017.
U.S. Appl. No. 15/415,833 Arnone, et al. filed Jan. 25, 2017.
U.S. Appl. No. 15/417,030 Arnone, et al. filed Jan. 26, 2017.
U.S. Appl. No. 15/422,453 Arnone, et al. filed Feb. 1, 2017.
U.S. Appl. No. 15/431,631 Arnone, et al. filed Feb. 13, 2017.
U.S. Appl. No. 15/434,843 Arnone, et al. filed Feb. 16, 2017.
U.S. Appl. No. 15/439,499 Arnone, et al. filed Feb. 22, 2017.
U.S. Appl. No. 15/449,249 Arnone, et al. filed Mar. 3, 2017.
U.S. Appl. No. 15/449,256 Arnone, et al. filed Mar. 3, 2017.
U.S. Appl. No. 15/450,287 Arnone, et al. filed Mar. 6, 2017.
U.S. Appl. No. 15/456,079 Arnone, et al. filed Mar. 10, 2017.
U.S. Appl. No. 15/457,827 Arnone, et al. filed Mar. 13, 2017.
U.S. Appl. No. 15/458,490 Arnone, et al. filed Mar. 14, 2017.
U.S. Appl. No. 15/460,195 Arnone, et al. filed Mar. 15, 2017.
U.S. Appl. No. 15/463,725 Arnone, et al. filed Mar. 20, 2017.
U.S. Appl. No. 15/464,282 Arnone, et al. filed Mar. 20, 2017.
U.S. Appl. No. 15/465,521 Arnone, et al. filed Mar. 21, 2017.
U.S. Appl. No. 15/470,869 Arnone, et al. filed Mar. 27, 2017.
U.S. Appl. No. 15/473,523 Arnone, et al. filed Mar. 29, 2017.
U.S. Appl. No. 15/483,773 Arnone, et al. filed Apr. 10, 2017.
U.S. Appl. No. 15/489,343 Arnone, et al. filed Apr. 17, 2017.
U.S. Appl. No. 15/491,617 Arnone, et al. filed Apr. 19, 2017.
U.S. Appl. No. 15/583,295 Arnone, et al. filed May 1, 2017, 2017.
U.S. Appl. No. 15/589,780 Arnone, et al. filed May 8, 2017.
U.S. Appl. No. 15/597,123 Arnone, et al. filed May 16, 2017.
U.S. Appl. No. 15/597,812 Arnone, et al. filed May 17, 2017.
U.S. Appl. No. 15/599,590 Arnone, et al. filed May 19, 2017.
U.S. Appl. No. 15/605,688 Arnone, et al. filed May 25, 2017.
U.S. Appl. No. 15/605,705 Arnone, et al. filed May 25, 2017.
U.S. Appl. No. 15/626,754 Arnone, et al. filed Jun. 19, 2017.
U.S. Appl. No. 15/631,762 Arnone, et al. filed Jun. 23, 2017.
U.S. Appl. No. 15/632,478 Arnone, et al. filed Jun. 26, 2017.
U.S. Appl. No. 15/632,479 Arnone, et al. filed Jun. 26, 2017.
U.S. Appl. No. 15/632,943 Arnone, et al. filed Jun. 26, 2017.
U.S. Appl. No. 15/632,950 Arnone, et al. filed Jun. 26, 2017.
U.S. Appl. No. 15/641,119 Arnone, et al. filed Jul. 3, 2017.
U.S. Appl. No. 15/651,934 Arnone, et al. filed Jul. 17, 2017.
U.S. Appl. No. 15/657,826 Arnone, et al. filed Jul. 24, 2017.
U.S. Appl. No. 15/657,835 Arnone, et al. filed Jul. 24, 2017.
U.S. Appl. No. 15/664,535 Arnone, et al. filed Jul. 31, 2017.
U.S. Appl. No. 15/667,168 Arnone, et al. filed Aug. 2, 2017.
U.S. Appl. No. 15/670,492 Arnone, filed Aug. 7, 2017.
U.S. Appl. No. 15/681,966 Arnone, et al. filed Aug. 21, 2017.
U.S. Appl. No. 15/681,970 Arnone, et al. filed Aug. 21, 2017.
U.S. Appl. No. 15/681,978 Arnone, et al. filed Aug. 21, 2017.
U.S. Appl. No. 15/687,922 Arnone, et al. filed Aug. 28, 2017.
U.S. Appl. No. 15/687,927 Arnone, et al. filed Aug. 28, 2017.
U.S. Appl. No. 15/694,520 Arnone, et al. filed Sep. 1, 2017.
U.S. Appl. No. 15/694,738 Arnone, et al. filed Sep. 1, 2017.
U.S. Appl. No. 15/700,022 Arnone, et al. filed Sep. 8, 2017.
U.S. Appl. No. 15/713,595 Arnone, et al. filed Sep. 22, 2017.
U.S. Appl. No. 15/714,896 Arnone, et al. filed Sep. 25, 2017.
U.S. Appl. No. 15/714,902 Arnone, et al. filed Sep. 25, 2017.
U.S. Appl. No. 15/715,144 Arnone, et al. filed Sep. 25, 2017.
U.S. Appl. No. 15/716,317 Arnone, et al. filed Sep. 26, 2017.
U.S. Appl. No. 15/716,318 Arnone, et al. filed Sep. 26, 2017.
U.S. Appl. No. 15/728,096 Arnone, et al. filed Oct. 9, 2017.
U.S. Appl. No. 15/784,961 Arnone, et al. filed Oct. 16, 2017.
U.S. Appl. No. 15/790,482 Arnone, et al. filed Oct. 23, 2017.
U.S. Appl. No. 15/794,712 Arnone, et al. filed Oct. 26, 2017.
U.S. Appl. No. 15/797,571 Arnone, et al. filed Oct. 30, 2017.
U.S. Appl. No. 15/804,413 Arnone, et al. filed Nov. 6, 2017.
U.S. Appl. No. 15/811,412 Arnone, et al. filed Nov. 13, 2017.
U.S. Appl. No. 15/811,419 Arnone, et al. filed Nov. 13, 2017.
U.S. Appl. No. 15/815,629 Arnone, et al. filed Nov. 16, 2017.
U.S. Appl. No. 15/822,908 Arnone, et al. filed Nov. 27, 2017.
U.S. Appl. No. 15/822,912 Arnone, et al. filed Nov. 27, 2017.
U.S. Appl. No. 15/830,614 Arnone, et al. filed Dec. 4, 2017.
U.S. Appl. No. 15/834,006 Arnone, et al. filed Dec. 6, 2017.
U.S. Appl. No. 15/837,795 Arnone, et al. filed Dec. 11, 2017.
U.S. Appl. No. 15/845,433 Arnone, et al. filed Dec. 18, 2017.
U.S. Appl. No. 15/858,817 Arnone, et al. filed Dec. 29, 2017.
U.S. Appl. No. 15/858,826 Arnone, et al. filed Dec. 29, 2017.
U.S. Appl. No. 15/862,329 Arnone, et al. filed Jan. 4, 2018.
U.S. Appl. No. 15/864,737 Arnone, et al. filed Jan. 8, 2018.
U.S. Appl. No. 15/882,328 Arnone, et al. filed Jan. 29, 2018.
U.S. Appl. No. 15/882,333 Arnone, et al. filed Jan. 29, 2018.
U.S. Appl. No. 15/882,428 Arnone, et al. filed Jan. 29, 2018.
U.S. Appl. No. 15/882,447 Arnone, et al. filed Jan. 29, 2018.
U.S. Appl. No. 15/882,850 Arnone, et al. filed Jan. 29, 2018.
U.S. Appl. No. 15/882,902 Arnone, et al. filed Jan. 29, 2018.
U.S. Appl. No. 15/888,512 Arnone, et al. filed Feb. 5, 2018.
U.S. Appl. No. 15/894,398 Arnone, et al. filed Feb. 12, 2018.
U.S. Appl. No. 15/912,019 Arnone, et al. filed Mar. 5, 2018.
U.S. Appl. No. 15/912,026 Arnone, et al. filed Mar. 5, 2018.
U.S. Appl. No. 15/912,529 Arnone, et al. filed Mar. 5, 2018.
U.S. Appl. No. 15/063,365 Arnone, et al. filed Mar. 7, 2016.
U.S. Appl. No. 15/063,496 Arnone, et al. filed Mar. 7, 2016.
U.S. Appl. No. 15/073,602 Arnone, et al. filed Mar. 17, 2016.
U.S. Appl. No. 15/074,999 Arnone, et al. filed Mar. 18, 2016.
U.S. Appl. No. 15/077,574 Arnone, et al. filed Mar. 22, 2016.
U.S. Appl. No. 15/083,284 Arnone, et al. filed Mar. 28, 2016.
U.S. Appl. No. 15/091,395 Arnone, et al. filed Apr. 5, 2016.
U.S. Appl. No. 15/093,685 Arnone, et al. filed Apr. 7, 2016.
U.S. Appl. No. 15/098,287 Arnone, et al. filed Apr. 13, 2016.
U.S. Appl. No. 15/098,313 Arnone, et al. filed Apr. 13, 2016.
U.S. Appl. No. 15/130,101 Arnone, et al. filed Apr. 15, 2016.
U.S. Appl. No. 15/133,624 Arnone, et al. filed Apr. 20, 2016.
U.S. Appl. No. 15/134,852 Arnone, et al. filed Apr. 21, 2016.
U.S. Appl. No. 15/139,148 Arnone, et al. filed Apr. 26, 2016.
U.S. Appl. No. 15/141,784 Arnone, et al. filed Apr. 29, 2016.
U.S. Appl. No. 15/155,107 Arnone, et al. filed May 16, 2016.
U.S. Appl. No. 15/156,222 Arnone, et al. filed May 16, 2016.
U.S. Appl. No. 15/158,530 Arnone, et al. filed May 18, 2016.
U.S. Appl. No. 15/161,174 Arnone, et al. filed May 20, 2016.
U.S. Appl. No. 15/170,773 Arnone, et al. filed Jun. 1, 2016.
U.S. Appl. No. 15/174,995 Arnone, et al. filed Jun. 6, 2016.
U.S. Appl. No. 15/179,940 Arnone, et al. filed Jun. 10, 2016.
U.S. Appl. No. 15/189,797 Arnone, et al. filed Jun. 22, 2016.
U.S. Appl. No. 15/190,745 Arnone, et al. filed Jun. 23, 2016.
U.S. Appl. No. 15/191,050 Arnone, et al. filed Jun. 23, 2016.
U.S. Appl. No. 15/219,257 Arnone, et al. filed Jul. 25, 2016.
U.S. Appl. No. 15/227,881 Arnone, et al. filed Aug. 3, 2016.
U.S. Appl. No. 15/241,683 Arnone, et al. filed Aug. 19, 2016.
U.S. Appl. No. 15/245,040 Arnone, et al. filed Aug. 23, 2016.

(56) References Cited

OTHER PUBLICATIONS

U.S. Appl. No. 15/233,294 Arnone, et al. filed Aug. 24, 2016.
U.S. Appl. No. 15/252,190 Arnone, et al. filed Aug. 30, 2016.
U.S. Appl. No. 15/255,789 Arnone, et al. filed Sep. 2, 2016.
U.S. Appl. No. 15/261,858 Arnone, et al. filed Sep. 9, 2016.
U.S. Appl. No. 15/264,521 Arnone, et al. filed Sep. 13, 2016.
U.S. Appl. No. 15/264,557 Arnone, et al. filed Sep. 13, 2016.
U.S. Appl. No. 15/271,214 Arnone, et al. filed Sep. 20, 2016.
U.S. Appl. No. 15/272,318 Arnone, et al. filed Sep. 21, 2016.
U.S. Appl. No. 15/273,260 Arnone, et al. filed Sep. 22, 2016.
U.S. Appl. No. 15/276,469 Arnone, et al. filed Sep. 26, 2016.
U.S. Appl. No. 15/280,255 Arnone, et al. filed Sep. 29, 2016.
U.S. Appl. No. 15/286,922 Arnone, et al. filed Oct. 6, 2016.
U.S. Appl. No. 15/287,129 Arnone, et al. filed Oct. 6, 2016.
U.S. Appl. No. 15/289,648 Arnone, et al. filed Oct. 10, 2016.
U.S. Appl. No. 15/297,019 Arnone, et al. filed Oct. 18, 2016.
U.S. Appl. No. 15/298,533 Arnone, et al. filed Oct. 20, 2016.
U.S. Appl. No. 15/336,696 Arnone, et al. filed Oct. 27, 2016.
U.S. Appl. No. 15/339,898 Arnone, et al. filed Oct. 31, 2016.
U.S. Appl. No. 15/345,451 Arnone, et al. filed Nov. 7, 2016.
U.S. Appl. No. 14/799,481 Arnone, et al. filed Jul. 14, 2015.
U.S. Appl. No. 15/362,214 Arnone, et al. filed Nov. 28, 2016.
U.S. Appl. No. 14/586,645 Arnone, et al. filed Dec. 30, 2014.
U.S. Appl. No. 14/598,151 Arnone, et al. filed Jan. 15, 2015.
U.S. Appl. No. 14/601,063 Arnone, et al. filed Jan. 20, 2015.
U.S. Appl. No. 14/601,108 Arnone, et al. filed Jan. 20, 2015.
U.S. Appl. No. 14/608,000 Arnone, et al. filed Jan. 28, 2015.
U.S. Appl. No. 14/608,087 Arnone, et al. filed Jan. 28, 2015.
U.S. Appl. No. 14/608,093 Arnone, et al. filed Jan. 28, 2015.
U.S. Appl. No. 14/610,897 Arnone, et al. filed Jan. 30, 2015.
U.S. Appl. No. 14/611,077 Arnone, et al. filed Jan. 30, 2015.
U.S. Appl. No. 14/604,629 Arnone, et al. filed Jan. 23, 2015.
U.S. Appl. No. 14/625,475 Arnone, et al. filed Feb. 18, 2015.
U.S. Appl. No. 14/617,852 Arnone, et al. filed Feb. 9, 2015.
U.S. Appl. No. 14/627,428 Arnone, et al. filed Feb. 20, 2015.
U.S. Appl. No. 14/642,427 Arnone, et al. filed Mar. 9, 2015.
U.S. Appl. No. 14/665,991 Arnone, et al. filed Mar. 23, 2015.
U.S. Appl. No. 14/666,010 Arnone, et al. filed Mar. 23, 2015.
U.S. Appl. No. 14/666,022 Arnone, et al. filed Mar. 23, 2015.
U.S. Appl. No. 14/642,623 Arnone, et al. filed Mar. 9, 2015.
U.S. Appl. No. 14/663,337 Arnone, et al. filed Mar. 19, 2015.
U.S. Appl. No. 14/666,284 Arnone, et al. filed Mar. 23, 2015.
U.S. Appl. No. 14/679,885 Arnone, et al. filed Apr. 6, 2015.
U.S. Appl. No. 14/685,378 Arnone, et al. filed Apr. 13, 2015.
U.S. Appl. No. 14/686,675 Arnone, et al. filed Apr. 14, 2015.
U.S. Appl. No. 14/686,678 Arnone, et al. filed Apr. 14, 2015.
U.S. Appl. No. 14/701,430 Arnone, et al. filed Apr. 30, 2015.
U.S. Appl. No. 14/703,721 Arnone, et al. filed May 4, 2015.
U.S. Appl. No. 14/708,138 Arnone, et al. filed May 8, 2015.
U.S. Appl. No. 14/708,141 Arnone, et al. filed May 8, 2015.
U.S. Appl. No. 14/708,160 Arnone, et al. filed May 8, 2015.
U.S. Appl. No. 14/708,161 Arnone, et al. filed May 8, 2015.
U.S. Appl. No. 14/708,162 Arnone, et al. filed May 8, 2015.
U.S. Appl. No. 14/710,483 Arnone, et al. filed May 12, 2015.
U.S. Appl. No. 14/714,084 Arnone, et al. filed May 15, 2015.
U.S. Appl. No. 14/715,463 Arnone, et al. filed May 18, 2015.
U.S. Appl. No. 14/720,620 Arnone, et al. filed May 22, 2015.
U.S. Appl. No. 14/720,624 Arnone, et al. filed May 22, 2015.
U.S. Appl. No. 14/720,626 Arnone, et al. filed May 22, 2015.
U.S. Appl. No. 14/727,726 Arnone, et al. filed Jun. 1, 2015.
U.S. Appl. No. 14/730,183 Arnone, et al. filed Jun. 3, 2015.
U.S. Appl. No. 14/731,321 Arnone, et al. filed Jun. 4, 2015.
U.S. Appl. No. 14/740,078 Arnone, et al. filed Jun. 15, 2015.
U.S. Appl. No. 14/742,517 Arnone, et al. filed Jun. 17, 2015.
U.S. Appl. No. 14/743,708 Arnone, et al. filed Jun. 18, 2015.
U.S. Appl. No. 14/746,731 Arnone, et al. filed Jun. 22, 2015.
U.S. Appl. No. 14/748,122 Arnone, et al. filed Jun. 23, 2015.
U.S. Appl. No. 14/788,581 Arnone, et al. filed Jun. 30, 2015.
U.S. Appl. No. 14/793,685 Arnone, et al. filed Jul. 7, 2015.
U.S. Appl. No. 14/793,704 Arnone, et al. filed Jul. 7, 2015.
U.S. Appl. No. 14/797,016 Arnone, et al. filed Jul. 10, 2015.

* cited by examiner

MULTI-DIRECTIONAL SHOOTING INTERLEAVED WAGERING SYSTEM

CROSS REFERENCE TO RELATED APPLICATIONS

The current application is a continuation of U.S. patent application Ser. No. 15/804,413 filed Nov. 6, 2017, which is a continuation of U.S. patent application Ser. No. 14/995,151, filed Jan. 13, 2016, and issued as U.S. Pat. No. 9,811,974 on Nov. 7, 2017, which claims the benefit of U.S. Provisional Patent Application No. 62/103,544, filed Jan. 14, 2015, the disclosure of which is incorporated by reference herein in its entirety.

FIELD OF THE INVENTION

Embodiments of the present invention are generally related to communications within data processing systems. More particularly, the present invention relates to the communication and processing of wagering data.

BACKGROUND

The gaming industry has traditionally developed electronic gaming machines (EGMs) that implement simple wagering propositions. The communication and processing needs for these simple wagering propositions are easily met using conventional EGMs.

For example, U.S. Pat. No. 6,905,405 to McClintic describes a conventional gaming device provided with a central processor (CPU) operably coupled to input logic circuitry and output logic circuitry. The input logic circuitry is employed to operably couple the CPU to input devices such as, for example, a touch screen segment or physical button, a coin acceptor, a bill acceptor, a user tracking card reader or a credit/debit card reader. The output logic circuitry is employed to operably couple the CPU with output devices such as, for example, a hopper, a video monitor, meter displays, and a printer. The CPU is also operably coupled to controlling software memory, which includes assigned memory locations storing game software and system software. Such controlling software memory dictates when selected graphics or messages are displayed to a user, as well as when play sequences begin and end and management of wager input and award output. The CPU is also operably coupled to a second memory, which is employed to store data indicative of game statistics, number of plays, number of wins, etc. Controlling software memory, a second memory, or other, ancillary memory store data indicative of winning results, such as data representative of one or more symbol combinations, including winning combinations. Second memory may also be used, for example, to store a bit map of the symbol pattern depicted as a matrix display on video monitor. In operation of the gaming device the CPU carries out instructions of the system software to implement an initial display pattern on the video monitor and to enable the input devices. After a wager is received a user activates an initiator interactive element such as a handle, the physical button or the touch screen to initiate a play sequence. At this point, the game software, in conjunction with a random number generator, generates a random symbol configuration at for a random final outcome comprised of a pattern of symbols for depiction on video monitor. System software then animates the video monitor by simulating the movement of visible representations of symbol carriers including symbols thereon so that the user perceives symbol carrier rotational "movement" of each symbol carrier as well as, optionally, rotational movement of the entire group of symbol carriers about a common axis. Once the visible representations of the symbol carriers have stopped, all of the generated, displayed symbols comprising a winning combination or combinations in the matrix display are identified or flagged. The displayed results (pattern of symbols depicted on the video monitor, which may include symbols received from a remote location, is compared with data stored in game software representing winning combinations to determine if any displayed combination on an active pay line is a winning combination. Any identified winning combination or combinations of symbols are then associated with winnings to be distributed to the user according to a paytable of the game software associated with the various possible winning combinations. The various pay line configurations and required combinations of the various indicia for a winning combination within each pay line reside within the game software and are retrieved for comparison to the randomly generated pattern of indicia depicted on the video monitor.

Operation of another conventional computer gaming system is described in U.S. Pat. No. 6,409,602 issued to Wiltshire et al. A game program is executed on server/host computer. It is then determined whether an image is to be displayed on a screen of a client/terminal computer. If so, an image is sent from the server/host computer to client/terminal computer. The image may include any type of graphical information including a bitmap, a JPEG file, a TIFF file or even an encoded audio/video stream such as a compressed video MPEG stream. The image is generated by game computer program and passed to server/host interface program. In turn, the image is transferred over communication pathways to client/terminal computer via the network services provided by server operating system. The image is received by a client/terminal program executing on the client/terminal computer via the network services provided by client operating system. The client/terminal program then causes the image to be displayed on a screen of the client/terminal computer. It is then determined whether an input command has been entered by the patron using the client/terminal computer. The input command may be a keystroke, movement or clicking of the mouse, a voice activated command or even the clicking of a "virtual button" on a touch screen. The client/terminal program causes the input command to be transmitted back to server/host computer via communication pathways, again using network services provided by the client operating system on one end and server operating system on the other. The command is thus received by the server/host interface program, that, in turn, passes the command back to the game program. The game program processes the input command and updates the state of the game accordingly.

However, more complicated wagering processes need communication and processing systems that are better suited for implementing these more complicated wagering processes. Various aspects of embodiments of the present invention meet such a need.

SUMMARY OF THE INVENTION

Systems and methods in accordance with embodiments of the invention provide a communication and data processing system constructed for a multi-directional shooting interleaved wagering system.

In an aspect of an embodiment of the invention, a process controller operates as an interface between an interactive processing device and a wager controller. By virtue of this aspect, the wager controller is isolated from the interactive processing device allowing the interactive processing device to operate in an unregulated environment will allowing the wager controller to operate in a regulated environment, thus providing for more efficient management of the operations of such a system.

In another aspect of another embodiment of the invention, a single wager controller may provide services to two or more interactive processing devices and/or two or more process controllers, thus allowing a multi-directional shooting interleaved wagering system to operate more efficiently over a large range of scaling.

In another aspect of another embodiment of the invention, multiple types of interactive processing devices using different operating systems may be interfaced to a single type of process controller and/or wager controller without requiring customization of the process controller and/or the wager controller, thus improving the efficiency of the process controller and or the wager controller by reducing complexity associated with maintaining separate process controllers and/or wager controllers for each type of interactive processing device.

In another aspect of another embodiment of the invention, an interactive processing device may be provided as a user device under control of a user while maintaining the wager controller in an environment under the control of a regulated operator of wagering equipment, thus providing for a more economical system as the regulated operator need not expend capital to purchase interactive processing devices.

In another aspect of another embodiment of the invention, data communicated between the controllers may be encrypted to increase security of the multi-directional shooting interleaved wagering system.

In another aspect of another embodiment of the invention, a process controller isolates wager logic and application logic as unregulated logic from a regulated wager controller, thus allowing errors in the application logic and/or wager logic to be corrected, new application logic and/or wager logic to be used, or modifications to be made to the application logic and/or wager logic without a need for time-consuming regulatory approval.

In another aspect of another embodiment of the invention, an interactive application may require extensive processing resources from an interactive processing device leaving few processing resources for the functions performed by a process controller and/or a wager controller. By virtue of an architecture of the embodiments of the invention, processing loads may be distributed across multiple devices such that operations of the interactive processing device may be dedicated to the interactive application and the processes of the process controller and/or wager controller are not burdened by the requirements of the interactive application.

In another aspect of another embodiment of the invention, a multi-directional shooting interleaved wagering system operates with its components being distributed across multiple devices. These devices can be connected by communication channels including, but not limited to, local area networks, wide area networks, local communication buses, and/or the like. The devices may communicate using various types of protocols, including but not limited to, networking protocols, device-to-device communications protocols, and the like. In many such embodiments, one or more components of a multi-directional shooting interleaved wagering system are distributed in close proximity to each other and communicate using a local area network and/or a communication bus. In several embodiments, an interactive processing device and a process controller of a multi-directional shooting interleaved wagering system are in a common location and communicate with an external wager controller. In some embodiments, a process controller and a wager controller of a multi-directional shooting interleaved wagering system are in a common location and communicate with an external interactive processing device. In many embodiments, an interactive processing device, a process controller, and a wager controller of a multi-directional shooting interleaved wagering system are located in a common location. In some embodiments, a session/management controller is located in a common location with a process controller and/or a wager controller. In various embodiments, these multiple devices can be constructed from or configured using a single device or a plurality of devices such that a multi-directional shooting interleaved wagering system is executed as a system in a virtualized space such as, but not limited to, where a wager controller and a process controller are large scale centralized servers in the cloud operatively connected to widely distributed interactive processing devices via a wide area network such as the Internet or a local area network. In such embodiments, the components of a multi-directional shooting interleaved wagering system may communicate using a networking protocol or other type of device-to-device communications protocol.

In another aspect of another embodiment of the invention, a centralized wager controller is operatively connected to, and communicates with, one or more process controllers using a communication link. The centralized wager controller can generate wager outcomes for wagers in accordance with one or more wagering propositions. The centralized wager controller can execute a number of simultaneous or pseudo-simultaneous wagers in order to generate wager outcomes for a variety of wagering propositions that one or more distributed multi-directional shooting interleaved wagering systems can use.

In another aspect of another embodiment of the invention, a centralized process controller is operatively connected to one or more interactive processing devices and one or more wager controllers using a communication link. The centralized process controller can perform the functionality of a process controller across various multi-directional shooting interleaved wagering systems.

In another aspect of another embodiment of the invention, an interactive application server provides a host for managing head-to-head play operating over a network of interactive processing devices connected to the interactive application server using a communication link. The interactive application server provides an environment where users can compete directly with one another and interact with other users.

An embodiment includes an electronic gaming machine, comprising: an interactive processing device constructed to: provide an interactive application that accepts input from a user; distribute the input from the user to a process controller; receive, from the process controller, a wager result and application resource data; generate a visual display of a wagering user interface based on the wager result; accept application resource management instructions from the user; distribute the application resource management instructions to the process controller; receive, from the process controller, updated application resource data; and provide a bonus item event based on the updated application resource data; and a wager controller constructed to: receive, from a credit processing system, credit data associated with the user; automatically update one or more credit meters based on the credit data; receive, from the process controller, a wager request; generate the wager result; update one or more credit meters based on the wager result; distribute the wager result to the process controller; and communicate, to the credit processing system, credit output data, wherein the credit processing system provides a credit output based on the credit output data; and the process controller operatively connecting the interactive processing device and the wager controller, the process controller constructed to: receive, from the interactive processing device, the input from the user; generate the wager request based on the input from the user, wherein the wager request includes wager terms; distribute the wager request to the wager controller; receive, from the wager controller, the wager result; determine an application resource based on the wager result; determine whether there is space available for the generated application resource, wherein the user is allocated a predetermined finite number of spaces for application resources; distribute the wager result and the application resource data to the interactive processing device; receive, from the interactive processing device, the application resource management instructions; determine if a bonus item has been collected by the user; update management of application resources associated with the user based on the application resource management data; distribute, to the interactive processing device, the updated application resource data; and distribute, to the interactive processing device, instructions to initiate the bonus item event.

In a further embodiment, the interactive processing device and the process controller are constructed from the same device, and the process controller is operatively connected to the wager controller using a communication link.

In a further embodiment, the wager controller and the process controller are constructed from the same device, and the process controller is operatively connected to the interactive processing device using a communication link.

In a further embodiment, the system includes an enclosure constructed to mount: a user input device operatively connected to the interactive processing device; a user output device operatively connected to the interactive processing device; a credit input device operatively connected to the wager controller; and a credit output device operatively connected to the wager controller.

In a further embodiment, the wager controller is further constructed to: communicate with the credit input device to receive a credit input; credit a credit meter with credits based on the incoming credit data; execute a wager based on a communication received from the process controller; update the credit meter based on a wager outcome of the wager; and communicate with the credit output device to generate a credit output based on credits transferred off of the credit meter.

In a further embodiment, when there is space available for the generated application resource, the application resource is assigned to the user and the application resource is displayed to the user.

In a further embodiment, the application resource management instructions include an indication to discard a previously stored application resource.

In a further embodiment, the application resource management instructions include an indication to discard the newly generated application resource.

An embodiment includes an interactive processing device constructed to: communicate, to a process controller, application telemetry data associated with a user of an interactive application provided by the interactive processing device; receive, from the process controller, wagering telemetry data and application resource data; responsive to receiving the wagering telemetry data, automatically configure a wagering user interface based on the wagering telemetry data; when the user provides the interactive processing device with application resource management instructions, communicate, to the process controller, application resource management data; receive, from the process controller, updated application resource data; and automatically configure an interactive application display based on the updated application resource data; and the process controller operatively connecting the interactive processing device and a wager controller, the process controller constructed to: receive, from the interactive processing device, the application telemetry data; scan the application telemetry data to determine whether to trigger a wager request; when the wager request is triggered, generate wager request data; command the wager controller by communicating the wager request data to the wager controller; receive, from the wager controller, wager outcome data; responsive to receiving the wager outcome data, scan the wager outcome data; automatically determine wagering telemetry data based on the wager outcome data; automatically determine an application resource based on the wager outcome data; determine whether there is space available for the generated application resource, wherein the user is allocated a predetermined finite number of spaces for application resources; command the interactive processing device by communicating the wagering telemetry data and the application resource data to the interactive processing device; receive, from the interactive processing device, the application resource management data; update management of the application resources associated with the user based on the application resource management data; and communicate, to the interactive processing device, the updated application resource data.

An embodiment includes a wager controller constructed to: receive, from a credit processing system, credit data associated with the user; automatically update one or more credit meters based on the credit data; receive, from a process controller, wager request data; responsive to receiving the wager request data, automatically determine a wager outcome based on the wager request data; automatically update one or more credit meters based on the wager outcome; communicate the wager outcome data to the process controller; and communicate, to the credit processing system, credit output data, wherein the credit processing system provides a credit output based on the credit output data; and the process controller operatively connecting an interactive processing device and the wager controller, the process controller constructed to: receive, from the interactive processing device, application telemetry data associated with a user of an interactive application provided by the interactive processing device; scan the application telemetry data to determine whether to trigger a wager request; when the wager request is triggered, generate the wager request data; command the wager controller by communicating the wager request data to the wager controller; receive, from the wager controller, the wager outcome data; responsive to receiving the wager outcome data, scan the wager outcome data; automatically determine wagering telemetry data based on the wager outcome data; automatically determine an application resource based on the wager outcome data; determine whether there is space available for the generated application resource, wherein the user is allocated a predetermined finite number of spaces for application resources; command the interactive processing device by communicating wagering telemetry data and the application resource data to the interactive processing device; receive, from the interactive processing device, application resource management data; update management of the application resources associated with the user based on the application resource management data; and communicate, to the interactive processing device, updated application resource data.

DETAILED DESCRIPTION

Figure 1A:
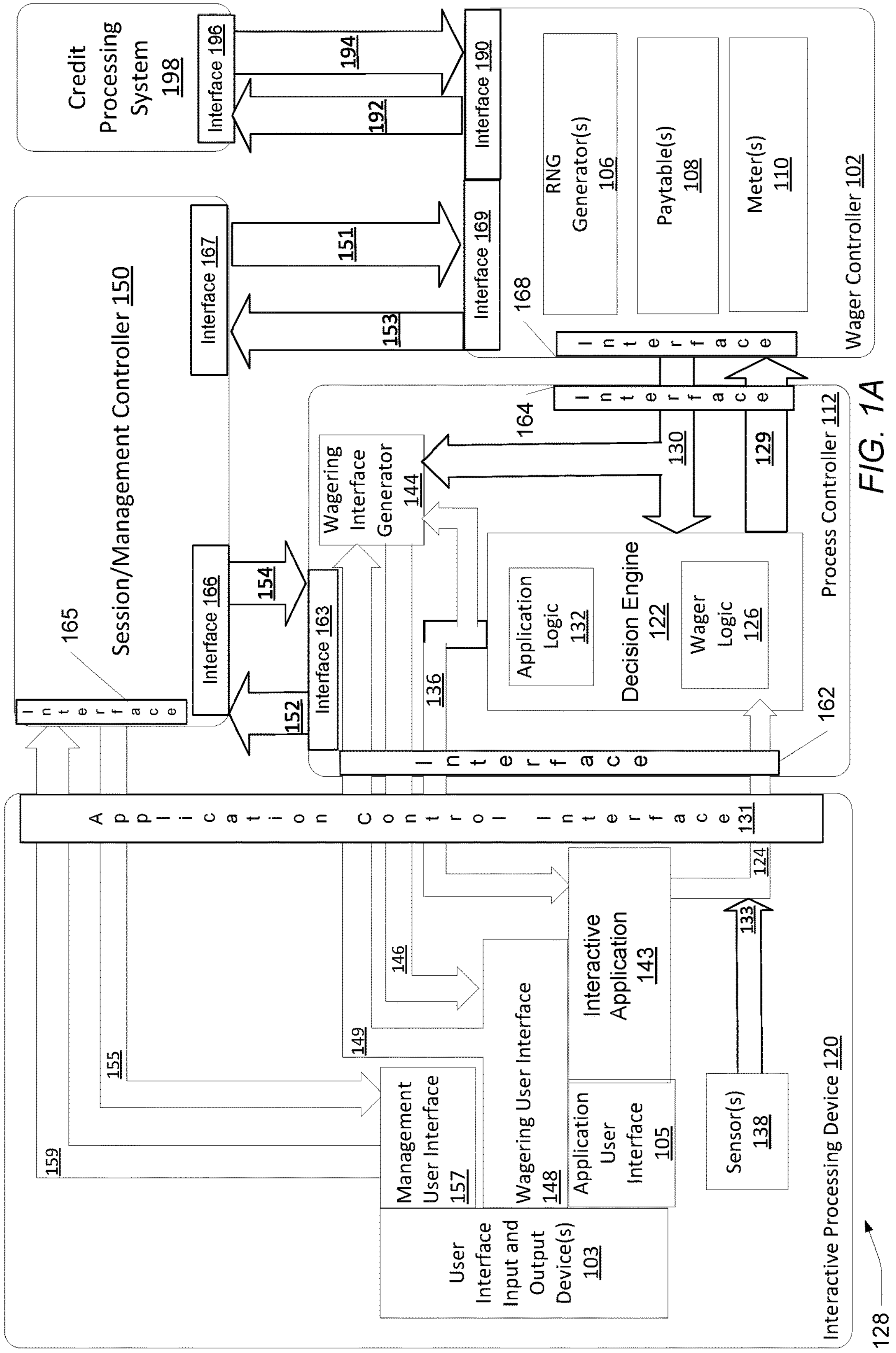
FIG. 1A is a diagram of a structure of a multi-directional shooting interleaved wagering system in accordance with various embodiments of the invention.

A multi-directional shooting interleaved wagering system interleaves wagering with non-wagering activities. In some embodiments of a multi-directional shooting interleaved wagering system, an interactive application executed by an interactive processing device provides non-wagering interactive components of the multi-directional shooting interleaved wagering system. The interactive processing device is operatively connected to a process controller that manages and configures the interactive processing device and the interactive application, and determines when wagers should be interleaved with the operations of the interactive application. The process controller is further operatively connected to a wager controller that provides one or more wagering propositions for one or more wagers.

In some embodiments, the interactive processing device also provides a wagering user interface that is used to receive commands and display data for a wagering process, including but not limited to a wager outcome of a wager made in accordance with a wagering proposition. The content of the wagering user interface is controlled by the process controller and includes content provided by the wager controller.

In various embodiments, an interactive processing device provides a management user interface used to manage a user profile including an electronic wallet for deposit and withdrawals of credits used for wagering.

Many different types of interactive applications may be utilized with the multi-directional shooting interleaved wagering system. In some embodiments, the interactive application reacts to the physical activity of a user. In these embodiments, the interactive application senses user interactions with the interactive application through one or more sensors that monitor the user's physical activities. Such sensors may include, but are not limited to, physiological sensors that monitor the physiology of the user, environmental sensors that monitor the physical environment of the interactive processing device, accelerometers that monitor changes in motion of the interactive processing device, and location sensors that monitor the location of the interactive processing device such as global positioning sensors.

In some embodiments, the interactive application implements a skill-based game and interacts with the user by sensing skillful interactions with an interactive display generated by the interactive application.

In some embodiments, the interactive application is a tool used to achieve some useful goal.

In operation, the interactive application generates various types of interactive elements in an interactive application environment. In some embodiments, these interactive elements are interactive application resources utilized within the interactive application environment to provide an interactive experience for a user. Wagers of credits or interactive elements are made in accordance with a wagering proposition as automatically triggered by interaction with one or more of the interactive elements of the interactive application. Wager outcomes of wagers of credits or interactive elements made in accordance with the wagering proposition can cause consumption, loss or accrual of credits or interactive elements.

In accordance with some embodiments, wager outcomes of wagering events can influence interactive elements in the interactive application environment such as, but not limited to, automatically providing one or more new interactive elements, automatically restoring one or more consumed interactive elements, automatically causing the loss of one or more interactive elements, and automatic restoration or placement of one or more fixed interactive elements.

In various embodiments, the wagers may be made using one or more credits (Cr).

In some embodiments, Cr can be one or more credits that are purchased using, and redeemed in, a real world currency having a real world value.

In many embodiments, Cr can be one or more credits in a virtual currency. Virtual currency is an alternate currency that can be acquired, purchased or transferred by or to a user, but does not necessarily directly correlate to a real world currency. In many such embodiments, Cr in a virtual currency are allowed to be purchased using a real world currency but are prevented from being redeemed in a real world currency having a real world value.

In several embodiments, interaction with the interactive elements of the interactive application, application environment credit (AC) can be optionally consumed and/or accrued within the interactive application as a result of interaction with the interactive elements. AC can be in the form of, but is not limited to, application environment credits, experience points, and points generally.

In various embodiments, AC is awarded on the basis of skillful interactions with the interactive elements of a skill-based interactive application. The skill-based interactive application can have one or more scoring criteria, embedded within a process controller and/or an interactive processing device that provides the skill-based interactive application, that can be used to determine performance against one or more goals of the skill-based interactive application.

In many embodiments, AC can be used to purchase in-application items, including but not limited to, application interactive elements that have particular properties, power ups for existing items, and other item enhancements.

In some embodiments, AC may be used to earn entrance into a sweepstakes drawing, to earn entrance in a tournament with prizes, to score in the tournament, and/or to participate and/or score in any other game event.

In several embodiments, AC can be stored on a user-tracking card or in a network-based user tracking system where the AC is attributed to a specific user.

In many embodiments, a wagering proposition includes a wager of AC for a wager outcome of a randomly generated payout of interactive application AC, interactive elements, and/or interactive application objects in accordance with a wagering proposition.

In a number of embodiments, a wager of an amount of Cr results in a wager outcome of a payout of AC, interactive elements, and/or interactive application objects that have a Cr value if cashed out.

In some embodiments, such as when an interactive application is a skill-based interactive application, interactive application objects include in-application objects that may be utilized to enhance interactions with the skill-based interactive application. Such objects include, but are not limited to, power-ups, enhanced in-application items, and the like. In some embodiments, the interactive application objects include objects that are detrimental to interactions with the skill-based interactive application such as, but not limited to, obstructions in the skill-based interactive application space, a temporary handicap, an enhanced opponent, and the like.

In some embodiments, interactive elements in an interactive application include, but are not limited to, enabling interactive elements (EIE) that are interactive application environment resources utilized during interaction with an interactive application and whose utilization automatically triggers execution of a wager in accordance with a wagering proposition. In some embodiments, interactive elements in an interactive application include, but are not limited to, a reserve enabling interactive element (REIE), that is an interactive element that is automatically converted into one or more enabling interactive elements upon occurrence of a release event during an interactive session of an interactive application. In yet another embodiment, interactive elements in an interactive application include, but are not limited to, an actionable interactive element (AIE) that is an interactive element that is acted upon during a session of the interactive application to automatically trigger a wager in accordance with a wagering proposition and may or may not be restorable during normal interaction with the interactive application. In yet another embodiment, interactive elements in an interactive application include a common enabling interactive element (CEIE) that is an interactive element that the interactive application shares between two or more users and causes a wagering event and associated wager to be automatically triggered in accordance with the wagering proposition when interacted with during a session. In some embodiments, a user can utilize interactive elements during interactions with a controlled entity (CE) provided by an interactive application to a user.

In accordance with some embodiments of a multi-directional shooting interleaved wagering system, the triggering of the wagering event and/or wager can be dependent upon an interactive application environment variable such as, but not limited to, a required object (RO), a required environmental condition (REC), or a controlled entity characteristic (CEC). A RO is a specific interactive application object in an interactive application acted upon for an AE to be completed. A non-limiting example of an RO is a specific key needed to open a door. An REC is an interactive application state present within an interactive application for an AE to be completed. A non-limiting example of an REC is daylight whose presence enables a character to walk through woods. A CEC is a status of a controlled entity (CE) within an interactive application for an AE to be completed. A non-limiting example of a CEC is requirement that a CE have full health points before entering battle. Although various interactive application resources such as, but not limited to, the types of interactive application interactive elements as discussed herein may be used to automatically trigger a wager in accordance with a wagering proposition, one skilled in the art will recognize that any interactive application resource can be utilized in a multi-directional shooting interleaved wagering system to automatically trigger a wager.

In several embodiments, a multi-directional shooting interleaved wagering system can utilize a process controller to continuously monitor use of the interactive application executed by an interactive processing device in order to detect a trigger of a wagering event and automatically trigger a wager based on the wagering event. The trigger for the wagering event can be detected by the process controller from the utilization of the interactive application in accordance with at least one wagering event occurrence rule. The trigger of the wagering event can be communicated to a wager controller. In response to notification of the trigger, the wager controller executes a wager in accordance with a wagering proposition. In addition, use of an interactive application in a multi-directional shooting interleaved wagering system can be controlled by the process controller based upon the wager outcome.

In several embodiments, a wagering event occurrence can be determined from one or more application environment variables within an interactive application environment that are used to trigger a wager and/or associated wager in accordance with a wagering proposition. Application environment variables can include, but are not limited to, passage of a period of time during multi-directional shooting interleaved wagering system interactive application use, a result from a multi-directional shooting interleaved wagering system interactive application session (such as, but not limited to, achieving a goal or a particular score), consumption of an interactive element, or an interaction that achieves a combination of interactive elements to be associated with a user profile.

In numerous embodiments, an interactive application instruction is an instruction by a process controller to an interactive processing device and/or an interactive application of the interactive processing device to modify a state of an interactive application or modify one or more interactive application resources or interactive elements. In some embodiments, the interactive application commands may be automatically generated by the process controller using one or more of a wager outcome and/or application environment variables. An interactive application instruction can be used by a process controller control many processes of an interactive application, such as, but not limited to, an causing an addition of a period of time available for a current interactive application session for the interactive application, an addition of a period of time available for a future multi-directional shooting interleaved wagering system interactive application session or any other modification to the interactive application interactive elements that can be utilized during an interactive application session. In some embodiments, an interactive application instruction can be used by the process controller to modify a type of interactive element whose consumption triggers a wagering event occurrence. In many embodiments, an interactive application instruction can be used by the process controller to modify a type of interactive element whose consumption is not required in a wagering event occurrence.

In several embodiments, a process controller of a multi-directional shooting interleaved wagering system may provide for a communications interface for asynchronous communications between a wager controller and an interactive application provided by an interactive processing device, by operatively connecting the interactive processing device, and thus the interactive processing device's interactive application, with the wager controller.

In some embodiments, asynchronous communications provided for by a multi-directional shooting interleaved wagering system may reduce an amount of idle waiting time by an interactive processing device of the multi-directional shooting interleaved wagering system, thus increasing an amount of processing resources that the interactive processing device may provide to an interactive application or other processes of the interactive processing device. In many embodiments, asynchronous communications provided for by a multi-directional shooting interleaved wagering system reduces an amount of idle waiting time by a wager controller, thus increasing an amount of processing resources that the wager controller may provide to execution of wagers to determine wager outcomes, and other processes provided by the wager controller.

In some embodiments, a wager controller of a multi-directional shooting interleaved wagering system may be operatively connected to a plurality of interactive processing devices through one or more process controllers and the asynchronous communications provided for by the one or more process controllers allows the wager controller to operate more efficiently by providing wager outcomes to a larger number of interactive processing devices than would be achievable without the one or more process controllers of the multi-directional shooting interleaved wagering system.

In some embodiments, a multi-directional shooting interleaved wagering system including a process controller operatively connected to a wager controller and operatively connected to an interactive processing device may provide for simplified communication protocols for communications of the interactive processing device as the interactive processing device may communicate interactions with an interactive application provided by the interactive processing device to the process controller without regard to a nature of a wagering proposition to be interleaved with processes of the interactive application.

In various embodiments, a multi-directional shooting interleaved wagering system including a process controller operatively connected to a wager controller and operatively connected to an interactive processing device may provide for simplified communication protocols for communications of the wager controller as the wager controller may receive wager requests and communicate wager outcomes without regard to a nature of an interactive application provided by the interactive processing device.

In some embodiments, a multi-directional shooting interleaved wagering system including a process controller operatively connecting a wager controller to an interactive processing device may provide for reduced processing requirement for the interactive processing device by offloading the execution of a random number generator from the interactive processing device to the wager controller. In various such embodiments, additional processing resources may be made available to graphics processing or other processing intensive operations by the interactive processing device because of the offloaded random number processing.

In various embodiments, a multi-directional shooting interleaved wagering system including a process controller operatively connecting a wager controller to an interactive processing device provides for operation of the interactive processing device in an unsecure location or manner, while providing for operation of the wager controller in a secure location or manner.

In some embodiments, a multi-directional shooting interleaved wagering system including a process controller operatively connecting a wager controller to an interactive processing device allows the interleaved wagering system to have regulated components coupled to unregulated components in a heterogeneous regulated environment. For example, in several such embodiments, the interactive processing device may be a device that is not regulated by a wagering regulatory agency whereas the wager controller is regulated by the wagering regulatory agency. A process controller of a multi-directional shooting interleaved wagering system may provide for isolation of the processing of the interactive processing device from the processing of the wager controller. In such a heterogeneous regulatory environment, the process controller may or may not be itself a regulated by the wagering regulatory authority. In addition, components of an interactive application executed by the interactive processing device may be either regulated or unregulated by the wagering regulatory agency.

Multi-Directional Shooting Wagering Interleaved Systems

FIG. 1A is a diagram of a structure of a multi-directional shooting interleaved wagering system in accordance with various embodiments of the invention. The multi-directional shooting interleaved wagering system 128 includes an interactive processing device 120, a process controller 112, and a wager controller 102. The interactive processing device 120 is operatively connected to, and communicates with, the process controller 112. The process controller 112 is also operatively connected to, and communicates with, the wager controller 102.

In some embodiments, a multi-directional shooting interleaved wagering system includes a session/management controller 150 operatively connected to one or more other components of the multi-directional shooting interleaved wagering system.

In many embodiments, a multi-directional shooting interleaved wagering system includes a credit processing system 198 operatively connected to one or more other components of the multi-directional shooting interleaved wagering system.

In various embodiments, the wager controller 102 includes one or more interfaces, such as interfaces 168, 169 and 190, that operatively connect the wager controller 102 to one or more session management servers, such as session/management controller 150, to one or more process controllers, such as process controller 112, and/or to a credit processing system 198, by their respective interfaces.

In some embodiments, one or more of the wager controller interfaces implement a wager controller interprocess communication protocol so that the wager controller 102 and one or more process controllers, one or more credit processing systems and/or one or more session/management controllers may be implemented on the same device. In operation, the wager controller interfaces provide application programming interfaces or the like that are used by the wager controller to communicate outgoing data and receive incoming data by passing parameter data to another process or application running on the same device.

In some embodiments, one or more of the wager controller interfaces implement a wager controller communication protocol employing an interdevice communication protocol so that the wager controller may be implemented on a device separate from one or more process controllers, one or more credit processing systems and/or one or more session/management controllers. The interdevice protocol may utilize a wired communication bus or wireless connection as a physical layer.

In various embodiments, one or more of the wager controller interfaces implement a wager controller communication protocol employing a networking protocol so that the wager controller may be operatively connected to one or more session/management controllers, one or more credit processing systems and/or one or more process controllers by a network. The networking protocol may utilize a wired communication bus or wireless connection as a physical layer. In many such embodiments, the networking protocol operates over a computer network and/or a telephone network or the like. During operation, the one or more wager controller interfaces communicate outgoing data to an external device or server by encoding the data into a signal and transmitting the signal to the external device or server. The one or more wager controller interfaces receive incoming data from an external device or server by receiving a signal transmitted by the external device or server and decoding the signal to obtain the incoming data.

In several embodiments, the wager controller 102 is a controller for providing one or more wagering propositions provided by the multi-directional shooting interleaved wagering system 128 and automatically executes wagers in accordance with the wagering propositions as instructed by the process controller 112. Types of value of a wager can be one or more of several different types. Types of value of a wager can include, but are not limited to, a wager of an amount of Cr corresponding to a real currency or a virtual currency, a wager of an amount of AC earned through interaction with an interactive application, a wager of an amount of interactive elements of an interactive application, and a wager of an amount of objects used in an interactive application. A wager outcome determined for a wager in accordance with a wagering proposition can increase or decrease an amount of the type of value used in the wager, such as, but not limited to, increasing or decreasing an amount of Cr for a wager of Cr. In various embodiments, a wager outcome determined for a wager in accordance with a wagering proposition can increase or decrease an amount of a type of value that is different than a type of value of the wager, such as, but not limited to, increasing an amount of an object of an interactive application for a wager of Cr.

In many embodiments, the wager controller 102 includes one or more random number generators (RNG) 106 for generating random results, one or more paytables 108 for determining a wager outcome from the random results, and one or more credit meters 110 for storing data about amounts of stored, wagered and won credits.

In several embodiments, the wager controller 102 is operatively connected to the credit processing system 198 via interface 190. The wager controller 102 communicates with the credit processing system 198 to receive incoming credit data 194 from the credit processing system 198. The wager controller 102 uses the incoming credit data 194 to transfer credits into the multi-directional shooting interleaved wagering system and onto the one or more credit meters 110. The wager controller 102 communicates outgoing credit data 192 to the credit processing system 198 to transfer credits off of the one or more credit meters 110 and out of the multi-directional shooting interleaved wagering system.

In many embodiments, the credit processing system 198 includes one or more credit input devices for generating incoming credit data 192 from a credit input. Credit inputs can include, but are not limited to, credit items used to transfer credits. The incoming credit data 194 are communicated to the wager controller 102. In various embodiments, the one or more credit input devices and their corresponding credit items include, but are not limited to: card readers for reading cards having magnetic stripes, RFID chips, smart chips, and the like; scanners for reading various types of printed indicia printed on to various types of media such as vouchers, coupons, TITO tickets, rewritable cards, or the like; and bill and/or coin validators that receive and validate paper and/or coin currency or tokens.

In various embodiments, the credit processing system 198 includes one or more credit output devices for generating a credit output based on outgoing credit data 192 communicated from the wager controller. Credit outputs can include, but are not limited to, credit items used to transfer credits. Types of credit output devices and their corresponding credit items may include, but are not limited to: writing devices that are used to write to cards having magnetic stripes, smart chips or the like; printers for printing various types of printed indicia onto vouchers, coupons, TITO tickets, vouchers, rewritable cards or the like; and bill and/or coin hoppers that output paper and/or coin currency or tokens.

In some embodiments, the credit processing system 198 are operatively connected to, and communicate with, a TITO controller or the like to determine incoming credit data 194 representing amounts of credits to be transferred into the multi-directional shooting interleaved wagering system and to determine outgoing credit data 192 representing amounts of credits to be transferred out of the multi-directional shooting interleaved wagering system. In operation, the credit processing system 198 communicate with a connected credit input device, such as a bill validator/ticket scanner, used to scan a credit input in the form of a TITO ticket having indicia of credit account data of a credit account of the TITO controller. The credit processing system 198 communicates the credit account data to the TITO controller. The TITO controller uses the credit account data to determine an amount of credits to transfer to the credit processing system 198, and thus to the wager controller 102 of the multi-directional shooting interleaved wagering system 128. The TITO controller communicates the amount of credits to the credit processing system 198. The credit processing system 198 communicates the amount of credits as incoming credit data 194 to the wager controller 102 and the wager controller 102 credits one or more credit meters with the amount of credits so that the credits can be used when a user makes wagers using the multi-directional shooting interleaved wagering system 128.

In many embodiments, the credit processing system 198 includes a bill validator/ticket scanner as one of the one or more credit input devices. The credit processing system 198 communicates with the bill validator/ticket scanner to scan currency used as a credit input to determine an amount of credits as incoming credit data 194 to transfer credit to one or more credit meters 110 associated with one or more users. The wager controller 102 credits the one or more credit meters 110 with the amount of credits so that the credits can be used when a user makes wagers using the multi-directional shooting interleaved wagering system 128.

In some embodiments, the credit processing system 198 can use a TITO controller along with a ticket or voucher printer as one of the one or more credit output devices to generate a TITO ticket as a credit output for a user. In operation, the credit processing system 198 communicates, as outgoing credit data 192, data of an amount of credits to be credited to a credit account on the TITO controller. The TITO controller receives the amount of credits and creates the credit account and credits the credit account with the amount of credits. The TITO controller generates credit account data for the credit account and communicates the credit account data to the credit processing system 198. The credit processing system 198 uses the ticket or voucher printer to print indicia of the credit account data onto a TITO ticket as a credit output.

In various embodiments, the credit processing system 198 provides an interface to an electronic payment management system (not shown) such an electronic wallet or the like. The electronic payment system provides credit account data that is used for generating incoming credit data 194 as a credit input and outgoing credit data 192 as a credit output.

In several embodiments, during operation, the wager controller 102 communicates with the credit processing system 198 to receive incoming credit data 194 from the credit processing system 198 and adds credits onto the one or more credit meters 110 at least partially on the basis of the incoming credit data 194. The one or more random number generators 106 execute processes that generate random results. The wager controller uses the one or more paytables 108 to map the random results to a wager outcome. The wager controller 102 adds credits to, or deducts credits from, the one or more credit meters 110 based in part on the wager outcome. For example, in some embodiments, the wager controller 102 adds an amount of credits to the one or more credit meters 110 when the wager outcome indicates a win and deducts an amount of credits from the one or more credit meters 110 when the wager outcome indicates a loss or a partial win. At an end of a wagering session, the wager controller 102 transfers credits off of the one or more credit meters 110 and out of the multi-directional shooting interleaved wagering system by communicating outgoing credit data 192 to the credit processing system 198.

In various embodiments, the wager controller 102 includes one or more paytables 108. The one or more paytables 108 are used to implement one or more wagering propositions in conjunction with one or more random outputs of the one or more random number generators.

In many embodiments, the wager controller 102 generates random numbers by continuously generating pseudo random numbers using a pseudo random number generator. A most current pseudo random number is stored in a buffer thus constantly refreshing the buffer. In many embodiments, the buffer is refreshed at a rate exceeding 100 times per second. When the wager controller 102 receives a request for a random outcome, the wager controller 102 retrieves the stored most current pseudo random number from the buffer. As timing between requests for a random outcome is not deterministic, the resulting output from the buffer is a random number. The random number is used along with a paytable that the wager controller selects from the one or more paytables 108. The selected paytable includes a mapping of values in a range of values of the random number to specified multipliers to be applied to an amount of credits to determine an amount of credits to be added to one or more credit meters associated with the wagering proposition. A multiplier is selected from the paytable based on the random number and the selected multiplier is used along with an amount of credits to determine a wager outcome as an amount of credits.

In various embodiments, the wager outcome can include, but is not limited to, an amount of Cr, AC, and/or interactive elements or objects won as a function of the multi-directional shooting interleaved wagering system use and a type and amount of Cr, AC and/or interactive application objects wagered. A multiplier taken from the on ore more paytables 108 is applied to the amount of Cr, AC and/or interactive application objects wagered and the resultant outcome is a wager outcome for a wagering proposition.

In some embodiments, a range of the value of the random number is mapped to one or more symbols representing one or more random elements of a traditional wagering proposition, and the mapped to one or more symbols are used in conjunction with a paytable selected from the one or more paytables 108. In one such embodiment, a random number is mapped to a virtual card of a deck of virtual cards. In another such embodiment, the random number is mapped to a virtual face of a virtual die. In yet another such embodiment, the random number is mapped to symbol of a virtual reel strip on a virtual reel slot machine. In yet another such embodiment, the random number is mapped to a pocket of a virtual roulette wheel. In some embodiments, two or more random numbers are mapped to appropriate symbols to represent a completed wagering proposition. In one such embodiment, two or more random numbers are mapped to faces of two or more virtual dice to simulate a random outcome generated by throwing two or more dice. In another such embodiment, multiple random numbers are mapped to virtual cards from a virtual deck of cards without replacement. In yet another such embodiment, two or more random numbers are mapped to two or more virtual reel strips to create stop positions for a virtual multi-reel slot machine.

In some embodiments, a wager controller executes a wager in accordance with a wagering proposition by executing wager execution commands that define processes of a wagering proposition where the wager execution commands are formatted in a scripting language. In operation, a decision engine of a process controller generates the wager execution commands in the form of a script written in the scripting language. The script includes the wager execution commands that describe how the wager controller is to execute the wagering proposition. The completed script is encoded as wager execution command data and communicated to the wager controller by the process controller. The wager controller receives the wager execution command data and parses the script encoded in the wager execution command data and executes the commands included in the script to execute the wager.

In some embodiments, a wager controller executes a wager in accordance with a wagering proposition by executing wager execution commands that define processes of the wagering user interface. In operation, a decision engine of a process controller generates the wager execution commands and encodes the wager execution commands into wager execution command data that are communicated to the wager controller by the process controller. The wager controller receives the wager execution command data and executes the commands encoded in the wager execution command data to execute the wager.

In various embodiments, the interactive processing device 120 executes an interactive application 143 and provides one or more user interface input and output devices 103 so that a user can interact with the interactive application 143. In various embodiments, user interface input devices include, but are not limited to: buttons or keys; keyboards; keypads; game controllers; joysticks; computer mice; track balls; track buttons; touch pads; touch screens; accelerometers; motion sensors; video input devices; microphones; and the like. In various embodiments, user interface output devices include, but are not limited to: audio output devices such as speakers, headphones, earbuds, and the like; visual output devices such as lights, video displays and the like; and tactile devices such as rumble pads, hepatic touch screens, buttons, keys and the like. The interactive processing device 120 provides for user interactions with the interactive application 143 by executing the interactive application 143 that generates an application interface 105 that utilizes the user interface input devices 103 to detect user interactions with the interactive processing device and generates an interactive user interface that is presented to the user utilizing the user interface output devices.

In some embodiments, one or more components an interactive processing device are housed in an enclosure such as a housing, cabinet, casing or the like. The enclosure further includes one or more user accessible openings or surfaces that constructed to mount the user interface input devices and/or the user interface output devices 103.

The interactive processing device 120 is operatively connected to, and communicates with, the process controller 112. The interactive processing device communicates application telemetry data 124 to the process controller 112 and receives application instruction and resource data 136 from the process controller 112. Via the communication of application instruction and resource data 136, the process controller 112 can control the processing of the interactive processing device by communicating interactive application commands and resources including control parameters to the interactive application 143 during the interactive application's execution by the interactive processing device 120.

In some embodiments, during execution of the interactive application 143 by the interactive processing device 120, the interactive processing device 120 communicates, as application telemetry data 124, user interactions with the application user interface 105 of the interactive application to the process controller 112. The application telemetry data 124 includes, but is not limited to, utilization of the interactive elements in the interactive application 143.

In some embodiments, the interactive application 143 is a skill-based interactive application. In such embodiments, execution of the skill-based interactive application 143 by the interactive processing device 120 is based on a user's skillful interaction with the skill-based interactive application, such as, but not limited to, the user's utilization of the interactive elements of the skill-based interactive application 143 during the user's skillful interaction with the skill-based interactive application 143. In such an embodiment, the process controller 112 communicates with the interactive processing device 120 in order to allow the coupling of the skill-based interactive application 143 to wagers made in accordance with a wagering proposition of the wager controller 102.

In some embodiments, the interactive processing device 120 includes one or more sensors 138 that sense various aspects of the physical environment of the interactive processing device 120. Examples of sensors include, but are not limited to: global positioning sensors (GPSs) for sensing communications from a GPS system to determine a position or location of the interactive processing device; temperature sensors; accelerometers; pressure sensors; and the like. Sensor telemetry data 133 is communicated by the interactive processing device to the process controller 112 as part of the application telemetry data 124. The process controller 112 receives the sensor telemetry data 133 and uses the sensor telemetry data to make wager decisions.

In many embodiments, the interactive processing device 120 includes a wagering user interface 148 used to display wagering data, via one or more of the user interface input and output devices 103, to one or more users.

In various embodiments, an application control interface 131 resident in the interactive processing device 120 provides an interface between the interactive processing device 120 and the process controller 112.

In some embodiments, the application control interface 131 implements an interactive processing device to process controller communication protocol employing an interprocess communication protocol so that the interactive processing device and the process controller may be implemented on the same device. In operation, the application control interface 131 provides application programming interfaces that are used by the interactive processing application 143 of the interactive processing device 120 to communicate outgoing data and receive incoming data by passing parameter data to another process or application.

In some embodiments, the application control interface 131 implements an interactive processing device to process controller communication protocol employing an interdevice communication protocol so that the interactive processing device and the process controller may be implemented on different devices. The interdevice protocol may utilize a wired communication bus or wireless connection as a physical layer. In various embodiments, the application control interface 131 implements an interactive processing device to process controller communication protocol employing a networking protocol so that the interactive processing device and the process controller may be implemented on different devices connected by a network. The networking protocol may utilize a wired communication bus or wireless connection as a physical layer. In many such embodiments, the network includes a cellular telephone network or the like and the interactive processing device is a mobile device such as a smartphone or other device capable of using the telephone network. During operation, the application control interface 131 communicates outgoing data to an external device by encoding the data into a signal and transmitting the signal to an external device. The application control interface receives incoming data from an external device by receiving a signal transmitted by the external device and decoding the signal to obtain the incoming data.

In various embodiments, the process controller 112 includes one or more interfaces, 162, 163 and 164, that operatively connect the process controller 112 to one or more interactive processing devices, such as interactive processing device 120, to one or more session management servers, such as session/management controller 150, and/or to one or more wager controllers, such as wager controller 102, respectively.

In some embodiments, one or more of the process controller interfaces implement a process controller to device or server communication protocol employing an interprocess communication protocol so that the process controller and one or more of an interactive processing device, a wager controller, and/or a session/management controller may be implemented on the same device. In operation, the process controller interfaces provide application programming interfaces or the like that are used by the process controller to communicate outgoing data and receive incoming data by passing parameter data to another process or application running on the same device.

In some embodiments, one or more of the process controller interfaces implement a process controller communication protocol employing an interdevice communication protocol so that the process controller may be implemented on a device separate from the one or more interactive processing devices, the one or more session/management controllers and/or the one or more wager controllers. The interdevice protocol may utilize a wired communication bus or wireless connection as a physical layer. In various embodiments, one or more of the process controller interfaces implement a process controller communication protocol employing a networking protocol so that the process controller may be operatively connected to the one or more interactive processing devices, the one or more session/management controllers, and/or the one or more wager controllers by a network. The networking protocol may utilize a wired communication bus or wireless connection as a physical layer. In many such embodiments, the network includes a cellular telephone network or the like and the one or more interactive processing devices include a mobile device such as a smartphone or other device capable of using the telephone network. During operation, the one or more process controller interfaces communicate outgoing data to an external device or server by encoding the data into a signal and transmitting the signal to the external device or server. The one or more process controller interfaces receive incoming data from an external device or server by receiving a signal transmitted by the external device or server and decoding the signal to obtain the incoming data.

In many embodiments, process controller 112 provides an interface between the interactive application 143 provided by the interactive processing device 120 and a wagering proposition provided by the wager controller 102.

The process controller 112 includes a rule-based decision engine 122 that receives telemetry data, such as application telemetry data 124 and sensor telemetry data 133, from the interactive processing device 120. The rule-based decision engine 122 uses the telemetry data, along with wager logic 126 to generate wager execution commands 129 that are used by the process controller 112 to command the wager controller 102 to execute a wager. The wager execution command data is communicated by the process controller 112 to the wager controller 102. The wager controller 102 receives the wager execution command data 129 and automatically executes a wager in accordance with the wager execution command data 129.

In an embodiment, the application telemetry data 124 used by the decision engine 122 encodes data about the operation of the interactive application 143 executed by the interactive processing device 120. In some embodiments, the application telemetry data 124 encodes interactions of a user, such as a user's interaction with an interactive element of the interactive application 143. In many embodiments, the application telemetry data 124 includes a state of the interactive application 143, such as values of variables that change as the interactive application 143 is executed. The decision engine 122 includes one or more rules as part of wager logic 126 used by the decision engine 122 to determine when a wager should be automatically triggered. Each rule includes one or more variable values constituting a pattern that is to be matched by the process controller 112 using the decision engine 122 to one or more variable values encoded in the application telemetry data 124. Each rule also includes one or more actions that are to be taken if the pattern is matched. Actions can include automatically generating wager execution command data 129 and communicating the wager execution command data 129 to the wager controller 102, thus commanding the wager controller to automatically execute a wager as described herein. During operation, the decision engine 122 receives application telemetry data 124 from the interactive processing device 124 via interface 160. The decision engine 122 performs a matching process of matching the variable values encoded in the application telemetry data 124 to one or more variable patterns of one or more rules. If a match between the variable values and a pattern of a rule is determined, then the process controller 112 performs the action of the matched rule.

In some embodiments, the application telemetry data 124 includes, but is not limited to, application environment variables that indicate a state of the interactive application 143, interactive processing device data indicating a state of the interactive processing device 120, and interactions with the interactive application 143 during execution of the interactive application 143 by the interactive processing device 120. The wager execution command data 129 may include, but are not limited to, an amount and type of the wager, a trigger of the wager, and a selection of a paytable to be used when executing the wager.

In some embodiments, the process controller 112 receives wager outcome data 130 from the wager controller 102. The decision engine 122 uses the wager outcome data 130, in conjunction with the telemetry data 124 and application logic 132, to automatically generate interactive application instruction and resource data 136 that the process controller 112 communicates to the interactive processing device 120 via interfaces 160 and 131.

In an embodiment, the wager outcome data 130 used by a decision engine encodes data about the execution of a wager executed by the wager controller 102. In some embodiments, the wager outcome data 130 encodes values of variables including an amount of credits wagered, an amount of credits won and values of credits stored in the one or more meters 110 of the wager controller. In many embodiments, the wager outcome data includes a state of the wager controller 102, such as values of variables that change as the wager controller 102 executes wagers. The decision engine 122 includes one or more rules as part of application logic 132 used by the decision engine 122 to automatically generate the interactive application instruction and resource data 136 that is then communicated to the interactive processing device 120. Each rule includes one or more variable values constituting a pattern that is to be matched to one or more variable values encoded in the wager outcome data 130. Each rule also includes one or more actions that are to be automatically taken by the process controller 112 if the pattern is matched. Actions can include automatically generating interactive application instruction and resource data 136 and using the interactive application instruction and resource data 136 to control the interactive processing device 120 to affect execution of the interactive application 143 as described herein. During operation, the process controller 112 receives the wager outcome data 130 from the wager controller 102 via interface 162. The process controller 112 uses the decision engine 122 to match the variable values encoded in the wager outcome data to one or more patterns of one or more rules of the application logic 132. If a match between the variable values and a pattern of a rule is found, then the process controller automatically performs the action of the matched rule. In some embodiments, the process controller 112 uses the application telemetry data 124 received from the interactive processing device 120 in conjunction with the wager outcome data 130 to generate the interactive application instruction and resource data 136.

The interactive processing device receives the interactive application commands and resource data 136 and automatically uses the interactive application instruction and resource data 136 to configure and command the processes of the interactive application 143.

In some embodiments, the interactive application 143 operates utilizing a scripting language. The interactive application 143 parses scripts written in the scripting language and executes commands encoded in the scripts and sets variable values as defined in the scripts. In operation of such embodiments, the process controller 112 automatically generates interactive application instruction and resource data 136 in the form of scripts written in the scripting language that are communicated to the interactive processing device 120 during execution of the interactive application 143. The interactive processing device 120 receives the scripts and passes them to the interactive application 143. The interactive application 143 receives the scripts, parses the scripts and automatically executes the commands and sets the variable values as encoded in the scripts.

In many embodiments, the interactive application 143 automatically performs processes as instructed by commands communicated from the process controller 112. The commands command the interactive application 143 to perform specified operations such as executing specified commands and/or setting the values of variables utilized by the interactive application 143. In operation of such embodiments, the process controller 112 automatically generates commands that are encoded into the interactive application instruction and resource data 136 that are communicated to the interactive processing device 120. The interactive processing device 120 passes the application instruction and resource data 136 to the interactive application 143. The interactive application parses the application instruction and resource data and automatically performs operations in accordance with the commands encoded in the interactive application instruction and resource data 136.

In many embodiments, the process controller 112 includes a pseudo random or random result generator used to generate random results that are used by the decision engine 122 to generate portions of the interactive application instruction and resource data 136.

In various embodiments, the process controller 112 uses the rule-based decision engine 122 to automatically determine an amount of AC to award based at least in part on interactions with the interactive application 143 of the multi-directional shooting interleaved wagering system as determined by the process controller 112 from the application telemetry data 124. In some embodiments, the process controller 112 mays also use the wager outcome data 130 to determine the amount of AC that should be awarded.

In numerous embodiments, the interactive application 143 is a skill-based interactive application and the AC is awarded for skillful interaction with the interactive application.

In some embodiments, the interactive application instruction and resource data 136 are communicated to a wagering user interface generator 144. The wagering user interface generator 144 also receives wager outcome data 130. The process controller uses the wagering user interface generator 144, the interactive application instruction and resource data 136 and the wager outcome data 130 to automatically generate wager telemetry commands 146 used by the process controller 112 to command the interactive processing device 120 to automatically generate a wagering user interface 148 describing a state of wagering and credit accumulation and loss for the multi-directional shooting interleaved wagering system. In some embodiments, the wager telemetry data 146 may include, but is not limited to, amounts of AC and interactive elements earned, lost or accumulated through interaction with interactive application, and Cr, AC and interactive elements amounts won, lost or accumulated as determined from the wager outcome data 130 and the one or more meters 110.

In some embodiments, the wager outcome data 130 also includes data about one or more game states of a wagering proposition as executed by the wager controller 102. In various such embodiments, the wagering user interface generator 144 generates a wagering process display and/or wagering state display using the one or more states of the wagering proposition. The wagering process display and/or wagering state display is included in the wager telemetry data 146 that is communicated to the interactive processing device 120. The wagering process display and/or wagering state display is automatically displayed by the interactive processing device 120 using the wagering user interface 148. In other such embodiments, the one or more states of the wagering proposition are communicated to the interactive processing device 120 and the interactive processing device 120 is instructed to automatically generate the wagering process display and/or wagering state display of the wagering user interface 148 using the one or more states of the wagering proposition for display.

In some embodiments, the wager outcome data 130 includes game state data about execution of the wagering proposition, including but not limited to a final state, intermediate state and/or beginning state of the wagering proposition. For example, in a wagering proposition that is based on slot machine math, the final state of the wagering proposition may be reel positions, in a wagering proposition that is based on roulette wheel math, the final state may be a pocket where a ball may have come to rest, in a wagering proposition that is a based on card math, the beginning, intermediate and final states may represent a sequence of cards being drawn from a deck of cards, etc.

In some embodiments, the interactive processing device 120 generates a wagering user interface by executing commands that define processes of the wagering user interface where the commands are formatted in a scripting language. In operation, a wagering user interface generator of a process controller generates commands in the form of a script written in the scripting language. The script includes commands that describe how the interactive processing device is to display wager outcome data. The completed script is encoded as wager telemetry data and communicated to the interactive processing device by the process controller. The interactive processing device receives the wager telemetry data and parses the script encoded in the wager telemetry data and executes the commands included in the script to generate the wagering user interface.

In many embodiments, an interactive processing device generates a wagering user interface based on a document written in a document markup language that includes commands that define processes of the wagering user interface. In operation, a wagering user interface generator of a process controller generates a document composed in the document markup language. The document includes commands that describe how the interactive processing device is to display wager outcome data. The completed document is encoded as wager telemetry data and communicated to the interactive processing device by the process controller. The interactive processing device receives the wager telemetry data and parses the document encoded in the wager telemetry data and executes the commands encoded into the document to generate the wagering user interface.

In some embodiments, an interactive processing device generates a wagering user interface by executing commands that define processes of the wagering user interface. In operation, a wagering user interface generator of a process controller generates the commands and encodes the commands into wager telemetry data that is communicated to the interactive processing device by the process controller. The interactive processing device receives the wager telemetry data and executes the commands encoded in the wager telemetry data to generate the wagering user interface.

In various embodiments, an interactive processing device includes a data store of graphic and audio display resources that the interactive processing device uses to generate a wagering user interface as described herein.

In many embodiments, a process controller communicates graphic and audio display resources as part of wager telemetry data to an interactive processing device. The interactive processing device uses the graphic and audio display resources to generate a wagering user interface as described herein.

When a user interacts with the wagering user interface 148, wagering user interface telemetry data 149 is generated by the wagering user interface 148 and communicated by the interactive processing device 120 to the process controller 112 using interfaces 131 and 160.

The process controller 112 can further operatively connect to the wager controller 102 to determine an amount of credit or interactive elements available and other wagering metrics of a wagering proposition. Thus, the process controller 112 may affect an amount of Cr in play for participation in the wagering events of a wagering proposition provided by the wager controller 102 in some embodiments. The process controller 112 may additionally include various audit logs and activity meters. In some embodiments, the process controller 112 can also couple to a centralized session and/or management controller 150 for exchanging various data related to the user and the activities of the user during game play of a multi-directional shooting interleaved wagering system.

In many embodiments, one or more users can be engaged in using the interactive application 143 executed by the interactive processing device 120. In various embodiments, a multi-directional shooting interleaved wagering system can include an interactive application 143 that provides a skill-based interactive application that includes head-to-head play between a single user and a computing device, between two or more users against one another, or multiple users playing against a computer device and/or each other. In some embodiments, the interactive application 143 can be a skill-based interactive application where the user is not skillfully playing against the computer or any other user such as skill-based interactive applications where the user is effectively skillfully playing against himself or herself.

In some embodiments, the operation of the process controller 112 does not affect the provision of a wagering proposition by the wager controller 102 except for user choice parameters that are allowable in accordance with the wagering proposition. Examples of user choice parameters include, but are not limited to: wager terms such as but not limited to a wager amount; speed of game play (for example, by pressing a button or pulling a handle of a slot machine); and/or agreement to wager into a bonus round.

In various embodiments, wager outcome data 130 communicated from the wager controller 102 can also be used to convey a status operation of the wager controller 102.

In a number of embodiments, communication of the wager execution commands 129 between the wager controller 102 and the process controller 112 can further be used to communicate various wagering control factors that the wager controller 102 uses as input. Examples of wagering control factors include, but are not limited to, an amount of Cr, AC, interactive elements, or objects consumed per wagering event, and/or the user's election to enter a jackpot round.

In some embodiments, the process controller 112 utilizes the wagering user interface 148 to communicate certain interactive application data to the user, including but not limited to, club points, user status, control of the selection of choices, and messages which a user can find useful in order to adjust the interactive application experience or understand the wagering status of the user in accordance with the wagering proposition in the wager controller 102.

In some embodiments, the process controller 112 utilizes the wagering user interface 148 to communicate aspects of a wagering proposition to the user including, but not limited to, odds of certain wager outcomes, amount of Cr, AC, interactive elements, or objects in play, and amounts of Cr, AC, interactive elements, or objects available.

In a number of embodiments, the wager controller 102 can accept wager proposition factors from the process controller 112, including, but not limited to, modifications in the amount of Cr, AC, interactive elements, or objects wagered on each individual wagering event, a number of wagering events per minute the wager controller 102 can resolve, entrance into a bonus round, and other factors. An example of a varying wager amount that the user can choose can include, but is not limited to, using a more difficult interactive application level associated with an amount of a wager. These factors can increase or decrease an amount wagered per individual wagering proposition in the same manner that a standard slot machine user can decide to wager more or less credits for each pull of the handle. In several embodiments, the wager controller 102 can communicate a number of factors back and forth to the process controller 112, via an interface, such that an increase/decrease in a wagered amount can be related to the change in user profile of the user in the interactive application. In this manner, a user can control a wager amount per wagering event in accordance with the wagering proposition with the change mapping to a parameter or component that is applicable to the interactive application experience.

In some embodiments, a session/management controller 150 is used to regulate a multi-directional shooting interleaved wagering system session.

In various embodiments, the session/management controller 150 includes one or more interfaces, 165, 166 and 167 that operatively connect the session/management controller 150 to one or more interactive processing devices, such as interactive processing device 120, to one or more process controllers, such as process controller 112, and/or to one or more wager controllers, such as wager controller 102, through their respective interfaces.

In some embodiments, one or more of the session/management controller interfaces implement a session/management controller to device or server communication protocol employing an interprocess communication protocol so that the session/management controller and one or more of an interactive processing device, a wager controller, and/or a process controller may be implemented on the same device. In operation, the session/management controller interfaces provide application programming interfaces or the like that are used by the session/management controller to communicate outgoing data and receive incoming data by passing parameter data to another process or application running on the same device.

In some embodiments, one or more of the session/management controller interfaces implement a session/management controller communication protocol employing an interdevice communication protocol so that the session/management controller may be implemented on a device separate from the one or more interactive processing devices, the one or more process controllers and/or the one or more wager controllers. The interdevice protocol may utilize a wired communication bus or wireless connection as a physical layer. In various embodiments, one or more of the session/management controller interfaces implement a session/management controller communication protocol employing a networking protocol so that the process session/management controller may be operatively connected to the one or more interactive processing devices, the one or more process controllers, and/or the one or more wager controllers by a network. The networking protocol may utilize a wired communication bus or wireless connection as a physical layer. In many such embodiments, the network includes a cellular telephone network or the like and the one or more interactive processing devices include a mobile device such as a smartphone or other device capable of using the telephone network. During operation, the one or more session/management controller interfaces communicate outgoing data to an external device or server by encoding the data into a signal and transmitting the signal to the external device or server. The one or more session/management controller interfaces receive incoming data from an external device or server by receiving a signal transmitted by the external device or server and decoding the signal to obtain the incoming data.

In various embodiments, the process controller 112 communicates outgoing session data 152 to the session/management controller. The session data 152 may include, but is not limited to, user, interactive processing device, process controller and wager controller data from the process controller 112. The session/management controller 150 uses the user, interactive processing device, process controller and wager controller data to regulate a multi-directional shooting interleaved wagering system session.

In some embodiments, the session/management controller 150 may also assert control of a multi-directional shooting interleaved wagering system session by communicating session control data 154 to the process controller. Such control may include, but is not limited to, commanding the process controller 112 to end a multi-directional shooting interleaved wagering system session, initiating wagering in a multi-directional shooting interleaved wagering system session, ending wagering in a multi-directional shooting interleaved wagering system session but not ending a user's use of the interactive application portion of the multi-directional shooting interleaved wagering system, and changing from real credit wagering in a multi-directional shooting interleaved wagering system to virtual credit wagering, or vice versa.

In many embodiments, the session/management controller 150 manages user profiles for a plurality of users. The session/management controller 150 stores and manages data about users in order to provide authentication and authorization of users of the multi-directional shooting interleaved wagering system 128. In some embodiments, the session/management controller 150 also manages geolocation information to ensure that the multi-directional shooting interleaved wagering system 128 is only used by users in jurisdictions were wagering is approved. In various embodiments, the session/management controller 150 stores application credits that are associated with the user's use of the interactive application of the multi-directional shooting interleaved wagering system 128.

In some embodiments, the session/management controller 150 communicates user and session management data 155 to the user using a management user interface 157 of the interactive processing device. The user 140 interacts with the management user interface 157 and the management user interface generates management telemetry data 159 that is communicated to the session/management controller 150.

In some embodiments, the wager controller 102 communicates wager session data 153 to the session/management controller 150. In various embodiments, the session/management controller communicates wager session control data 151 to the wager controller 102.

In some embodiments, a process controller operates as an interface between an interactive processing device and a wager controller. By virtue of this construction, the wager controller is isolated from the interactive processing device allowing the interactive processing device to operate in an unregulated environment will allowing the wager controller to operate in a regulated environment.

In some embodiments, a single wager controller may provide services to two or more interactive processing devices and/or two or more process controllers, thus allowing a multi-directional shooting interleaved wagering system to operate over a large range of scaling.

In various embodiments, multiple types of interactive processing devices using different operating systems may be interfaced to a single type of process controller and/or wager controller without requiring customization of the process controller and/or the wager controller.

In many embodiments, an interactive processing device may be provided as a user device under control of a user while maintaining the wager controller in an environment under the control of a regulated operator of wagering equipment.

In several embodiments, data communicated between the controllers may be encrypted to increase security of the multi-directional shooting interleaved wagering system.

In some embodiments, a process controller isolates wager logic and application logic as unregulated logic from a regulated wager controller, thus allowing errors in the application logic and/or wager logic to be corrected, new application logic and/or wager logic to be used, or modifications to be made to the application logic and/or wager logic without a need for regulatory approval.

In various embodiments, an interactive application may require extensive processing resources from an interactive processing device leaving few processing resources for the functions performed by a process controller and/or a wager controller. By virtue of the architecture described herein, processing loads may be distributed across multiple devices such that operations of the interactive processing device may be dedicated to the interactive application and the processes of the process controller and/or wager controller are not burdened by the requirements of the interactive application.

In many embodiments, a multi-directional shooting interleaved wagering system operates with its components being distributed across multiple devices. These devices can be connected by communication channels including, but not limited to, local area networks, wide area networks, local communication buses, and/or the like. The devices may communicate using various types of protocols, including but not limited to, networking protocols, device-to-device communications protocols, and the like.

In some embodiments, one or more components of a multi-directional shooting interleaved wagering system are distributed in close proximity to each other and communicate using a local area network and/or a communication bus. In several embodiments, an interactive processing device and a process controller of a multi-directional shooting interleaved wagering system are in a common location and communicate with an external wager controller. In some embodiments, a process controller and a wager controller of a multi-directional shooting interleaved wagering system are in a common location and communicate with an external interactive processing device. In many embodiments, an interactive processing device, a process controller, and a wager controller of a multi-directional shooting interleaved wagering system are located in a common location. In some embodiments, a session/management controller is located in a common location with a process controller and/or a wager controller.

In various embodiments, these multiple devices can be constructed from or configured using a single device or a plurality of devices such that a multi-directional shooting interleaved wagering system is executed as a system in a virtualized space such as, but not limited to, where a wager controller and a process controller are large scale centralized servers in the cloud operatively connected to widely distributed interactive processing devices via a wide area network such as the Internet or a local area network. In such embodiments, the components of a multi-directional shooting interleaved wagering system may communicate using a networking protocol or other type of device-to-device communications protocol.

In some embodiments, a multi-directional shooting interleaved wagering system is deployed over a local area network or a wide area network in an interactive configuration. An interactive configuration of a multi-directional shooting interleaved wagering system includes an interactive processing device operatively connected by a network to a process controller and a wager controller.

In some embodiments, a multi-directional shooting interleaved wagering system is deployed over a local area network or a wide area network in a mobile configuration. A mobile configuration of a multi-directional shooting interleaved wagering system is useful for deployment over wireless communication network, such as a wireless local area network or a wireless telecommunications network. A mobile configuration of a multi-directional shooting interleaved wagering system 194 includes an interactive processing device operatively connected by a wireless network to a process controller and a wager controller.

In many embodiments, a centralized wager controller is operatively connected to, and communicates with, one or more process controllers using a communication link. The centralized wager controller can generate wager outcomes for wagers in accordance with one or more wagering propositions. The centralized wager controller can execute a number of simultaneous or pseudo-simultaneous wagers in order to generate wager outcomes for a variety of wagering propositions that one or more distributed multi-directional shooting interleaved wagering systems can use.

In several embodiments, a centralized process controller is operatively connected to one or more interactive processing devices and one or more wager controllers using a communication link. The centralized process controller can perform the functionality of a process controller across various multi-directional shooting interleaved wagering systems.

In numerous embodiments, an interactive application server provides a host for managing head-to-head play operating over a network of interactive processing devices connected to the interactive application server using a communication link. The interactive application server provides an environment where users can compete directly with one another and interact with other users.

Figure 1B:
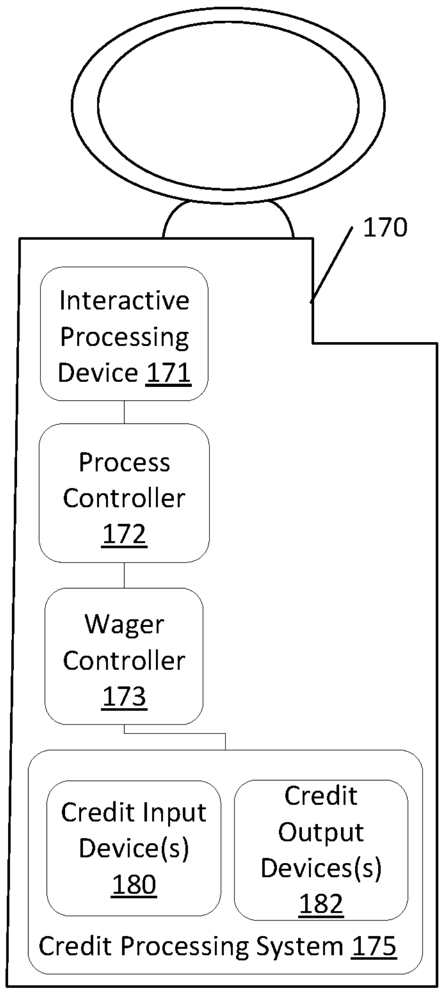
FIG. 1B is a diagram of an electronic gaming machine configuration of a multi-directional shooting interleaved wagering system in accordance with various embodiments of the invention.

FIG. 1B is a diagram of an electronic gaming machine configuration of a multi-directional shooting interleaved wagering system in accordance with various embodiments of the invention. Electronic gaming machine configurations of a multi-directional shooting interleaved wagering system include, but are not limited to, electronic gaming machines such as slot machines, table games, video arcade consoles and the like. An electronic gaming machine configuration of a multi-directional shooting interleaved wagering system 170 includes an interactive processing device 171, a process controller 172 and a wager controller 173 contained in an enclosure such as a housing, cabinet, casing or the like. The enclosure may further include one or more user accessible openings or surfaces that may be used to mount one or more user accessible user input devices, one or more user accessible user output devices, and one or more user accessible credit processing systems. The interactive processing device communicates with the user input devices to detect user interactions with the multi-directional shooting interleaved wagering system and commands and controls the user output devices to provide a user interface to one or more users of the multi-directional shooting interleaved wagering system as described herein. The wager controller communicates with the user credit processing systems to transfer credits into and out of the multi-directional shooting interleaved wagering system as described herein.

In many embodiments, the process controller 172 is operatively connected to an external session/management controller (not shown).

In various embodiments, the wager controller 173 is operatively connected to a credit processing system 175. In many embodiments, the credit processing system 175 includes one or more credit input devices 180 for generating incoming credit data from a credit input. Credit inputs can include, but are not limited to, credit items used to transfer credits. The incoming credit data are communicated to the wager controller 173. In various embodiments, the one or more credit input devices and their corresponding credit items include, but are not limited to: card readers for reading cards having magnetic stripes, RFID chips, smart chips, and the like; scanners for reading various types of printed indicia printed on to various types of media such as vouchers, coupons, vouchers, coupons, TITO tickets, rewritable cards, or the like; and bill and/or coin validators that receive and validate paper currency and/or coin currency or tokens.

In various embodiments, the credit processing system 175 includes one or more credit output devices 182 for generating a credit output based on outgoing credit data communicated from the wager controller 173. Credit outputs can include, but are not limited to, credit items used to transfer credits. Types of credit output devices and their corresponding credit items may include, but are not limited to: writing devices that are used to write to cards having magnetic stripes, smart chips or the like; printers for printing various types of printed indicia onto TITO tickets, vouchers, coupons, rewritable cards or the like; and bill and/or coin hoppers that output paper and/or coin currency or tokens.

In some embodiments, the credit processing system 175 is operatively connected to, and communicates with, a TITO controller (not shown) or the like to determine incoming credit data representing amounts of credits to be transferred into the multi-directional shooting interleaved wagering system 170 and to determine outgoing credit data representing amounts of credits to be transferred out of the multi-directional shooting interleaved wagering system 170. In operation, the credit processing system 175 communicates with one of a the one or more connected credit input devices 180, such as a bill validator/ticket scanner, used to scan a credit input in the form of a TITO ticket having indicia of credit account data of a credit account of the TITO controller. The credit processing system 175 communicates the credit account data to the TITO controller. The TITO controller uses the credit account data to determine an amount of credits to transfer to the credit processing system 175, and thus to the wager controller 173 of the multi-directional shooting interleaved wagering system 128. The TITO controller communicates the amount of credits to the credit processing system 175. The credit processing system 175 communicates the amount of credits as incoming credit data to the wager controller 173 and the wager controller 173 credits one or more credit meters with the amount of credits so that the credits can be used when a user makes wagers using the multi-directional shooting interleaved wagering system 170.

In many embodiments, the credit processing system 175 includes a bill validator/ticket scanner as one of the one or more credit input devices 180. The credit processing system 175 communicates with the bill validator/ticket scanner to scan currency used as a credit input to determine an amount of credits as incoming credit data to transfer credit to one or more credit meters associated with one or more users. The wager controller 173 credits the one or more credit meters with the amount of credits so that the credits can be used when a user makes wagers using the multi-directional shooting interleaved wagering system 170.

In some embodiments, the credit processing system 175 can use a TITO controller along with a ticket or voucher printer as one of the one or more credit output devices 182 to generate a TITO ticket as a credit output for a user. In operation, the credit processing system 175 communicates, as outgoing credit data, data of an amount of credits to be credited to a credit account on the TITO controller. The TITO controller receives the amount of credits and creates the credit account and credits the credit account with the amount of credits. The TITO controller generates credit account data for the credit account and communicates the credit account data to the credit processing system 175. The credit processing system 175 uses the ticket or voucher printer to print indicia of the credit account data onto a TITO ticket as a credit output.

In various embodiments, the credit processing system provides an interface to an electronic payment management system (not shown) such an electronic wallet or the like. The electronic payment system provides credit account data that is used for generating incoming credit data as a credit input and outgoing credit data as a credit output.

In some embodiments, the wager controller 173 is further operatively connected to a central determination controller (not shown). In operation, when the wager controller 173 needs to determine a wager outcome, the wager controller 173 communicates a request to the central determination controller for the wager outcome. The central determination controller receives the wager outcome request and generates a wager outcome in response to the wager request. The central determination controller communicates data of the wager outcome to the wager controller 173. The wager controller 173 receives the data of the wager outcome and utilizes the wager outcome as described herein. In some embodiments, the wager outcome is drawn from a pool of pre-determined wager outcomes. In some embodiments, the wager outcome is a random result that is utilized by the wager controller along with paytables to determine a wager outcome as described herein.

FIGS. 2A, 2B, 2C, and 2D are illustrations of interactive processing devices of a multi-directional shooting interleaved wagering system in accordance with various embodiments of the invention. An interactive processing device, such as interactive processing device 120 of FIG. 1A, may be constructed from or configured using one or more processing devices configured to perform the operations of the interactive processing device. An interactive processing device in a multi-directional shooting interleaved wagering system may be constructed from or configured using any processing device having sufficient processing and communication capabilities that may be configured to perform the processes of an interactive processing device in accordance with various embodiments of the invention. In some embodiments, the construction or configuration of the interactive processing device may be achieved through the use of an application control interface, such as application control interface 131 of FIG. 1A, and/or through the use of an interactive application, such as interactive application 143 of FIG. 1A.

Figure 2A:
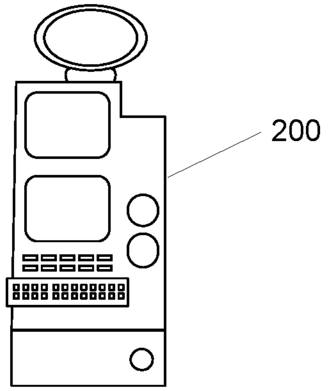
FIGS. 2A, 2B, 2C, and 2D are illustrations of interactive processing devices of a multi-directional shooting interleaved wagering system in accordance with various embodiments of the invention.

In some embodiments, an interactive processing device may be constructed from or configured using an electronic gaming machine 200 as shown in FIG. 2A. The electronic gaming machine 200 may be physically located in various types of gaming establishments.

Figure 2B:
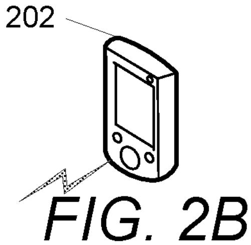

In many embodiments, an interactive processing device may be constructed from or configured using a portable device 202 as shown in FIG. 2B. The portable device 202 is a device that may wirelessly connect to a network. Examples of portable devices include, but are not limited to, a tablet computer, a personal digital assistant, and a smartphone.

Figure 2C:
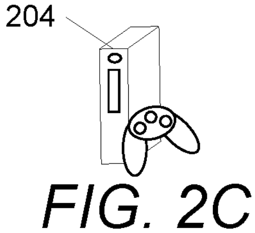

In some embodiments, an interactive processing device may be constructed from or configured using a gaming console 204 as shown in FIG. 2C.

Figure 2D:
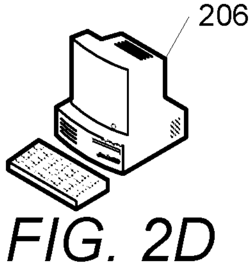

In various embodiments, an interactive processing device may be constructed from or configured using a personal computer 206 as shown in FIG. 2D.

In some embodiments, a device, such as the devices of FIGS. 2A, 2B, 2C, and 2D, may be used to construct a complete multi-directional shooting interleaved wagering system and may be operatively connected using a communication link to a session and/or management controller, such as session and/or management controller 150 of FIG. 1A.

Figure 3A:
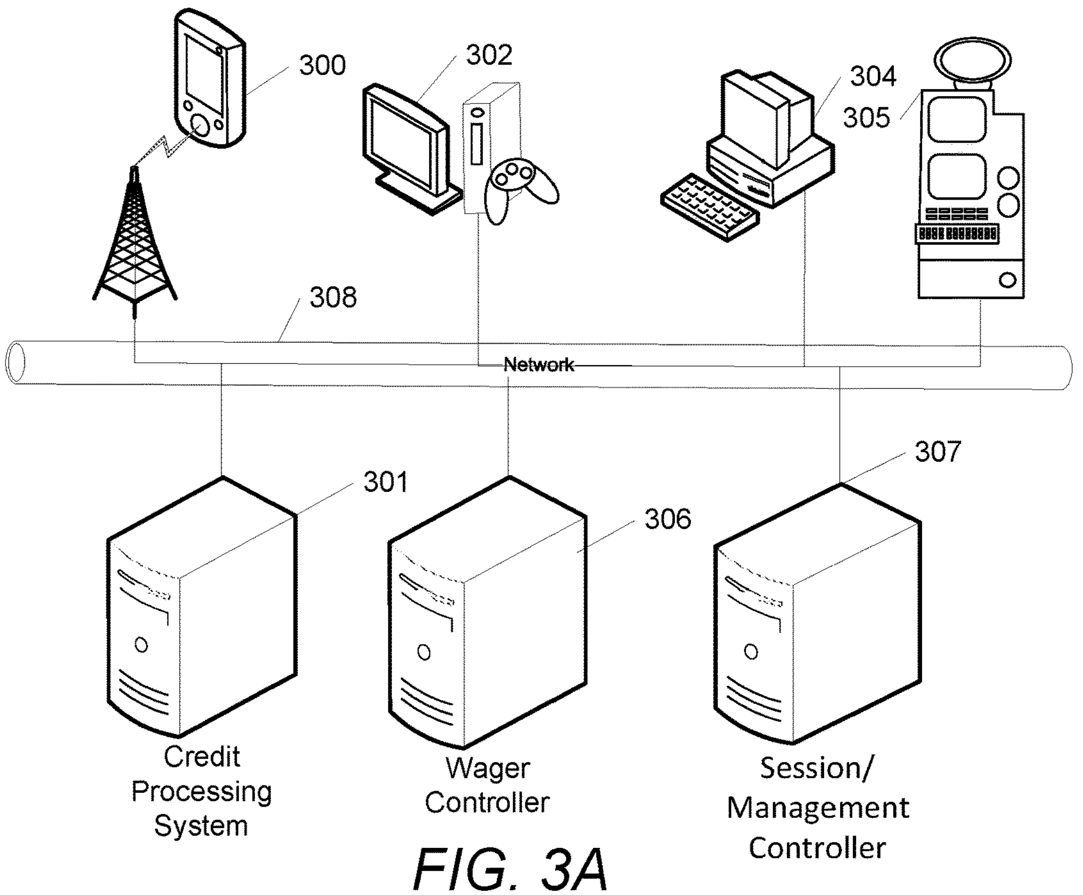
FIGS. 3A, 3B and 3C are diagrams of distributed multi-directional shooting interleaved wagering systems in accordance with various embodiments of the invention.
Figure 3B:
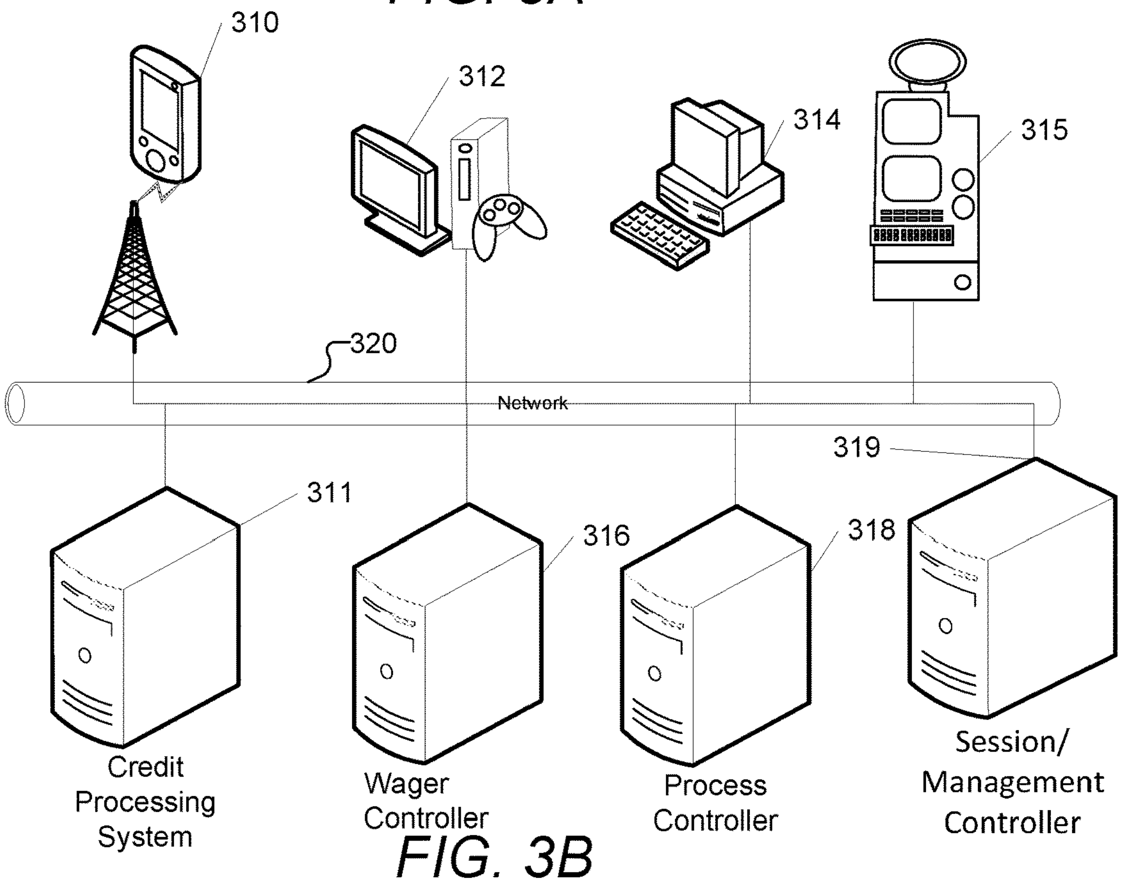
Figure 3C:
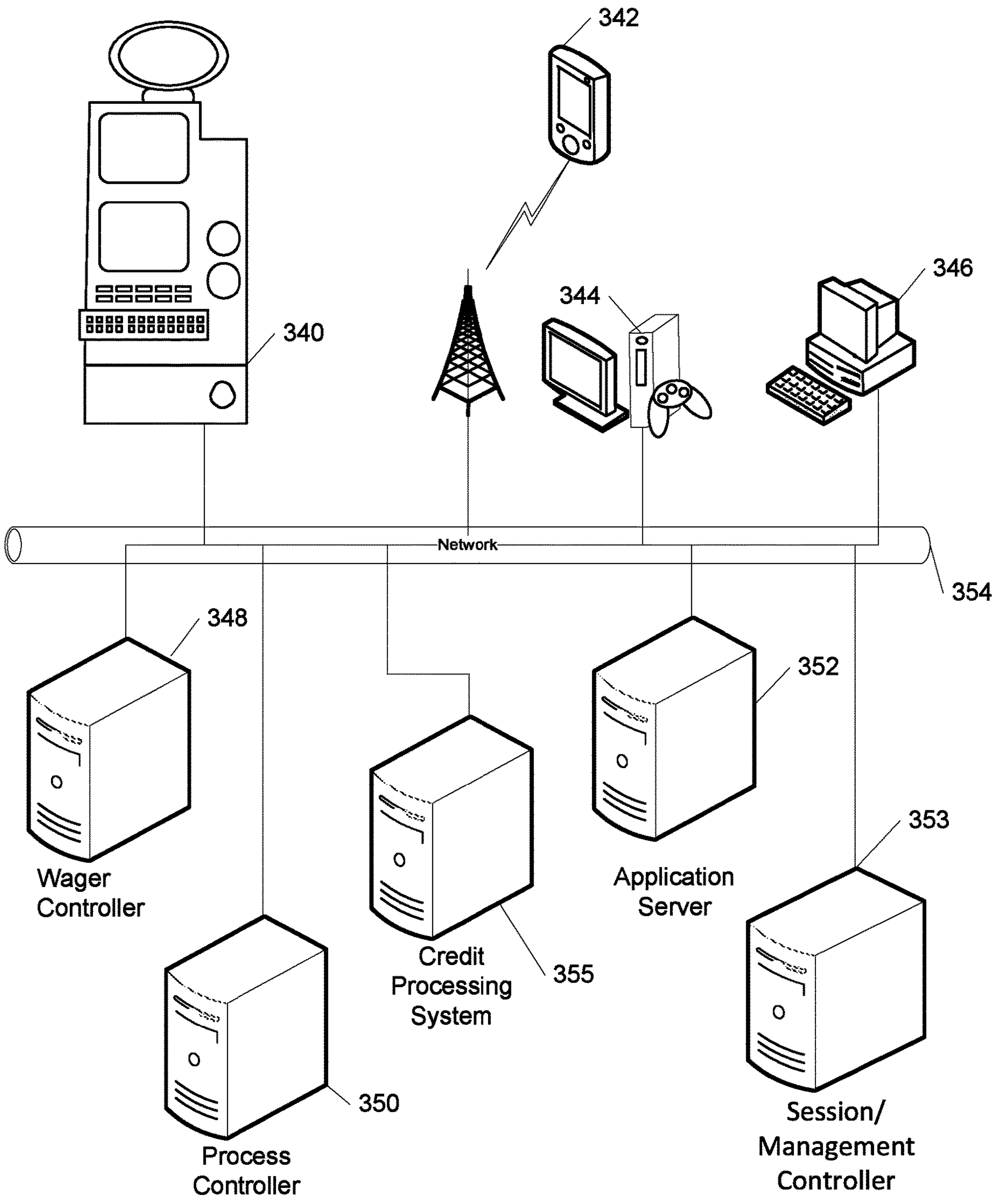

Some multi-directional shooting interleaved wagering systems in accordance with many embodiments of the invention can be distributed across a plurality of devices in various configurations. FIGS. 3A, 3B and 3C are diagrams of distributed multi-directional shooting interleaved wagering systems in accordance with various embodiments of the invention. Turning now to FIG. 3A, one or more interactive processing devices of a distributed multi-directional shooting interleaved wagering system, such as but not limited to, a mobile or wireless device 300, a gaming console 302, a personal computer 304, and an electronic gaming machine 305, are operatively connected with a wager controller 306 of a distributed multi-directional shooting interleaved wagering system using a communication link 308. Communication link 308 is a communications link that allows processing systems to communicate with each other and to share data. Examples of the communication link 308 can include, but are not limited to: a wired or wireless interdevice communication link, a serial or parallel interdevice communication bus; a wired or wireless network such as a Local Area Network (LAN), a Wide Area Network (WAN), or the link; or a wired or wireless communication network such as a wireless telecommunications network or plain old telephone system (POTS). In some embodiments, one or more processes of an interactive processing device and a process controller as described herein are executed on the individual interactive processing devices 300, 302, 304 and 305 while one or more processes of a wager controller as described herein can be executed by the wager controller 306.

In many embodiments, a distributed multi-directional shooting interleaved wagering system and may be operatively connected using a communication link to a session and/or management controller 307, that performs the processes of a session and/or management controller as described herein.

In several embodiments, a distributed multi-directional shooting interleaved wagering system and may be operatively connected using a communication link to credit processing system 306, that performs the processes of one or more credit processing systems as described herein.

A distributed multi-directional shooting interleaved wagering system in accordance with another embodiment of the invention is illustrated in FIG. 3B. As illustrated, one or more interactive processing devices of a distributed multi-directional shooting interleaved wagering system, such as but not limited to, a mobile or wireless device 310, a gaming console 312, a personal computer 314, and an electronic gaming machine 315, are operatively connected with a wager controller 316 and a process controller 318 over a communication link 320. Communication link 320 is a communication link that allows processing systems to communicate and share data. Examples of the communication link 320 can include, but are not limited to: a wired or wireless interdevice communication link, a serial or parallel interdevice communication bus; a wired or wireless network such as a Local Area Network (LAN), a Wide Area Network (WAN), or the link; or a wired or wireless communication network such as a wireless telecommunications network or plain old telephone system (POTS). In some embodiments, the processes of an interactive processing device as described herein are executed on the individual interactive processing devices 310, 312, 314 and 315. One or more processes of a wager controller as described herein are executed by the wager controller 316, and one or more processes of a process controller as described herein are executed by the process controller 318.

In many embodiments, a distributed multi-directional shooting interleaved wagering system and may be operatively connected using a communication link to a session and/or management controller 319, that performs the processes of a session and/or management controller as described herein.

In several embodiments, a distributed multi-directional shooting interleaved wagering system and may be operatively connected using a communication link to credit processing system 311, that performs the processes of one or more credit processing systems as described herein.

A distributed multi-directional shooting interleaved wagering systems in accordance with still another embodiment of the invention is illustrated in FIG. 3C. As illustrated, one or more interactive processing devices of a distributed multi-directional shooting interleaved wagering system, such as but not limited to, a mobile device 342, a gaming console 344, a personal computer 346, and an electronic gaming machine 340 are operatively connected with a wager controller 348 and a process controller 350, and an interactive application server 352 using a communication link 354. Communication link 354 is a communications link that allows processing systems to communicate and to share data. Examples of the communication link 354 can include, but are not limited to: a wired or wireless interdevice communication link, a serial or parallel interdevice communication bus; a wired or wireless network such as a Local Area Network (LAN), a Wide Area Network (WAN), or the link; or a wired or wireless communication network such as a wireless telecommunications network or plain old telephone system (POTS). In some embodiments, one or more processes of a display and user interface of an interactive processing device as described herein are executed on the individual interactive processing devices 340, 342, 344 and 346. One or more processes of a wager controller as described herein can be executed by the wager controller 348. One or more processes of a process controller as described herein can be executed by the process controller server 350 and one or more processes of an interactive processing device excluding the display and user interfaces can be executed by the interactive application server 352.

In many embodiments, a distributed multi-directional shooting interleaved wagering system and may be operatively connected using a communication link to a session and/or management controller 353, that performs the processes of a session and/or management controller as described herein.

In several embodiments, a distributed multi-directional shooting interleaved wagering system and may be operatively connected using a communication link to credit processing system 355, that performs the processes of one or more credit processing systems as described herein.

In other embodiments, a number of other peripheral systems, such as a user management system, a gaming establishment management system, a regulatory system, and/or hosting servers are also operatively connected with the multi-directional shooting interleaved wagering systems using a communication link. Also, other servers can reside outside the bounds of a network within a firewall of the operator to provide additional services for network connected multi-directional shooting interleaved wagering systems.

Although various distributed multi-directional shooting interleaved wagering systems are described herein, multi-directional shooting interleaved wagering systems can be distributed in any configuration as appropriate to the specification of a specific application in accordance with embodiments of the invention. In some embodiments, components of a distributed multi-directional shooting interleaved wagering system, such as a process controller, wager controller, interactive processing device, or other servers that perform services for a process controller, wager controller and/or interactive processing device, can be distributed in different configurations for a specific distributed multi-directional shooting interleaved wagering system application.

Figure 4A:
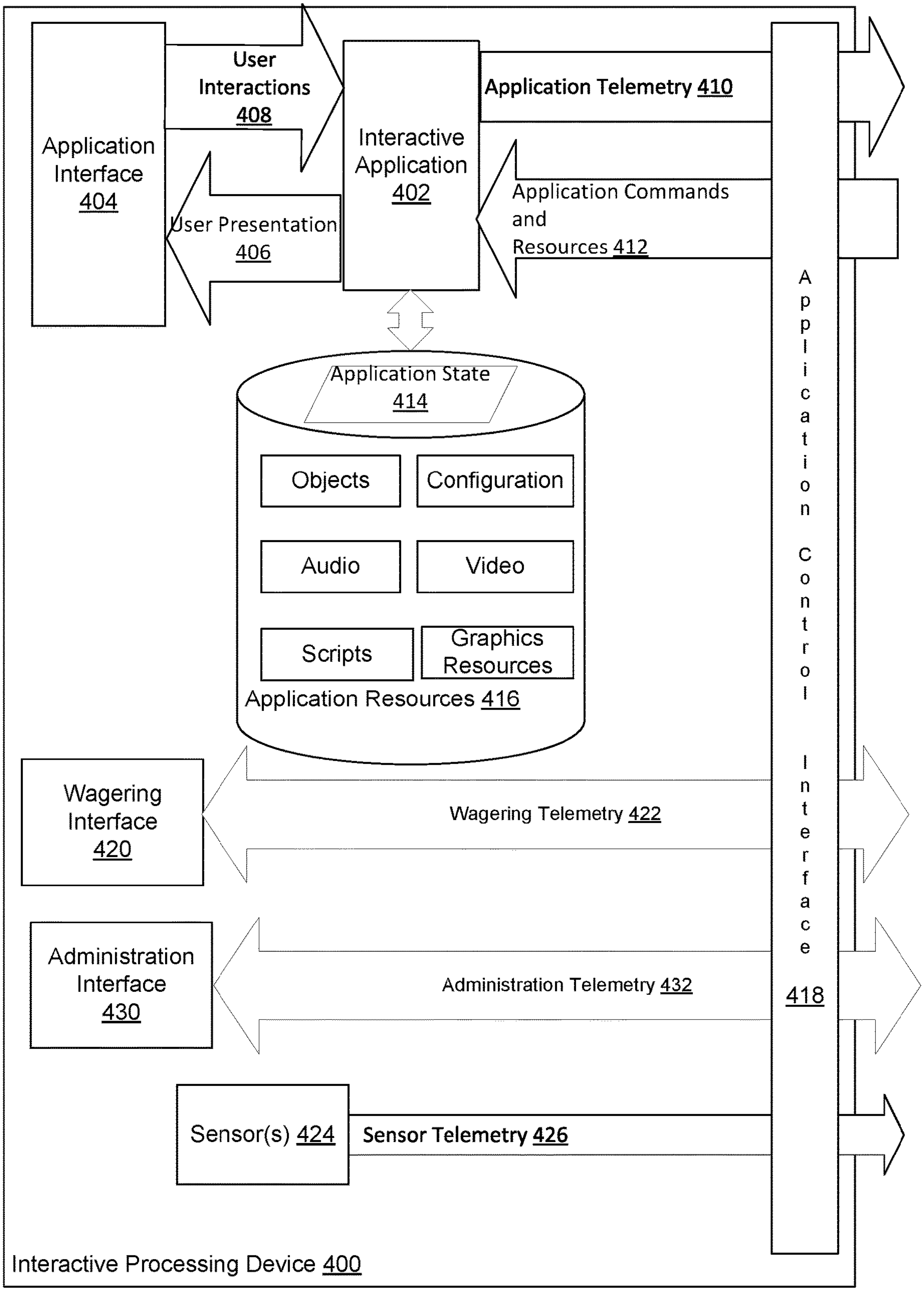
FIGS. 4A and 4B are diagrams of a structure of an interactive processing device of a multi-directional shooting interleaved wagering system in accordance with various embodiments of the invention.
Figure 4B:
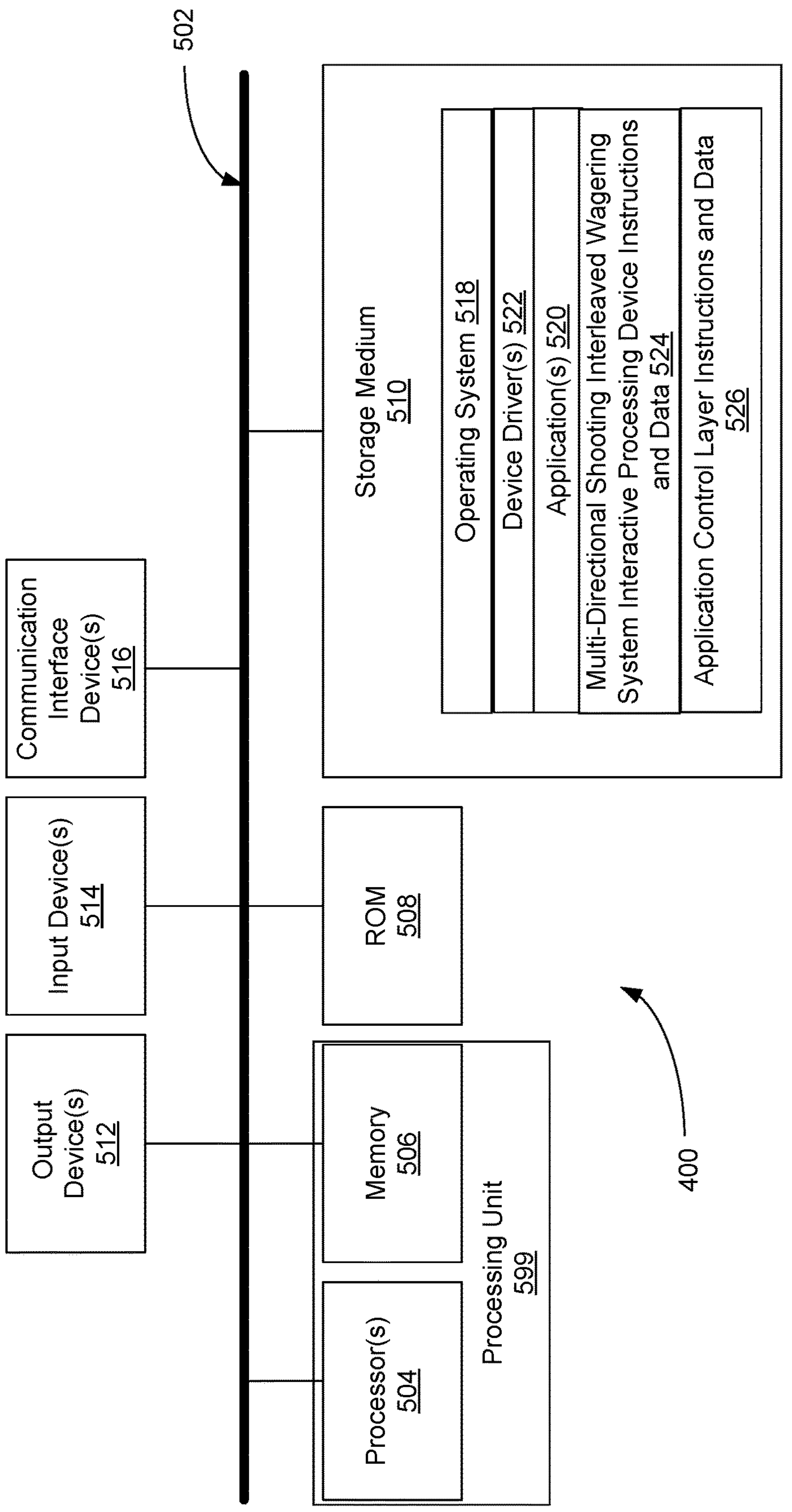

FIGS. 4A and 4B are diagrams of a structure of an interactive processing device of a multi-directional shooting interleaved wagering system in accordance with various embodiments of the invention. An interactive processing device may be constructed from or configured using one or more processing devices configured to perform the operations of the interactive processing device. In many embodiments, an interactive processing device can be constructed from or configured using various types of processing devices including, but not limited to, a mobile device such as a smartphone or the like, a personal digital assistant, a wireless device such as a tablet computer or the like, an electronic gaming machine, a personal computer, a gaming console, a set-top box, a computing device, a controller, or the like.

Referring now to FIG. 4A, an interactive processing device 400, suitable for use as interactive processing device 120 of FIG. 1A, provides an execution environment for an interactive application 402 of a multi-directional shooting interleaved wagering system. In several embodiments, an interactive processing device 400 of a multi-directional shooting interleaved wagering system provides an interactive application 402 that generates an application interface 404 for interaction with by a user. The interactive application 402 generates a user presentation 406 that is presented to the user through the application interface 404. The user presentation 406 may include audio features, visual features or tactile features, or any combination of these features. In various embodiments, the application interface 404 utilizes one or more user interface input and output devices so that a user can interact with the user presentation. In various embodiments, user interface input devices include, but are not limited to: buttons or keys; keyboards; keypads; game controllers; joysticks; computer mice; track balls; track buttons; touch pads; touch screens; accelerometers; motion sensors; video input devices; microphones; and the like. In various embodiments, user interface output devices include, but are not limited to: audio output devices such as speakers, headphones, earbuds, and the like; visual output devices such as lights, video displays and the like; and tactile devices such as rumble pads, hepatic touch screens, buttons, keys and the like. The user's interactions 408 are included by the interactive application 402 in application telemetry data 410 that is communicated by interactive processing device 400 to various other components of a multi-directional shooting interleaved wagering system as described herein. The interactive application 402 receives application commands and resources 412 communicated from various other components of a multi-directional shooting interleaved wagering system as described herein.

In some embodiments, various components of the interactive application 402 can read data from an application state 414 in order to provide one or more features of the interactive application. In various embodiments, components of the interactive application 402 can include, but are not limited to: a physics engine; a rules engine; an audio engine; a graphics engine and the like. The physics engine is used to simulate physical interactions between virtual objects in the interactive application 402. The rules engine implements the rules of the interactive application and a random number generator that may be used for influencing or determining certain variables and/or outcomes to provide a randomizing influence on the operations of the interactive application. The graphics engine is used to generate a visual representation of the interactive application state to the user. The audio engine is used to generate an audio representation of the interactive application state to the user.

During operation, the interactive application reads and writes application resources 416 stored on a data store of the interactive processing device host. The application resources 416 may include objects having graphics and/or control logic used to provide application environment objects of the interactive application. In various embodiments, the resources may also include, but are not limited to, video files that are used to generate a portion of the user presentation 406; audio files used to generate music, sound effects, etc. within the interactive application; configuration files used to configure the features of the interactive application; scripts or other types of control code used to provide various features of the interactive application; and graphics resources such as textures, objects, etc. that are used by a graphics engine to render objects displayed in an interactive application.

In operation, components of the interactive application 402 read portions of the application state 414 and generate the user presentation 406 for the user that is presented to the user using the user interface 404. The user perceives the user presentation and provides user interactions 408 using the user input devices. The corresponding user interactions are received as user actions or inputs by various components of the interactive application 402. The interactive application 402 translates the user actions into interactions with the virtual objects of the application environment stored in the application state 414. Components of the interactive application use the user interactions with the virtual objects of the interactive application and the interactive application state 414 to update the application state 414 and update the user presentation 406 presented to the user. The process loops continuously while the user interacts with the interactive application of the multi-directional shooting interleaved wagering system.

The interactive processing device 400 provides one or more interfaces 418 between the interactive processing device 400 and other components of a multi-directional shooting interleaved wagering system, such as, but not limited to, a process controller and a session/management controller. The interactive processing device 400 and the other multi-directional shooting interleaved wagering system components communicate with each other using the interfaces. The interface may be used to pass various types of data, and to communicate and receive messages, status data, commands and the like. In certain embodiments, the interactive processing device 400 and a process controller communicate application commands and environment resources 412 and application telemetry data 410. In some embodiments, the communications include requests by the process controller that the interactive processing device 400 update the application state 414 using data provided by the process controller.

In many embodiments, a communication by a process controller includes a request that the interactive processing device 400 update one or more resources 416 using data provided by the process controller. In a number of embodiments, the interactive processing device 400 provides all or a portion of the application state to the process controller. In some embodiments, the interactive processing device 400 may also provide data about one or more of the application resources 416 to the process controller. In some embodiments, the communication includes user interactions that the interactive processing device 400 communicates to the process controller. The user interactions may be low level user interactions with the user interface 404, such as manipulation of a user input device, or may be high level interactions with game objects as determined by the interactive application. The user interactions may also include resultant actions such as modifications to the application state 414 or game resources 416 resulting from the user's interactions taken in the multi-directional shooting interleaved wagering system interactive application. In some embodiments, user interactions include, but are not limited to, actions taken by entities such as non-user characters (NPC) of the interactive application that act on behalf of or under the control of the user.

In some embodiments, the interactive processing device 400 includes a wagering user interface 420 used to provide multi-directional shooting interleaved wagering system telemetry data 422 to and from the user. The multi-directional shooting interleaved wagering system telemetry data 422 from the multi-directional shooting interleaved wagering system include, but are not limited to, data used by the user to configure Cr, AC and interactive element wagers, and data about the wagering proposition Cr, AC and interactive element wagers such as, but not limited to, Cr, AC and interactive element balances and Cr, AC and interactive element amounts wagered.

In some embodiments, the interactive processing device 400 includes an administration interface 430 used to provide multi-directional shooting interleaved wagering system administration telemetry data 432 to and from the user.

In some embodiments, the interactive processing device includes one or more sensors 424. Such sensors may include, but are not limited to, physiological sensors that monitor the physiology of the user, environmental sensors that monitor the physical environment of the interactive processing device, accelerometers that monitor changes in motion of the interactive processing device, and location sensors that monitor the location of the interactive processing device such as global positioning sensors (GPSs). The interactive processing device 400 communicates sensor telemetry data 426 to one or more components of the multi-directional shooting interleaved wagering system.

Referring now to FIG. 4B, interactive processing device 400 includes a bus 502 that provides an interface for one or more processors 504, random access memory (RAM) 506, read only memory (ROM) 508, machine-readable storage medium 510, one or more user output devices 512, one or more user input devices 514, and one or more communication interface devices 516.

The one or more processors 504 may take many forms, such as, but not limited to: a central processing unit (CPU); a multi-processor unit (MPU); an ARM processor; a controller; a programmable logic device; or the like.

In the example embodiment, the one or more processors 504 and the random access memory (RAM) 506 form an interactive processing device processing unit 599. In some embodiments, the interactive processing device processing unit includes one or more processors operatively connected to one or more of a RAM, ROM, and machine-readable storage medium; the one or more processors of the interactive processing device processing unit receive instructions stored by the one or more of a RAM, ROM, and machine-readable storage medium via a bus; and the one or more processors execute the received instructions. In some embodiments, the interactive processing device processing unit is an ASIC (Application-Specific Integrated Circuit). In some embodiments, the interactive processing device processing unit is a SoC (System-on-Chip).

Examples of output devices 512 include, but are not limited to, display screens; light panels; and/or lighted displays. In accordance with particular embodiments, the one or more processors 504 are operatively connected to audio output devices such as, but not limited to: speakers; and/or sound amplifiers. In accordance with many of these embodiments, the one or more processors 504 are operatively connected to tactile output devices like vibrators, and/or manipulators.

Examples of user input devices 514 include, but are not limited to: tactile devices including but not limited to, keyboards, keypads, foot pads, touch screens, and/or trackballs; non-contact devices such as audio input devices; motion sensors and motion capture devices that the interactive processing device can use to receive inputs from a user when the user interacts with the interactive processing device; physiological sensors that monitor the physiology of the user; environmental sensors that monitor the physical environment of the interactive processing device; accelerometers that monitor changes in motion of the interactive processing device; and location sensors that monitor the location of the interactive processing device such as global positioning sensors.

The one or more communication interface devices 516 provide one or more wired or wireless interfaces for communicating data and commands between the interactive processing device 400 and other devices that may be included in a multi-directional shooting interleaved wagering system. Such wired and wireless interfaces include, but are not limited to: a Universal Serial Bus (USB) interface; a Bluetooth interface; a Wi-Fi interface; an Ethernet interface; a Near Field Communication (NFC) interface; a plain old telephone system (POTS) interface, a cellular or satellite telephone network interface; and the like.

The machine-readable storage medium 510 stores machine-executable instructions for various components of the interactive processing device, such as but not limited to: an operating system 518; one or more device drivers 522; one or more application programs 520 including but not limited to an interactive application; and multi-directional shooting interleaved wagering system interactive processing device instructions and data 524 for use by the one or more processors 504 to provide the features of an interactive processing device as described herein. In some embodiments, the machine-executable instructions further include application control interface/application control interface instructions and data 526 for use by the one or more processors 504 to provide the features of an application control interface/application control interface as described herein.

In various embodiments, the machine-readable storage medium 510 is one of a (or a combination of two or more of) a hard drive, a flash drive, a DVD, a CD, a flash storage, a solid state drive, a ROM, an EIEPROM, and the like.

In operation, the machine-executable instructions are loaded into memory 506 from the machine-readable storage medium 510, the ROM 508 or any other storage location. The respective machine-executable instructions are accessed by the one or more processors 504 via the bus 502, and then executed by the one or more processors 504. Data used by the one or more processors 504 are also stored in memory 506, and the one or more processors 504 access such data during execution of the machine-executable instructions. Execution of the machine-executable instructions causes the one or more processors 504 to control the interactive processing device 400 to provide the features of a multi-directional shooting interleaved wagering system interactive processing device as described herein Although the interactive processing device is described herein as being constructed from or configured using one or more processors and instructions stored and executed by hardware components, the interactive processing device can be constructed from or configured using only hardware components in accordance with other embodiments. In addition, although the storage medium 510 is described as being operatively connected to the one or more processors through a bus, those skilled in the art of interactive processing devices will understand that the storage medium can include removable media such as, but not limited to, a USB memory device, an optical CD ROM, magnetic media such as tape and disks. In some embodiments, the storage medium 510 can be accessed by the one or more processors 504 through one of the communication interface devices 516 or using a communication link. Furthermore, any of the user input devices or user output devices can be operatively connected to the one or more processors 504 vione of the communication interface devices 516 or using a communication link.

In some embodiments, the interactive processing device 400 can be distributed across a plurality of different devices. In many such embodiments, an interactive processing device of a multi-directional shooting interleaved wagering system includes an interactive application server operatively connected to an interactive client using a communication link. The interactive application server and interactive application client cooperate to provide the features of an interactive processing device as described herein.

In various embodiments, the interactive processing device 400 may be used to construct other components of a multi-directional shooting interleaved wagering system as described herein.

In some embodiments, components of an interactive processing device and a process controller of a multi-directional shooting interleaved wagering system may be constructed from or configured using a single device using processes that communicate using an interprocess communication protocol. In other such embodiments, the components of an interactive processing device and a process controller of a multi-directional shooting interleaved wagering system may communicate by passing messages, parameters or the like.

Figure 5A:
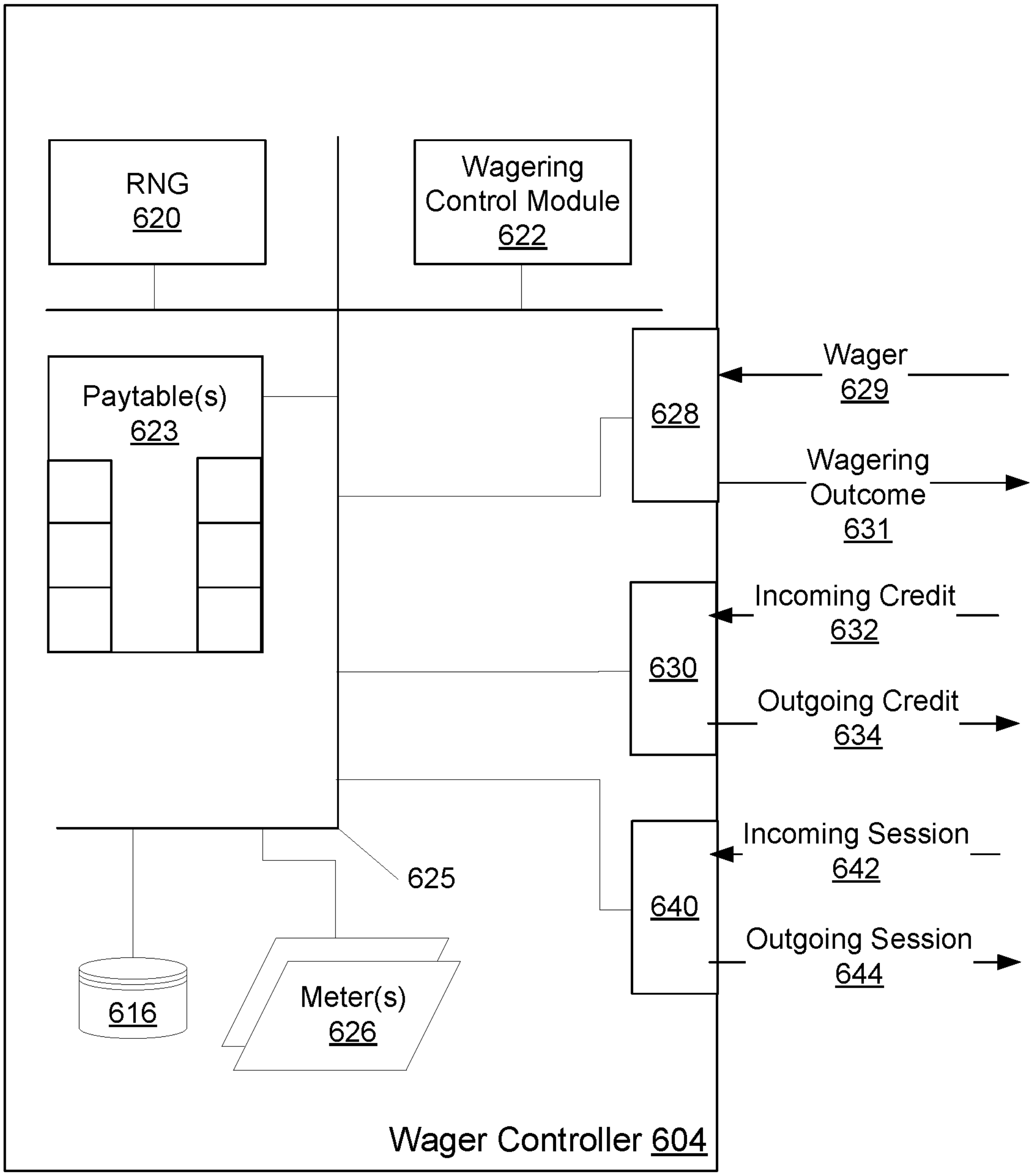
FIGS. 5A and 5B are diagrams of a structure of a wager controller of a multi-directional shooting interleaved wagering system in accordance with various embodiments of the invention.
Figure 5B:
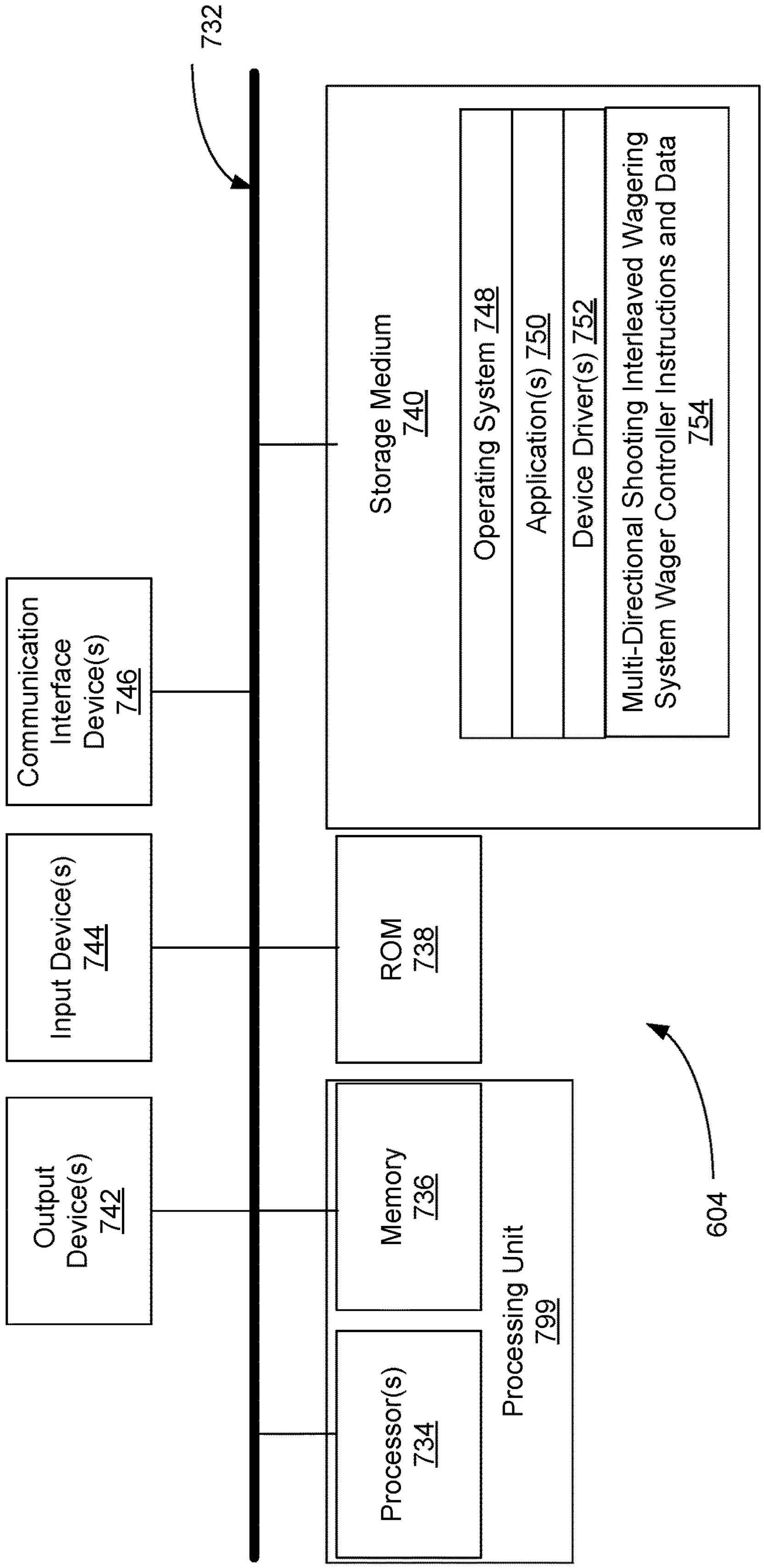

FIGS. 5A and 5B are diagrams of a structure of a wager controller of a multi-directional shooting interleaved wagering system in accordance with various embodiments of the invention. A wager controller may be constructed from or configured using one or more processing devices configured to perform the operations of the wager controller. In many embodiments, a wager controller can be constructed from or configured using various types of processing devices including, but not limited to, a mobile device such as a smartphone or the like, a personal digital assistant, a wireless device such as a tablet computer or the like, an electronic gaming machine, a personal computer, a gaming console, a set-top box, a computing device, a controller, or the like.

Referring now to FIG. 5A, in various embodiments, a wager controller 604, suitable for use as wager controller 102 of FIG. 1A, includes a random number generator (RNG) 620 to produce random results; one or more paytables 623 which includes a plurality of factors indexed by the random result to be multiplied with an amount of Cr, AC, interactive elements, or objects committed in a wager; and a wagering control module 622 whose processes may include, but are not limited to, generating random results, looking up factors in the paytables, multiplying the factors by an amount of Cr, AC, interactive elements, or objects wagered, and administering one or more Cr, AC, interactive element, or object meters 626. The various wager controller components can interface with each other via an internal bus 625 and/or other appropriate communication mechanism.

In some embodiments, an interface 628 allows the wager controller 604 to operatively connect to, and communicate with, an external device, such as one or more process controllers as described herein. The interface 628 provides for communication of wager execution commands 629 from the external device that is used to specify wager parameters and/or trigger execution of a wager by the wager controller 604 as described herein. The interface 628 may also provide for communicating wager outcome data 631 to an external device as described herein. In numerous embodiments, the interface 628 between the wager controller 604 and other systems/devices may be a wide area network (WAN) such as the Internet. However, other methods of communication may be used including, but not limited to, a local area network (LAN), a universal serial bus (USB) interface, and/or some other method by which two electronic devices could communicate with each other.

In various embodiments, an interface 630 allows the wager controller 604 to operatively connect to an external system or device, such as one or more credit processing systems, as described herein. The interface 630 provides for communication of incoming credit data 632 from the external system or device that is used to add credits to the one or more meters 626 as described herein. The interface 630 may also provide for communicating outgoing credit data 634 to an external system or device, such as a credit processing system, as described herein. In numerous embodiments, the interface 630 between the wager controller 604 and other systems/devices may be a wide area network (WAN) such as the Internet. However, other methods of communication may be used including, but not limited to, a local area network (LAN), a universal serial bus (USB) interface, and/or some other method by which two electronic devices or systems could communicate with each other.

In various embodiments, an interface 640 allows the wager controller 604 to operatively connect to an external system or device, such as one or more session/management controllers, as described herein. The interface 640 provides for communication of incoming session data 642 from the external system or device as described herein. The interface 640 may also provide for communicating outgoing session data 644 to an external system or device, such as a session/management controller, as described herein. In numerous embodiments, the interface 640 between the wager controller 604 and other systems/devices may be a wide area network (WAN) such as the Internet. However, other methods of communication may be used including, but not limited to, a local area network (LAN), a universal serial bus (USB) interface, and/or some other method by which two electronic devices or systems could communicate with each other.

In various embodiments, a wager controller 604 may use a random number generator provided by an external system. The external system may be connected to the wager controller 604 by a suitable communication network such as a local area network (LAN) or a wide area network (WAN). In some embodiments, the external random number generator is a central determination system that provides random results to one or more connected wager controllers.

During operation of the wager controller, the external system communicates wager execution commands 629 to the wager controller 604. The wager controller 604 receives the wager execution commands and uses the wager execution commands to trigger execution of a wager in accordance with a wagering proposition. The wager controller 604 executes the wager and determines a wager outcome for the wager. The wager controller communicates wager outcome data 631 of the wager outcome to the external system.

In some embodiments, the wager controller uses the wager execution commands to select a paytable 628 to use and/or an amount of Cr, AC, interactive elements, or objects to wager.

In some embodiments, the wager outcome data may include, but is not limited to, an amount of Cr, AC, interactive elements, or objects won in the wager.

In various embodiments, the wager outcome data may include, but is not limited to, an amount of Cr, AC, interactive elements, or objects in the one or more meters 626.

In some embodiments, the wager outcome data includes state data for the wagering proposition of the executed wager. The state data may correspond to one or more game states of a wagering proposition that is associated with the wagering proposition. Examples of state data include, but are not limited to, reel strips in an operation state or a final state for a reel-based wagering proposition, one or more dice positions for a dice-based wagering proposition, positions of a roulette wheel and roulette ball, position of a wheel of fortune, or the like.

In various embodiments, the wagering control module 622 determines an amount of a wager and a paytable to use from the one or more paytables 623. In such embodiments, in response to the wager execution commands triggering execution of the wager, the wager control module 622 executes the wager by requesting a random number generator result from the random number generator 620; retrieving a paytable from the one or more paytables 623; adjusting the one or more credit meters 626 for an amount of the wager; applying the random number generator result to the retrieved paytable; multiplying the resultant factor from the paytable by an amount wagered to determine a wager outcome; updating the one or more meters 626 based on the wager outcome; and communicating the wager outcome to the external device.

In various embodiments, an external system communicates a request for a random number generator result from the wager controller 604. In response, the wager controller 604 returns a random number generator result as a function of an internal random number generator or a random number generator external to the external system to which the wager controller 604 is operatively connected.

In some embodiments, a communication exchange between the wager controller 604 and an external system relate to the external system support for coupling a random number generator result to a particular paytable contained in the wager controller 604. In such an exchange, the external system communicates to the wager controller 604 as to which of the one or more paytables 623 to use, and requests a result whereby the random number generator result would be associated with the requested paytable 623. The result of the coupling is returned to the external system. In such an exchange, no actual Cr, AC, interactive element, or object wager is conducted, but might be useful in coupling certain non-value wagering interactive application behaviors and propositions to the same final resultant wagering return which is understood for the multi-directional shooting interleaved wagering system to conduct wagering.

In some embodiments, the wager controller 604 may also include storage for statuses, wagers, wager outcomes, meters and other historical events in a storage device 616.

In some embodiments, an authorization access module provides a process to permit access and command exchange with the wager controller 604 and access to the one or more credit meters 626 for the amount of Cr, AC, interactive elements, or objects being wagered by the user in the multi-directional shooting interleaved wagering system.

In numerous embodiments, communication occurs between various types of a wager controller and an external system 630, such as process controller. In some of these embodiments, the purpose of the wager controller is to allocate wagers to pools, detect occurrences of one or more events upon which the wagers were made, and determine the wager outcomes for each individual wager based on the number of winning wagers and the amount paid into the pool.

In some embodiments, the wager controller manages accounts for individual users wherein the users make deposits into the accounts, amounts are deducted from the accounts, and amounts are credited to the users' accounts based on the wager outcomes.

In some embodiments a wager controller is a pari-mutuel wagering system such as used for wagering on an events such as horse races, greyhound races, sporting events and the like. In a pari-mutuel wagering system, user's wagers on the outcome of an event are allocated to a pool. When the event occurs, wager outcomes are calculated by sharing the pool among all winning wagers.

In various embodiments, a wager controller is a central determination system, such as but not limited to a central determination system for a Class II wagering system or a wagering system in support of a "scratch off" style lottery. In such a wagering system, a user plays against other users and competes for a common prize. In a given set of wager outcomes, there are a certain number of wins and losses. Once a certain wager outcome has been determined, the same wager outcome cannot occur again until a new set of wager outcomes is generated.

In numerous embodiments, communication occurs between various components of a wager controller 604 and an external system, such as a process controller. In some of these embodiments, the purpose of the wager controller 604 is to manage wagering on wagering events and to provide random (or pseudo random) results from a random number generator.

Referring now to FIG. 5B, wager controller 604 includes a bus 732 that provides an interface for one or more processors 734, random access memory (RAM) 736, read only memory (ROM) 738, machine-readable storage medium 740, one or more user output devices 742, one or more user input devices 744, and one or more communication interface and/or network interface devices 746.

The one or more processors 734 may take many forms, such as, but not limited to, a central processing unit (CPU), a multi-processor unit (MPU), an ARM processor, a controller, a programmable logic device, or the like.

In the example embodiment, the one or more processors 734 and the random access memory (RAM) 736 form a wager controller processing unit 799. In some embodiments, the wager controller processing unit includes one or more processors operatively connected to one or more of a RAM, ROM, and machine-readable storage medium; the one or more processors of the wager controller processing unit receive instructions stored by the one or more of a RAM, ROM, and machine-readable storage medium via a bus; and the one or more processors execute the received instructions. In some embodiments, the wager controller processing unit is an ASIC (Application-Specific Integrated Circuit). In some embodiments, the wager controller processing unit is a SoC (System-on-Chip).

Examples of output devices 742 include, but are not limited to, display screens, light panels, and/or lighted displays. In accordance with particular embodiments, the one or more processors 734 are operatively connected to audio output devices such as, but not limited to speakers, and/or sound amplifiers. In accordance with many of these embodiments, the one or more processors 734 are operatively connected to tactile output devices like vibrators, and/or manipulators.

Examples of user input devices 734 include, but are not limited to, tactile devices including but not limited to, keyboards, keypads, touch screens, and/or trackballs; non-contact devices such as audio input devices; motion sensors and motion capture devices that the wager controller can use to receive inputs from a user when the user interacts with the wager controller 604.

The one or more communication interface and/or network interface devices 746 provide one or more wired or wireless interfaces for exchanging data and commands between the wager controller 604 and other devices that may be included in a multi-directional shooting interleaved wagering system. Such wired and wireless interfaces include, but are not limited to: a Universal Serial Bus (USB) interface; a Bluetooth interface; a Wi-Fi interface; an Ethernet interface; a Near Field Communication (NFC) interface; a plain old telephone system (POTS) interface; a cellular or satellite telephone network interface; and the like.

The machine-readable storage medium 740 stores machine-executable instructions for various components of a wager controller, such as but not limited to: an operating system 748; one or more application programs 750; one or more device drivers 752; and multi-directional shooting interleaved wagering system wager controller instructions and data 754 for use by the one or more processors 734 to provide the features of a multi-directional shooting interleaved wagering system wager controller as described herein.

In various embodiments, the machine-readable storage medium 740 is one of a (or a combination of two or more of) a hard drive, a flash drive, a DVD, a CD, a flash storage, a solid state drive, a ROM, an EIEPROM, and the like.

In operation, the machine-executable instructions are loaded into memory 736 from the machine-readable storage medium 740, the ROM 738 or any other storage location. The respective machine-executable instructions are accessed by the one or more processors 734 via the bus 732, and then executed by the one or more processors 734. Data used by the one or more processors 734 are also stored in memory 736, and the one or more processors 734 access such data during execution of the machine-executable instructions. Execution of the machine-executable instructions causes the one or more processors 734 to control the wager controller 604 to provide the features of a multi-directional shooting interleaved wagering system wager controller as described herein Although the wager controller 604 is described herein as being constructed from or configured using one or more processors and machine-executable instructions stored and executed by hardware components, the wager controller can be composed of only hardware components in accordance with other embodiments. In addition, although the storage medium 740 is described as being operatively connected to the one or more processors through a bus, those skilled in the art of processing devices will understand that the storage medium can include removable media such as, but not limited to, a USB memory device, an optical CD ROM, magnetic media such as tape and disks. In some embodiments, the storage medium 740 can be accessed by the one or more processors 734 through one of the interfaces or using a communication link. Furthermore, any of the user input devices or user output devices can be operatively connected to the one or more processors 734 vione of the interfaces or using a communication link.

In various embodiments, the wager controller 604 may be used to construct other components of a multi-directional shooting interleaved wagering system as described herein.

In some embodiments, components of a wager controller and a process controller of a multi-directional shooting interleaved wagering system may be constructed from or configured using a single device using processes that communicate using an interprocess communication protocol. In other such embodiments, the components of a wager controller and a process controller of a multi-directional shooting interleaved wagering system may communicate by passing messages, parameters or the like.

It should be understood that there may be many embodiments of a wager controller 604 which could be possible, including forms where many modules and components of the wager controller are located in various servers and locations, so the foregoing is not meant to be exhaustive or all inclusive, but rather provide data on various embodiments of a wager controller 604.

Figure 6A:
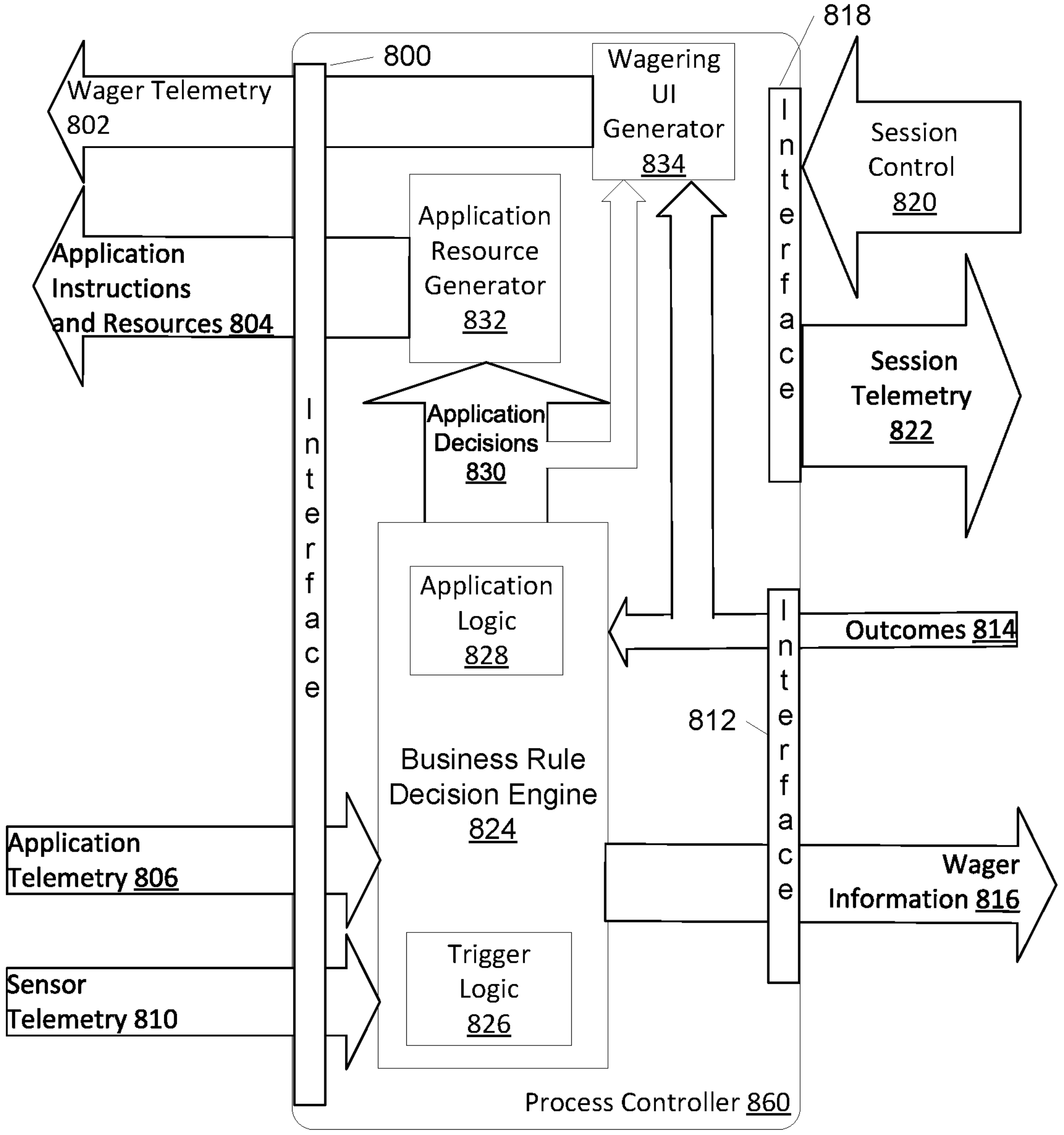
FIGS. 6A and 6B are diagrams of a structure of a process controller of a multi-directional shooting interleaved wagering system in accordance with various embodiments of the invention.
Figure 6B:
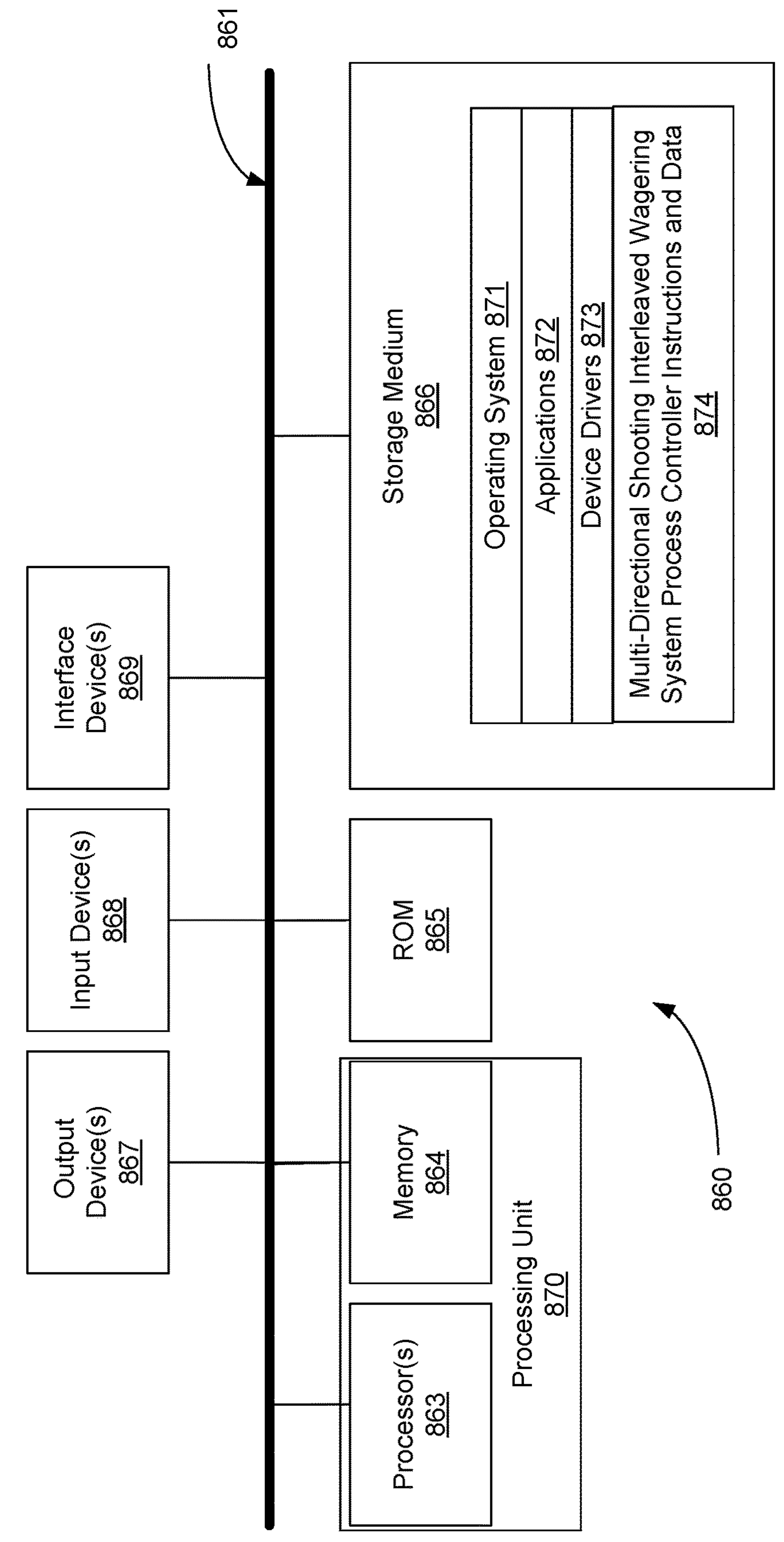

FIGS. 6A and 6B are diagrams of a structure of a process controller of a multi-directional shooting interleaved wagering system in accordance with various embodiments of the invention. A process controller may be constructed from or configured using one or more processing devices configured to perform the operations of the process controller. In many embodiments, a process controller can be constructed from or configured using various types of processing devices including, but not limited to, a mobile device such as a smartphone, a personal digital assistant, a wireless device such as a tablet computer or the like, an electronic gaming machine, a personal computer, a gaming console, a set-top box, a computing device, a controller, or the like.

Referring now to FIG. 6A, in many embodiments, a process controller 860, suitable for use as process controller 112 of FIG. 1A, manages operation of a multi-directional shooting interleaved wagering system, with a wager controller and an interactive processing device being support units to the process controller 860. The process controller 860 provides an interface between the interactive application, provided by an interactive processing device, and a wagering proposition, provided by a wager controller.

In some embodiments, the process controller 860 includes an interactive processing device interface 800 to an interactive processing device. The interactive processing device interface 800 provides for communication of data between an interactive processing device and the process controller 860, including but not limited to wager telemetry data 802, application instructions and resources 804, application telemetry data 806, and sensor telemetry data 810 as described herein.

In various embodiments, the process controller 860 includes a wager controller interface 812 to a wager controller. The wager controller interface 812 provides for communication of data between the process controller 860 and a wager controller, including but not limited to wager outcomes 814 and wager execution commands 816 as described in.

In some embodiments, the process controller 860 includes a session/management controller interface 818 to a session/management controller. The session/management controller interface 818 provides for communication of data between the process controller 860 and a session/management controller, including but not limited to session control data 820 and session telemetry data 822 as described herein.

The process controller 860 includes a rule-based decision engine 824 that receives telemetry data, such as application telemetry data and sensor telemetry data, from an interactive processing device. The rule-based decision engine 824 uses the telemetry data, along with wager logic 826 to generate wager execution commands used to trigger a wager in a wager controller.

In some embodiments, the application telemetry data includes, but is not limited to, application environment variables that indicate the state of an interactive application being used by a user, interactive processing device data indicating a state of an interactive processing device, and user actions and interactions between a user and an interactive application provided by an interactive processing device. The wagering and/or wager execution commands may include, but are not limited to, an amount and type of the wager, a trigger of the wager, and a selection of a paytable to be used when executing the wager.

In some embodiments, the rule-based decision engine 824 also receives wager outcome data from a wager controller. The decision engine 824 uses the wager outcome data, in conjunction with telemetry data and application logic 828 to generate application decisions 830 communicated to an application resource generator 832. The application resource generator 832 receives the application decisions and uses the application decisions to generate application commands and application resources to be communicated to an interactive application.

In many embodiments, the process controller 860 includes a pseudo random or random result generator used to generate random results that are communicated to the application resource generator 832. The application resource generator uses the random results to generate application commands and application resources to be communicated to an interactive processing device for use by an interactive application.

In various embodiments, the rule-based decision engine 824 also determines an amount of AC to award to a user based at least in part on the user's use of an interactive application of the multi-directional shooting interleaved wagering system as determined from application telemetry data. In some embodiments, wager outcome data may also be used to determine the amount of AC that should be awarded to the user.

In numerous embodiments, an interactive application is a skill-based interactive application and the AC is awarded to the user for the user's skillful play of the skill-based interactive application.

In some embodiments, the application decisions and wager outcome data are communicated to a wagering user interface generator 834. The wagering user interface generator 834 receives the application decisions and wager outcome data and generates wager telemetry data describing the state of wagering and credit accumulation and loss for the multi-directional shooting interleaved wagering system. In some embodiments, the wager telemetry data 146 may include, but is not limited to, amounts of AC and interactive elements earned, lost or accumulated by the user through use of the interactive application as determined from the application decisions, and Cr amounts won, lost or accumulated as determined from the wager outcome data and the one or more credit meters.

In some embodiments, the wager outcome data 814 also includes data about one or more game states of a wagering proposition executed in accordance with a wagering proposition by a wager controller. In various such embodiments, the wagering user interface generator 834 generates a wagering proposition process display and/or wagering proposition state display using the one or more game states of the wagering proposition. The wagering proposition process display and/or wagering proposition state display is included in wager telemetry data that is communicated to an interactive processing device. The wagering proposition process display and/or a wagering proposition state display is displayed by a wagering user interface of the interactive processing device to a user. In other such embodiments, the one or more game states of the wagering proposition are communicated to an interactive processing device and a wagering user interface of the interactive processing device generates a wagering proposition process display and/or wagering proposition state display using the one or more game states of the wagering proposition for display to a user.

The process controller 860 can further operatively connect to a wager controller to determine an amount of credit or interactive elements available and other wagering metrics of a wagering proposition. Thus, the process controller 860 may potentially affect an amount of Cr in play for participation in the wagering events of a wagering proposition provided by the wager controller. The process controller 860 may additionally include various audit logs and activity meters. In some embodiments, the process controller 860 can also couple to a centralized server for exchanging various data related to the user and the activities of the user during game play of a multi-directional shooting interleaved wagering system.

In some embodiments, the operation of the process controller 860 does not affect the provision of a wagering proposition by a wager controller except for user choice parameters that are allowable in accordance with the wagering proposition. Examples of user choice parameters include, but are not limited to: wager terms such as but not limited to a wager amount; speed of game play (for example, by pressing a button or pulling a handle of a slot machine); and/or agreement to wager into a bonus round.

In a number of embodiments, communication of wager execution commands between a wager controller and the process controller 860 can further be used to communicate various wagering control factors that the wager controller uses as input. Examples of wagering control factors include, but are not limited to, an amount of Cr, AC, interactive elements, or objects consumed per wagering event, and/or the user's election to enter a jackpot round.

In some embodiments, the process controller 860 utilizes a wagering user interface to communicate certain interactive application data to the user, including but not limited to, club points, user status, control of the selection of user choices, and messages which a user can find useful in order to adjust the interactive application experience or understand the wagering status of the user in accordance with the wagering proposition in the wager controller.

In some embodiments, the process controller 860 utilizes a wagering user interface to communicate aspects of a wagering proposition to the user including, but not limited to, odds of certain wager outcomes, amount of Cr, AC, interactive elements, or objects in play, and amounts of Cr, AC, interactive elements, or objects available.

In a number of embodiments, a wager controller can accept wager proposition factors including, but not limited to, modifications in the amount of Cr, AC, interactive elements, or objects wagered on each individual wagering event, a number of wagering events per minute the wager controller can resolve, entrance into a bonus round, and other factors. In several embodiments, the process controller 860 can communicate a number of factors back and forth to the wager controller, such that an increase/decrease in a wagered amount can be related to the change in user profile of the user in the interactive application. In this manner, a user can control a wager amount per wagering event in accordance with the wagering proposition with the change mapping to a parameter or component that is applicable to the interactive application experience.

Referring now to FIG. 6B, process controller 860 includes a bus 861 providing an interface for one or more processors 863, random access memory (RAM) 864, read only memory (ROM) 865, machine-readable storage medium 866, one or more user output devices 867, one or more user input devices 868, and one or more communication interface and/or network interface devices 869.

The one or more processors 863 may take many forms, such as, but not limited to: a central processing unit (CPU); a multi-processor unit (MPU); an ARM processor; a programmable logic device; or the like.

Examples of output devices 867 include, include, but are not limited to: display screens; light panels; and/or lighted displays. In accordance with particular embodiments, the one or more processors 863 are operatively connected to audio output devices such as, but not limited to: speakers; and/or sound amplifiers. In accordance with many of these embodiments, the one or more processors 863 are operatively connected to tactile output devices like vibrators, and/or manipulators.

In the example embodiment, the one or more processors 863 and the random access memory (RAM) 864 form a process controller processing unit 870. In some embodiments, the process controller processing unit includes one or more processors operatively connected to one or more of a RAM, ROM, and machine-readable storage medium; the one or more processors of the process controller processing unit receive instructions stored by the one or more of a RAM, ROM, and machine-readable storage medium via a bus; and the one or more processors execute the received instructions. In some embodiments, the process controller processing unit is an ASIC (Application-Specific Integrated Circuit). In some embodiments, the process controller processing unit is a SoC (System-on-Chip).

Examples of user input devices 868 include, but are not limited to: tactile devices including but not limited to, keyboards, keypads, foot pads, touch screens, and/or trackballs; non-contact devices such as audio input devices; motion sensors and motion capture devices that the process controller can use to receive inputs from a user when the user interacts with the process controller 860.

The one or more communication interface and/or network interface devices 869 provide one or more wired or wireless interfaces for exchanging data and commands between the process controller 860 and other devices that may be included in a multi-directional shooting interleaved wagering system. Such wired and wireless interfaces include, but are not limited to: a Universal Serial Bus (USB) interface; a Bluetooth interface; a Wi-Fi interface; an Ethernet interface; a Near Field Communication (NFC) interface; a plain old telephone system (POTS), cellular, or satellite telephone network interface; and the like.

The machine-readable storage medium 866 stores machine-executable instructions for various components of the process controller 860 such as, but not limited to: an operating system 871; one or more applications 872; one or more device drivers 873; and multi-directional shooting interleaved wagering system process controller instructions and data 874 for use by the one or more processors 863 to provide the features of a process controller as described herein.

In various embodiments, the machine-readable storage medium 870 is one of a (or a combination of two or more of) a hard drive, a flash drive, a DVD, a CD, a flash storage, a solid state drive, a ROM, an EIEPROM, and the like.

In operation, the machine-executable instructions are loaded into memory 864 from the machine-readable storage medium 866, the ROM 865 or any other storage location. The respective machine-executable instructions are accessed by the one or more processors 863 via the bus 861, and then executed by the one or more processors 863. Data used by the one or more processors 863 are also stored in memory 864, and the one or more processors 863 access such data during execution of the machine-executable instructions. Execution of the machine-executable instructions causes the one or more processors 863 to control the process controller 860 to provide the features of a multi-directional shooting interleaved wagering system process controller as described herein.

Although the process controller 860 is described herein as being constructed from or configured using one or more processors and instructions stored and executed by hardware components, the process controller can be composed of only hardware components in accordance with other embodiments. In addition, although the storage medium 866 is described as being operatively connected to the one or more processors through a bus, those skilled in the art of process controllers will understand that the storage medium can include removable media such as, but not limited to, a USB memory device, an optical CD ROM, magnetic media such as tape and disks. Also, in some embodiments, the storage medium 866 may be accessed by processor 863 through one of the interfaces or using a communication link. Furthermore, any of the user input devices or user output devices may be operatively connected to the one or more processors 863 vione of the interfaces or using a communication link.

In various embodiments, the process controller 860 may be used to construct other components of a multi-directional shooting interleaved wagering system as described herein.

In some embodiments, components of an interactive processing device and a process controller of a multi-directional shooting interleaved wagering system may be constructed from or configured using a single device using processes that communicate using an interprocess communication protocol. In other such embodiments, the components of an interactive processing device and a process controller of a multi-directional shooting interleaved wagering system may communicate by passing messages, parameters or the like.

Figure 7A:
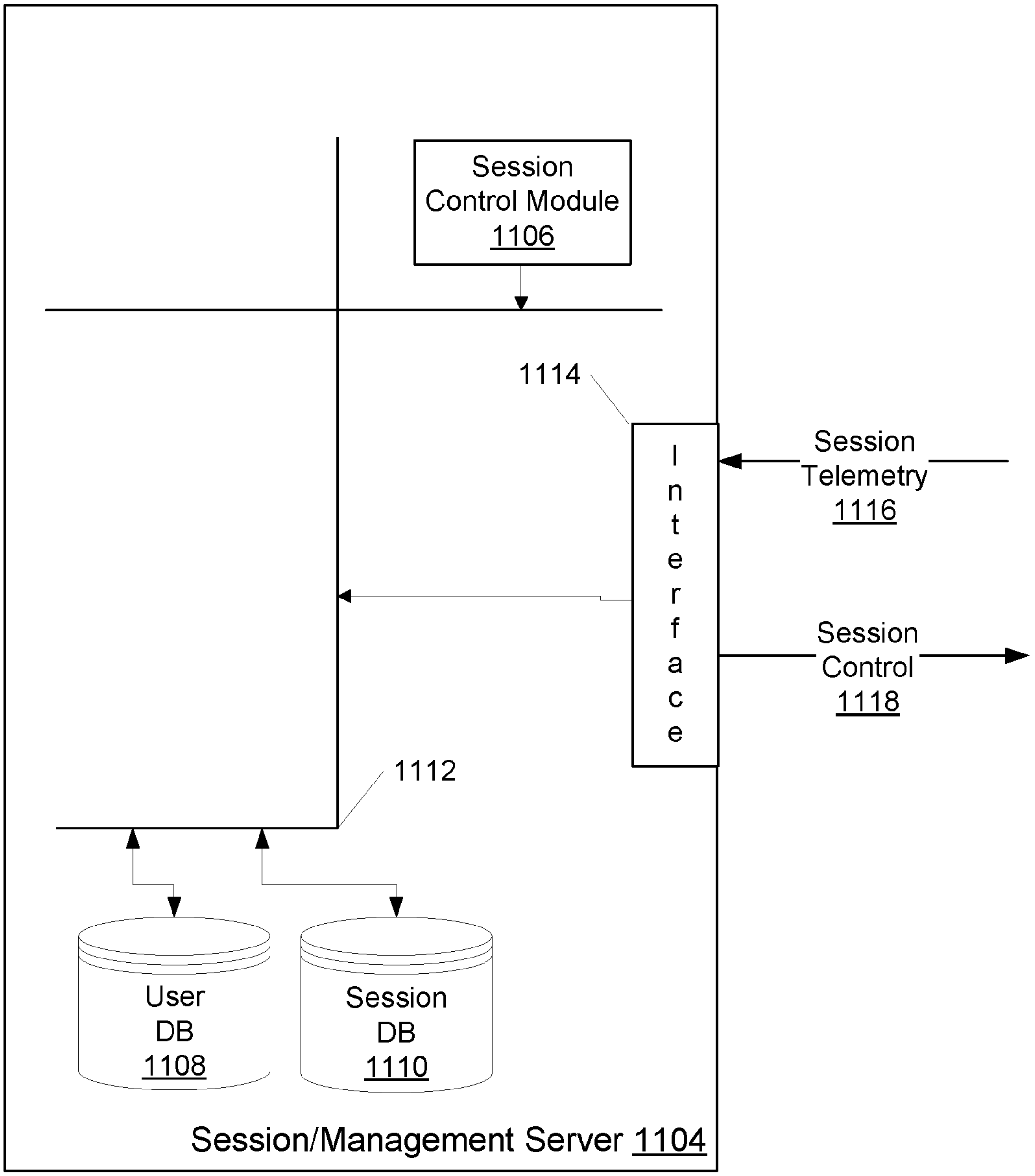
FIGS. 7A and 7B are diagrams of a structure of a session/management controller of a multi-directional shooting interleaved wagering system in accordance with various embodiments of the invention.
Figure 7B:
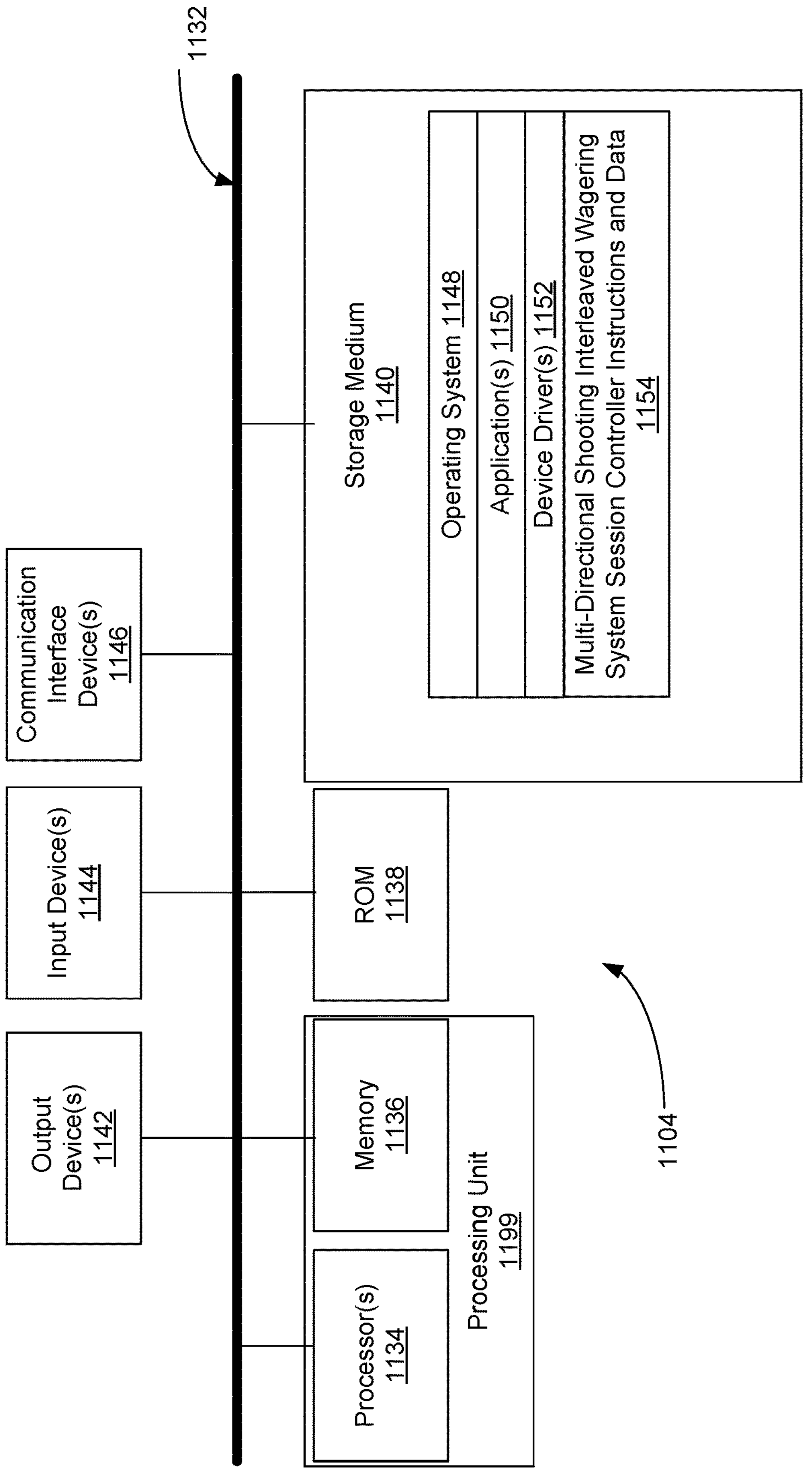

FIGS. 7A and 7B are diagrams of a structure of a session/management controller of a multi-directional shooting interleaved wagering system in accordance with various embodiments of the invention. A session/management controller may be constructed from or configured using one or more processing devices configured to perform the operations of the session/management controller. In many embodiments, a wager session can be constructed from or configured using various types of processing devices including, but not limited to, a mobile device such as a smartphone or the like, a personal digital assistant, a wireless device such as a tablet computer or the like, an electronic gaming machine, a personal computer, a gaming console, a set-top box, a computing device, a controller, a server, or the like.

Referring now to FIG. 7A, in various embodiments, a session/management controller 1104, suitable for use as session/management controller 150 of FIG. 1A, includes a user management and session control module 1106 whose processes may include, but are not limited to, registering users of a multi-directional shooting interleaved wagering system, validating users of a multi-directional shooting interleaved wagering system using user registration data, managing various types of sessions for users of the multi-directional shooting interleaved wagering system, and the like.

The session/management controller 1104 may further include a datastore 1108 storing user data used to manage user registration and validation. The session/management controller 1104 may further include a datastore 1110 storing session data used to manage one or more sessions.

The various session/management controller components can interface with each other via an internal bus 1112 and/or other appropriate communication mechanism.

An interface 1114 allows the session/management controller 1104 to operatively connect to one or more external devices, such as one or more process controllers, wager controllers and/or interactive processing devices as described herein. The interface provides for receiving session telemetry data 1116 from the one more external devices as described herein. The session telemetry data includes, but is not limited to, amounts of AC earned by one or more users, requests for entering into a session as described herein, and telemetry data regarding the progress of one or more users during a session. The interface 1114 may also provide for communicating secession control data 1118 used to manage a session as described herein.

In numerous embodiments, the interface between the session/management controller and other systems/devices may be a wide area network (WAN) such as the Internet. However, other methods of communication may be used including, but not limited to, a local area network (LAN), a universal serial bus (USB) interface, and/or some other method by which two electronic devices could communicate with each other.

During operation of the session/management controller, the external system communicates session telemetry data to the session/management controller. The session/management controller receives the session telemetry data and uses the session telemetry data to generate session control data as described herein. The session/management controller communicates the session control data to the external system.

Referring now to FIG. 7B, session/management controller 1104 includes a bus 1132 that provides an interface for one or more processors 1134, random access memory (RAM) 1136, read only memory (ROM) 1138, machine-readable storage medium 1140, one or more user output devices 1142, one or more user input devices 1144, and one or more communication interface and/or network interface devices 1146.

The one or more processors 1134 may take many forms, such as, but not limited to, a central processing unit (CPU), a multi-processor unit (MPU), an ARM processor, a controller, a programmable logic device, or the like.

In the example embodiment, the one or more processors 1134 and the random access memory (RAM) 1136 form a session/management controller processing unit 1199. In some embodiments, the session/management controller processing unit includes one or more processors operatively connected to one or more of a RAM, ROM, and machine-readable storage medium; the one or more processors of the session/management controller processing unit receive instructions stored by the one or more of a RAM, ROM, and machine-readable storage medium via a bus; and the one or more processors execute the received instructions. In some embodiments, the session/management controller processing unit is an ASIC (Application-Specific Integrated Circuit). In some embodiments, the session/management controller processing unit is a SoC (System-on-Chip).

Examples of output devices 1142 include, but are not limited to, display screens, light panels, and/or lighted displays. In accordance with particular embodiments, the one or more processors 1134 are operatively connected to audio output devices such as, but not limited to speakers, and/or sound amplifiers. In accordance with many of these embodiments, the one or more processors 1134 are operatively connected to tactile output devices like vibrators, and/or manipulators.

Examples of user input devices 1144 include, but are not limited to, tactile devices including but not limited to, keyboards, keypads, touch screens, and/or trackballs; non-contact devices such as audio input devices; motion sensors and motion capture devices that the session/management controller can use to receive inputs from a user when the user interacts with the session/management controller 1104.

The one or more communication interface and/or network interface devices 1146 provide one or more wired or wireless interfaces for exchanging data and commands between the session/management controller 1104 and other devices that may be included in a multi-directional shooting interleaved wagering system. Such wired and wireless interfaces include, but are not limited to: a Universal Serial Bus (USB) interface; a Bluetooth interface; a Wi-Fi interface; an Ethernet interface; a Near Field Communication (NFC) interface; a plain old telephone system (POTS) interface; a cellular or satellite telephone network interface; and the like.

The machine-readable storage medium 1140 stores machine-executable instructions for various components of a session/management controller, such as but not limited to: an operating system 1148; one or more application programs 1150; one or more device drivers 1152; and multi-directional shooting interleaved wagering system session/management controller instructions and data 1154 for use by the one or more processors 1134 to provide the features of a multi-directional shooting interleaved wagering system session/management controller as described herein.

In various embodiments, the machine-readable storage medium 1140 is one of a (or a combination of two or more of) a hard drive, a flash drive, a DVD, a CD, a flash storage, a solid state drive, a ROM, an EIEPROM, and the like.

In operation, the machine-executable instructions are loaded into memory 736 from the machine-readable storage medium 1140, the ROM 1138 or any other storage location. The respective machine-executable instructions are accessed by the one or more processors 1134 via the bus 1132, and then executed by the one or more processors 1134. Data used by the one or more processors 1134 are also stored in memory 1136, and the one or more processors 1134 access such data during execution of the machine-executable instructions. Execution of the machine-executable instructions causes the one or more processors 1134 to control the session/management controller 1104 to provide the features of a multi-directional shooting interleaved wagering system session/management controller as described herein Although the session/management controller 1104 is described herein as being constructed from or configured using one or more processors and machine-executable instructions stored and executed by hardware components, the session/management controller can be composed of only hardware components in accordance with other embodiments. In addition, although the storage medium 1140 is described as being operatively connected to the one or more processors through a bus, those skilled in the art of processing devices will understand that the storage medium can include removable media such as, but not limited to, a USB memory device, an optical CD ROM, magnetic media such as tape and disks. In some embodiments, the storage medium 1140 can be accessed by the one or more processors 1134 through one of the interfaces or using a communication link. Furthermore, any of the user input devices or user output devices can be operatively connected to the one or more processors 1134 vione of the interfaces or using a communication link.

In various embodiments, the session/management controller 1104 may be used to construct other components of a multi-directional shooting interleaved wagering system as described herein.

In some embodiments, components of a session/management controller and a process controller of a multi-directional shooting interleaved wagering system may be constructed from or configured using a single device using processes that communicate using an interprocess communication protocol. In other such embodiments, the components of a session/management controller and a process controller of a multi-directional shooting interleaved wagering system may communicate by passing messages, parameters or the like.

In some embodiments, components of a session/management controller and a wager controller of a multi-directional shooting interleaved wagering system may be constructed from or configured using a single device using processes that communicate using an interprocess communication protocol. In other such embodiments, the components of a session/management controller and a process controller of a multi-directional shooting interleaved wagering system may communicate by passing messages, parameters or the like.

It should be understood that there may be many embodiments of a session/management controller 1104 which could be possible, including forms where many modules and components of the session/management controller are located in various servers and locations, so the foregoing is not meant to be exhaustive or all inclusive, but rather provide data on various embodiments of a session/management controller 1104.

In numerous embodiments, any of a wager controller, a process controller, an interactive processing device, or a session/management controller as described herein can be constructed from or configured using multiple processing devices, whether dedicated, shared, or distributed in any combination thereof, or can be constructed from or configured using a single processing device. In addition, while certain aspects and features of multi-directional shooting interleaved wagering system processes described herein have been attributed to a wager controller, a process controller, an interactive processing device, or a session/management controller, these aspects and features can be provided in a distributed form where any of the features or aspects can be provided by any of a session/management controller, a wager controller, a process controller, and/or an interactive processing device within a multi-directional shooting interleaved wagering system without deviating from the spirit of the invention.

Although various components of multi-directional shooting interleaved wagering systems are discussed herein, multi-directional shooting interleaved wagering systems can be configured with any component as appropriate to the specification of a specific application in accordance with embodiments of the invention. In certain embodiments, components of a multi-directional shooting interleaved wagering system, such as a session/management controller, a process controller, a wager controller, and/or an interactive processing device, can be configured in different ways for a specific multi-directional shooting interleaved wagering system.

In some embodiments, components of a session/management controller, an interactive processing device, a process controller, and/or a wager controller of a multi-directional shooting interleaved wagering system may be constructed from or configured using a single device using processes that communicate using an interprocess communication protocol. In many embodiments, the components of a session/management controller, an interactive processing device, a process controller and a wager controller of a multi-directional shooting interleaved wagering system may communicate by passing messages, parameters or the like.

In addition, while certain aspects and features of multi-directional shooting interleaved wagering system processes described herein have been attributed to a session/management controller, a wager controller, a process controller, or an interactive processing device, these aspects and features can be provided in a distributed form where any of the features or aspects can be provided by any of a session/management controller, a wager controller, a process controller, and/or an interactive processing device within a multi-directional shooting interleaved wagering system.

Operation of Multi-Directional Shooting Interleaved Wagering Systems

Figure 8A:
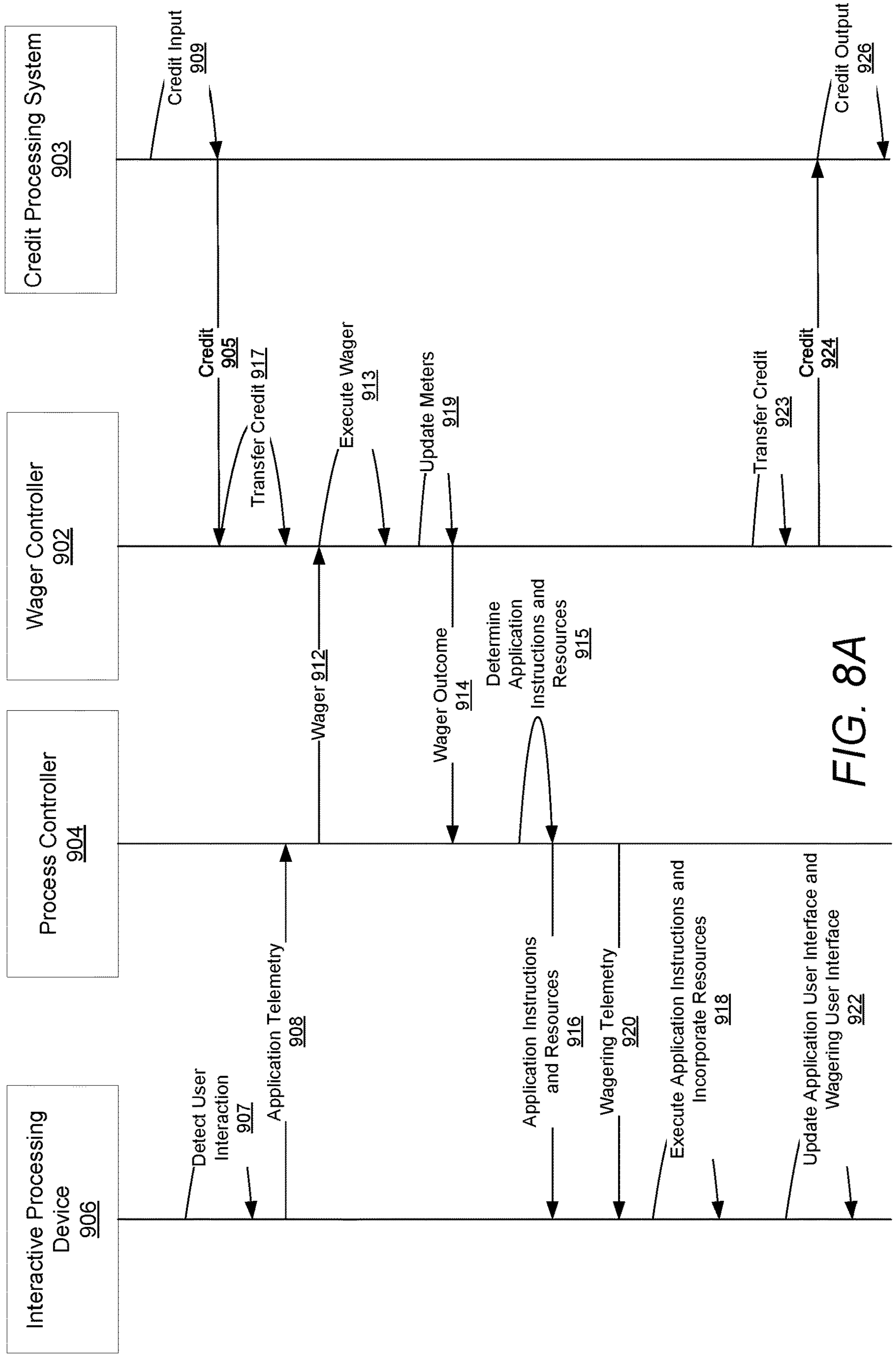
FIG. 8A is a sequence diagram of interactions between components of a multi-directional shooting interleaved wagering system in accordance with various embodiments of the invention.

FIG. 8A is a sequence diagram of interactions between components of a multi-directional shooting interleaved wagering system for a wagering session in accordance with various embodiments of the invention. The components of the multi-directional shooting interleaved wagering system include a wager controller 902, such as wager controller 102 of FIG. 1A, a process controller 904, such as process controller 112 of FIG. 1A, an interactive processing device 906, such as interactive processing device 120 of FIG. 1A, and a credit processing system 903, such as credit processing system 198 of FIG. 1A. At a beginning of the wagering session, the process includes a credit input 909 to the multi-directional shooting interleaved wagering system with wager controller 902 communicating with the credit processing system 903 to receive incoming credit data 905. The wager controller 902 uses the incoming credit data to transfer 917 credits onto one or more credit meters associated with one or more users of the multi-directional shooting interleaved wagering system, thus transferring credits into the multi-directional shooting interleaved wagering system and on to the one or more credit meters. The interactive processing device 906 detects a user performing a user interaction in an application interface of an interactive application provided by the interactive processing device 906. The interactive processing device 906 communicates application telemetry data 908 to the process controller 904. The application telemetry data includes, but is not limited to, the user interaction detected by the interactive processing device 906.

The process controller 904 receives the application telemetry data 908. Upon determination by the process controller 904 that the user interaction indicates a wagering event, the process controller 904 generates wager execution commands including a wager request 912 that the process controller 904 uses to command the wager controller 902 to execute a wager. The request for a wager event may include wager terms associated with a wagering proposition. The process controller 904 communicates the wager execution commands to the wager controller 902.

The wager controller 902 receives the wager execution commands 912 and uses the wager execution commands to execute 913 a wager in accordance with a wagering proposition. The wager controller 902 updates 919 the one or more credit meters associated with the one or more users based on a wager outcome of the executed wagers. The wager controller 902 communicates data of the wager outcome 914 of the executed wager to the process controller 904.

The process controller 904 receives the wager outcome and generates 915 interactive application instruction and resource data 916 for the interactive application. The process controller 904 uses the interactive application instruction and resource data 916 to command the interactive processing device. The process controller communicates the interactive application instruction and resource data 916 to the interactive processing device 906. The process controller also communicates wagering telemetry data 920 including the wager outcome to the interactive processing device 906.

The interactive processing device 906 receives the interactive application instruction and resource data 916 and wagering telemetry data 918. The interactive processing device 906 incorporates the received interactive application resources and executes the received interactive application commands 918. The interactive processing device updates 922 an application interface of the interactive application provided by the interactive processing device using the interactive application commands and the resources, and updates 922 a wagering user interface using the wagering telemetry data.

Upon determining that the wagering session is completed, such as by receiving a cashout communication from one or more users of the multi-directional shooting interleaved wagering system, the wager controller 902 transfers 923 credits off of the one or more credit meters, generates outgoing credit data 924 on the basis of the credits transferred off of the one or more credit meters, and communicates the outgoing credit data 924 to the credit processing system 903. The credit processing system receives the outgoing credit data 924 and generates 924 a credit output as described herein, thus transferring credits off of the one or more credit meters and out of the multi-directional shooting interleaved wagering system.

Figure 8B:
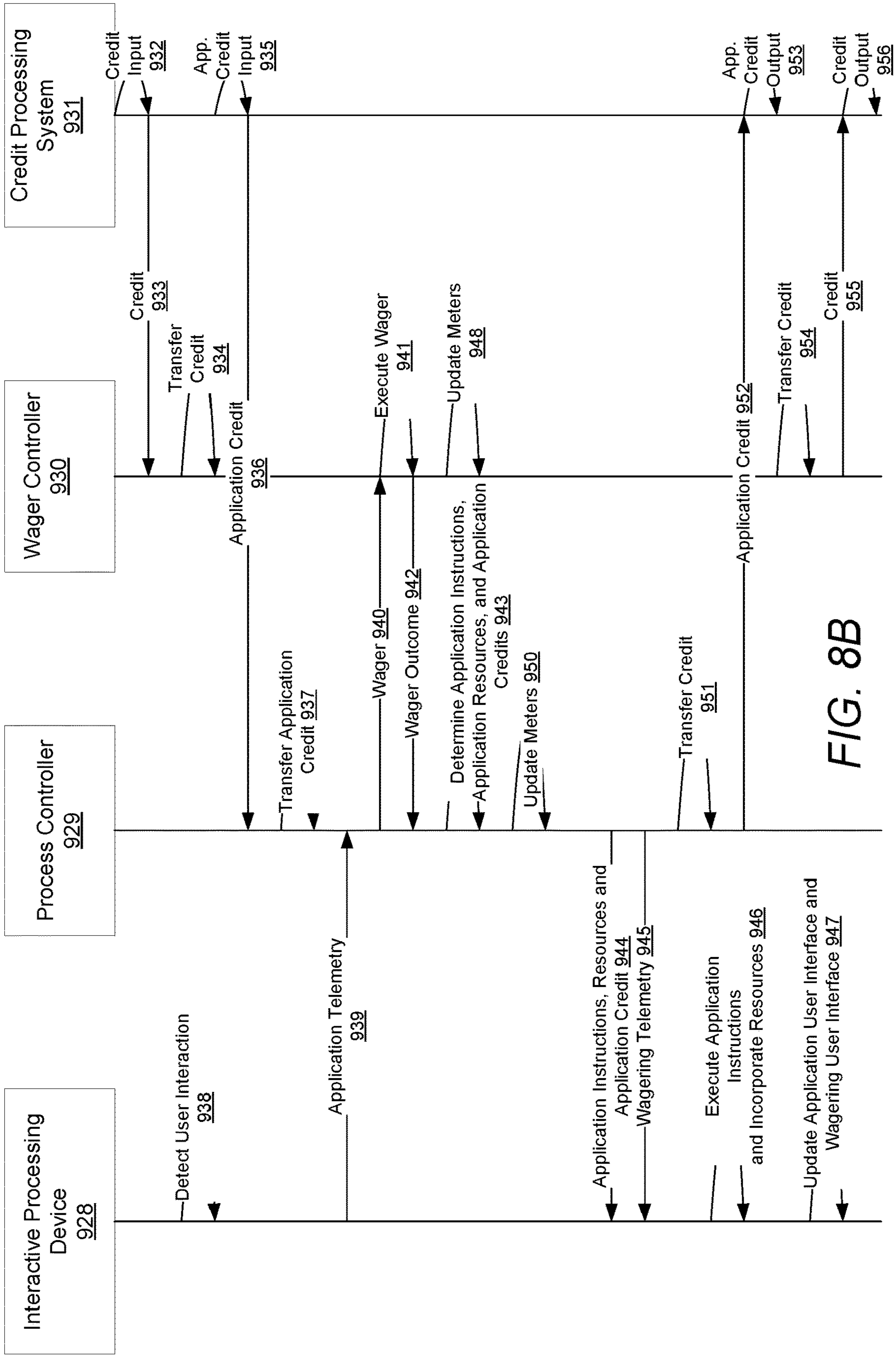
FIG. 8B is a sequence diagram of interactions between components of a multi-directional shooting interleaved wagering system in accordance with various embodiments of the invention.

FIG. 8B is a sequence diagram of interactions between components of a multi-directional shooting interleaved wagering system for a wagering session in accordance with various embodiments of the invention.

The components of the multi-directional shooting interleaved wagering system include a wager controller 930, such as wager controller 102 of FIG. 1A, a process controller 929, such as process controller 112 of FIG. 1A, an interactive processing device 928, such as interactive processing device 120 of FIG. 1A, and a credit processing system 931, such as credit processing system 198 of FIG. 1A. At a beginning of the wagering session, the process includes a credit input 932 to the multi-directional shooting interleaved wagering system with wager controller 930 communicating with the credit processing system 931 to receive incoming credit data 933. The process controller 929 receives an application credit input 932 to the multi-directional shooting interleaved wagering system with process controller 929 communicating with the credit processing system 931 to receive incoming application credit data 936.

The wager controller 930 uses the incoming credit data 933 to transfer 934 credits onto one or more credit meters associated with one or more users of the multi-directional shooting interleaved wagering system, thus transferring credits into the multi-directional shooting interleaved wagering system and on to the one or more credit meters. The process controller 929 uses the incoming application credit data 936 to transfer 937 credits onto one or more application credit meters associated with the one or more users of the multi-directional shooting interleaved wagering system, thus transferring application credits into the multi-directional shooting interleaved wagering system and on to the one or more application credit meters.

The interactive processing device 928 detects 938 a user performing a user interaction in an application interface of an interactive application provided by the interactive processing device 928. The interactive processing device 928 communicates application telemetry data 939 to the process controller 929. The application telemetry data includes, but is not limited to, data of the user interaction detected by the interactive processing device 928.

The process controller 929 receives the application telemetry data 939. The process controller 929 determines, based on the application telemetry data 939 whether or not the user interaction indicates a wager event. Upon determination by the process controller 929 that the user interaction indicates a wagering event, the process controller 929 generates wager execution command data 940 including a wager request that the process controller 929 uses to command the wager controller 930 to execute a wager. The request for a wager event may include wager terms associated with a wagering proposition. The process controller 929 communicates the wager execution command data 940 to the wager controller 930.

The wager controller 930 receives the wager execution command data 940 and uses the wager execution commands to execute 941 a wager in accordance with a wagering proposition. The wager controller 930 updates 948 the one or more credit meters associated with the one or more users based on a wager outcome of the executed wagers. The wager controller 930 communicates data of the wager outcome 942 of the executed wager to the process controller 929.

The process controller 929 receives the wager outcome data 942 and generates 943 interactive application instruction data, interactive application resource data, and application credit data 944 for the interactive application based in part on the wager outcome data and the application telemetry data. The process controller 929 uses the application credit data to update 950 the one or more application credit meters. The process controller 929 uses the interactive application instruction data and interactive application resource data 944 to command the interactive processing device 928. The process controller communicates the interactive application instruction data, interactive application resource data, and application credit data to the interactive processing device 928. The process controller communicates wagering telemetry data 945 including the wager outcome data 942 to the interactive processing device 928.

The interactive processing device 928 receives the interactive application instruction data, interactive application resource data, application credit data 944 and the wagering telemetry data 945. The interactive processing device 928 incorporates the received interactive application resources and executes the received interactive application commands 918. The interactive processing device updates 947 a user interface of the interactive application provided by the interactive processing device 928 using the interactive application command data, the interactive application resource data, and the application credit data, and updates a wagering user interface of the interactive processing device 928 using the wagering telemetry data 945.

Upon determining that the wagering session is completed, such as by receiving a cashout communication from one or more users of the multi-directional shooting interleaved wagering system, the process controller 929 transfers 951 application credits off of the one or more application credit meters, generates outgoing application credit data 952 on the basis of the application credits transferred off of the one or more application credit meters, and communicates the outgoing application credit data 924 to the credit processing system 931. The credit processing system receives the outgoing application credit data 931 and generates 953 a credit output for the application credits as described herein, thus transferring application credits off of the one or more application credit meters and out of the multi-directional shooting interleaved wagering system. The wager controller 930 transfers 954 credits off of the one or more credit meters, generates outgoing credit data 955 on the basis of the credits transferred off of the one or more credit meters, and communicates the outgoing credit data 955 to the credit processing system 931. The credit processing system 931 receives the outgoing credit data 955 and generates 956 a credit output as described herein, thus transferring credits off of the one or more credit meters and out of the multi-directional shooting interleaved wagering system.

Figure 9:
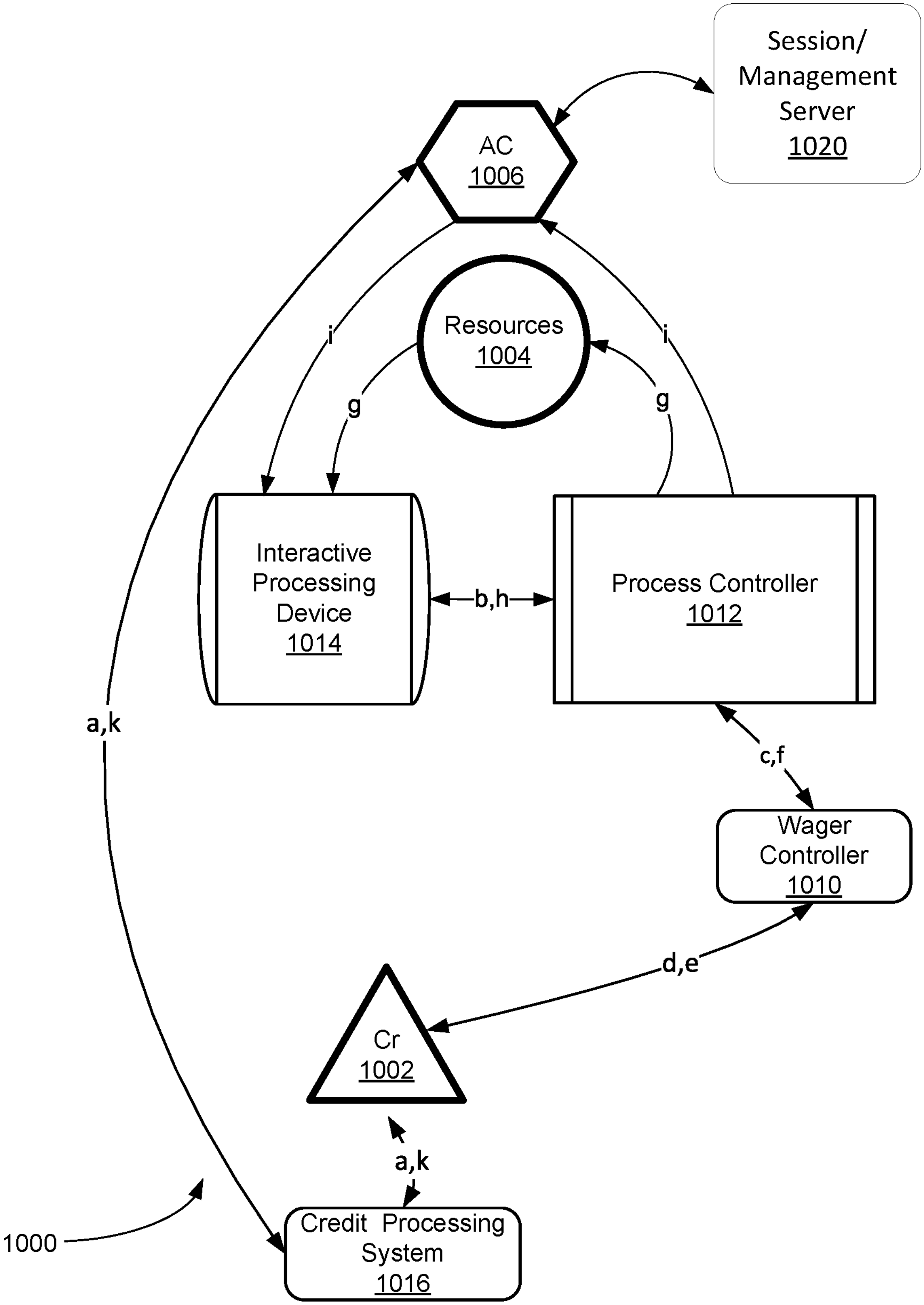
FIG. 9 is a collaboration diagram for components of a multi-directional shooting interleaved wagering system in accordance with various embodiments of the invention.

FIG. 9 is a collaboration diagram that illustrates how resources such as application credits (AC), credits (Cr), interactive elements, and objects are utilized in a multi-directional shooting interleaved wagering system in accordance with various embodiments of the invention. In several embodiments, a user can interact with a multi-directional shooting interleaved wagering system by using Cr for wagering in accordance with a wagering proposition along with AC and interactive elements in interactions with an interactive application. Wagering can be executed by a wager controller while an interactive application can be executed by an interactive processing device and managed with a process controller. The collaboration diagram 1000 illustrates that Cr 1002, interactive application resources including interactive elements and objects 1004 and AC 1006 can be utilized by a user 1008 in interactions with a wager controller 1010, such as wager controller 102 of FIG. 1A, a process controller 1012, such as wager controller 112 of FIG. 1, and an interactive processing device 1014, such as interactive processing device 120 of FIG. 1A, of a multi-directional shooting interleaved wagering system. The contribution of interactive elements and objects such as included in resources 1004, can be linked to a user's access to credits, such as Cr 1002 and/or AC 1006. Electronic receipt of these credits can come via a smart card, voucher or other portable media, or as received using a communication link from a server. In some embodiments, these credits can be drawn on demand from a user profile located in a database locally on a multi-directional shooting interleaved wagering system or in a remote server.

A user's actions and/or decisions can affect an interactive application of interactive processing device 1014 that consume and/or accumulate AC 1004 and/or resources 1004 in an interactive application executed by an interactive processing device 1014, a wager controller 101 and a process controller 1012. The process controller 1012 can monitor the activities taking place within an interactive application executed by an interactive processing device 1014 for wagering event occurrences. The process controller 1012 can also communicate the wagering event occurrences to the wager controller 1010 that triggers a wager of Cr 1002 in accordance with a wagering proposition executed by the wager controller 1010.

In several embodiments, the user commences interaction with the multi-directional shooting interleaved wagering system by contributing credit to a multi-directional shooting interleaved wagering system such as, but not limited to, Cr 1002 that may be credit in a real currency or may be credit in a virtual currency that is not fungible with a real currency, AC 1006 that may be application environment credits, and specified types of interactive application interactive elements and/or objects 1004. One or more of these contributions may be provided directly as currency and/or transferred in electronically. Electronic transfer may come via a smart card, voucher or other portable media, or as transferred in using a communication link from a user data server or multi-directional shooting interleaved wagering system session/management controller. In many embodiments, contributions may be drawn on demand from user accounts located in servers residing on the network or in the cloud on a real time basis as the credits, interactive elements and/or object are committed or consumed by the multi-directional shooting interleaved wagering system. Generally, Cr is utilized and accounted for by the wager controller 1010; and the resources 1004 and AC 1006 are utilized and accounted for by the process controller 1012 and/or the interactive processing device 1014.

The multi-directional shooting interleaved wagering system receives (a) credits Cr 1002 from credit processing system 1016. In some embodiments, the credit processing system 1016 also provides AC 1006 to the multi-directional shooting interleaved wagering system. The user interacts with an interactive application provided by the interactive processing device 1014 with the interaction representing an action by the user within the context of the interactive application. The interactive processing device 1014 receives the user interaction and communicates (b) the interaction to the process controller 1012. The process controller 1012 receives the interaction and determines from the interaction whether or not a wager should be triggered. If a wager should be triggered, the process controller 1012 commands (c) the wager controller 1010 to execute a wager in accordance with a wagering proposition associated with the interaction and thereby triggers a wager. The wager controller receives the wager execution commands and executes the wager in accordance with the wagering proposition, and consumes (d) an appropriate amount of Cr 1002 for the wager. The wager controller 1010 adjusts (e) the Cr 1002 based upon a wager outcome of the wager and communicates (f) the wager outcome to the process controller 1012 as to the outcome of the wager triggered by the process controller 1012. The process controller 1012 receives the wager outcome. The process controller determines what resources 1004 should be provided to the interactive processing device, generates the resources 1004 and application commands and commands (g) the interactive processing device 1014 using the resources 1004 and application commands. The interactive processing device receives the resources 1004 and application commands from the process controller 1012 and integrates them into the execution of the interactive application provided by the interactive processing device 1014.

In some embodiments, the process controller 1012 communicates (h) data about the wager outcome to the interactive processing device. The interactive processing device receives the wager outcome and displays the wager outcome to the user 1008.

In some embodiments, the process controller 1012 determines what resources and commands to provide to the interactive processing device 1014 for use by the interactive application provided by the interactive processing device 1014 partially on the basis of the wager outcome. In some such embodiments, resources are provided in a case that the wager was a winning wager for the user. In other such embodiments, fewer or no resources are provided in a case of a losing wager.

In some embodiments, the process controller 1012 determines what resources to provide based on internal logic of the process controller 1012. In some such embodiments, the process controller 1012 employs a random result generator, such as a random number generator, to generate a random result and the random result is used to determine what resources are provided to the interactive processing device 1014.

In several embodiments, the process controller 1012 determines an increment or a decrement of an amount of AC 1006 using the interactions received from the interactive processing device. The increment or decremented amount is communicated (i) to the interactive processing device for display to the user.

In some embodiments, the process controller 1012 executes a wager of Cr as a virtual currency, AC, interactive elements or objects. In some such embodiments, the process controller 1012 employs a random result generator, such as a random number generator, to generate a random result and the random result is used to determine a wager outcome in Cr as a virtual currency, AC, interactive elements or objects.

The following is description of an embodiment of the described collaboration where an interactive application provided by an interactive processing device of a multi-directional shooting interleaved wagering system is a first person shooter game. The process begins by a user selecting a machine gun to use in the game and then fires a burst of bullets at an opponent. The interactive processing device can communicate to the process controller of the user's choice of weapon, that a burst of bullets was fired, and/or the outcome of the burst. The process controller communicates to the wager controller that 3 credits (Cr) are to be wagered on the outcome of a wagering event to match the three bullets consumed. The wager controller then performs the wagering event and determines the result of the wager and may determine the winnings from a paytable. The wager controller consumes 3 credits of Cr for the wager and executes the specified wager. By way of example, the wager controller may determine that the user hit a jackpot of 6 credits and returns the 6 credits to the Cr and communicates to the process controller that 3 net credits were won by the user.

The process controller communicates to the interactive processing device to add 3 bullets to an ammunition clip. The interactive processing device adds 3 bullets back to the ammo clip. The ammunition may be added by directly adding the ammunition to the clip or by allowing the user to find extra ammunition during use. The process controller logs the new user score (AC) in the game (as a function of the successful hit on the opponent) based on the interactive processing device communication, and adds 2 extra points to the user score since a jackpot has been won. The process controller then adds 10 points to the user score (AC) given the success of the hit which in this example is worth 8 points, plus the 2 extra point. Note that this example is only intended to provide an illustration of how credits flow in a multi-directional shooting interleaved wagering system, but is not intended to be exhaustive and only lists only one of numerous possibilities of how a multi-directional shooting interleaved wagering system may be configured to manage its fundamental credits.

In many embodiments, session/management controller 1020, such as user account controller 150 of FIG. 1A, of a multi-directional shooting interleaved wagering system is used to store AC for use of the user. In such an embodiment, AC is generated by the process controller based on the user's use of the multi-directional shooting interleaved wagering system and an amount of the AC is communicated to the session/management controller 1020. The session/management controller stores the amount of AC between sessions. In some embodiments, the session/management controller communicates an amount of AC to the process controller at the start of a session for use by the user during a session.

When wagering is complete, the multi-directional shooting interleaved wagering system transfers (k) Cr 1002 off of the one or more credit meters and out of the multi-directional shooting interleaved wagering system using the credit processing system 1016. In some embodiments, the multi-directional shooting interleaved wagering system transfers AC 1006 off of the one or more credit meters and out of the multi-directional shooting interleaved wagering system using the credit processing system 1016.

Figure 10:
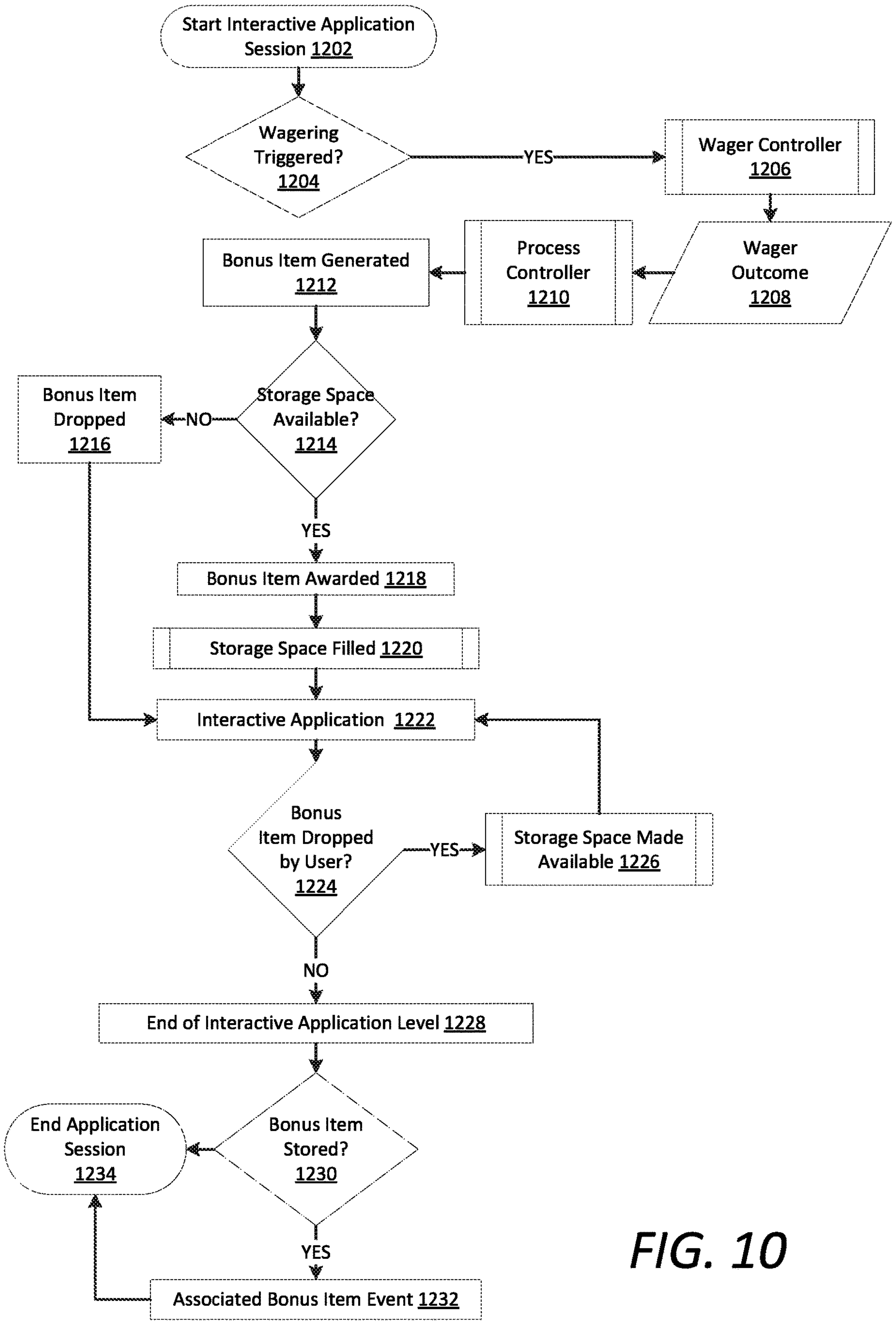
FIG. 10 illustrates a flowchart of steps that may be performed to create a multi-directional shooting interleaved wagering system providing a reveal of wagering outcomes to a user in accordance with various embodiments of the invention.

FIG. 10 illustrates a flowchart of steps that may be performed to create a multi-directional shooting interleaved wagering system providing a reveal of wagering outcomes to a user in accordance with various embodiments of the invention. Specifically, the system would generate a graphical display with a skill based item selection process based on user interactions within the application and including a possible award at the end of the session.

Various embodiments of the multi-directional shooting interleaved wagering system may use different environments and interactive application components appropriate for that depiction. In one embodiment, the multi-directional shooting interleaved wagering system is set in outer space. The user controls a spaceship in an asteroid field which is periodically traversed by opposing ships such as flying saucers.

In the example embodiment, the objective of the interactive application is to destroy asteroids and saucers. The user controls a ship that can rotate left and right, fire shots straight forward, and move forward. In some embodiments, once the ship begins moving in a direction, it will continue in that direction for a time without user intervention unless the user applies thrust in a different direction. The ship may have a limited amount of fuel to generate thrust with.

Different power-up items may be available to users as interactive application components. These components may include, but are not limited to: Shields, which give limited amount of protection, indicated through the graphical display; Blasters, which gives the ship double shots; Extra Shot Power, which allows shots to penetrate everything; Extra Fuel, which allows ship to move through the display; Extra Fuel Capacity, which increases fuel capacity; and Booster, which increases movement speed for the ship.

The goal is to shoot and destroy asteroids and saucers while not colliding with either, and to avoid being hit by the saucers' counter-fire. Subsequent levels have increased difficulty, which may be caused by a variety changes within the process controller.

In some embodiments, asteroids may come in different types. In some embodiments, the asteroids may come in varying sizes, and when shot, larger asteroids break into multiple smaller ones, increasing the number of targets. Only shooting the smallest ones will actually remove them. Asteroids may be used to introduce interactive application components such as power-ups. Normal asteroids don't contain anything, but special asteroids can contain power-ups that are released by completely destroying asteroids.

In some embodiments, different types of opponent ships may be introduced in the application. These ships may fire different weapons, move at different speeds, be more difficult to destroy, etc. During the use of the interactive application, a user may trigger various wagering events.

As illustrated in FIG. 10, one embodiment of the process starts with an initiation of an interactive application session (1202). In some embodiments, an interactive processing device initiates the interactive application session in response to an indication from a user via a user input device. In some embodiments, the interactive processing device initiates the interactive application session in response to an indication from the wager controller that credits have been loaded onto a credit meter.

The interactive processing device communicates application telemetry to a process controller. The process controller receives the application telemetry from the interactive processing device and determines whether a wager is triggered (1204). In some embodiments, a wager is triggered when the user acts on an actionable element in an interactive application. In an example embodiment, a wager is triggered in a space themed game when the user's space ship destroys an enemy space ship. When a wager is triggered, the process controller communicates, to the wager controller 1206, a wager request. The wager controller 1206 receives the wager request from the process controller and generates a wager outcome (1208).

The wager controller 1206 communicates, to the process controller 1210, the wager outcome. The process controller 1210 receives, from the wager controller 1206, the wager outcome. The process controller 1210 determines, based on the wager outcome, whether a bonus item is generated (1212). In some embodiments, the wager results are associated with a database within the process controller which then determines which prestored interactive application components should be generated in the graphical display. In some embodiments, these application components may be bonus items. In some embodiments, the bonus items are a free play, or a bet boost, or another benefit for the user outside the interactive application. The user may save this bonus item until the completion of the current session and redeem it for a free wager, a bonus game, an addition to a bet. During the interactive application session, the user can only store a limited number of items, and if the user has no available storage space, the generated item is discarded.

The process controller determines whether there is space available for the generated bonus item (1214). When there is no space available, the generated bonus item is dropped (1216). When there is space available, the bonus item is awarded (1218) and a storage space is filled (1220). The interactive application is provided for the user to interact with (1222).

The process controller determines whether a bonus item is dropped by the user (1224). When a bonus item is dropped by the user, the process controller determines that a storage space is made available (1226). In some embodiments, the user provides an indication to the interactive processing device that the user would like to drop a bonus item and the interactive processing device communicates the indication to the process controller.

When an item is not dropped by the user, the interactive application level is concluded (1228). The process controller determines whether a bonus item is stored (1230). When a bonus item is stored, an associated bonus item event is provided by the interactive processing device (1232). When a bonus item is not stored, the application session ends (1234).

Figure 11:
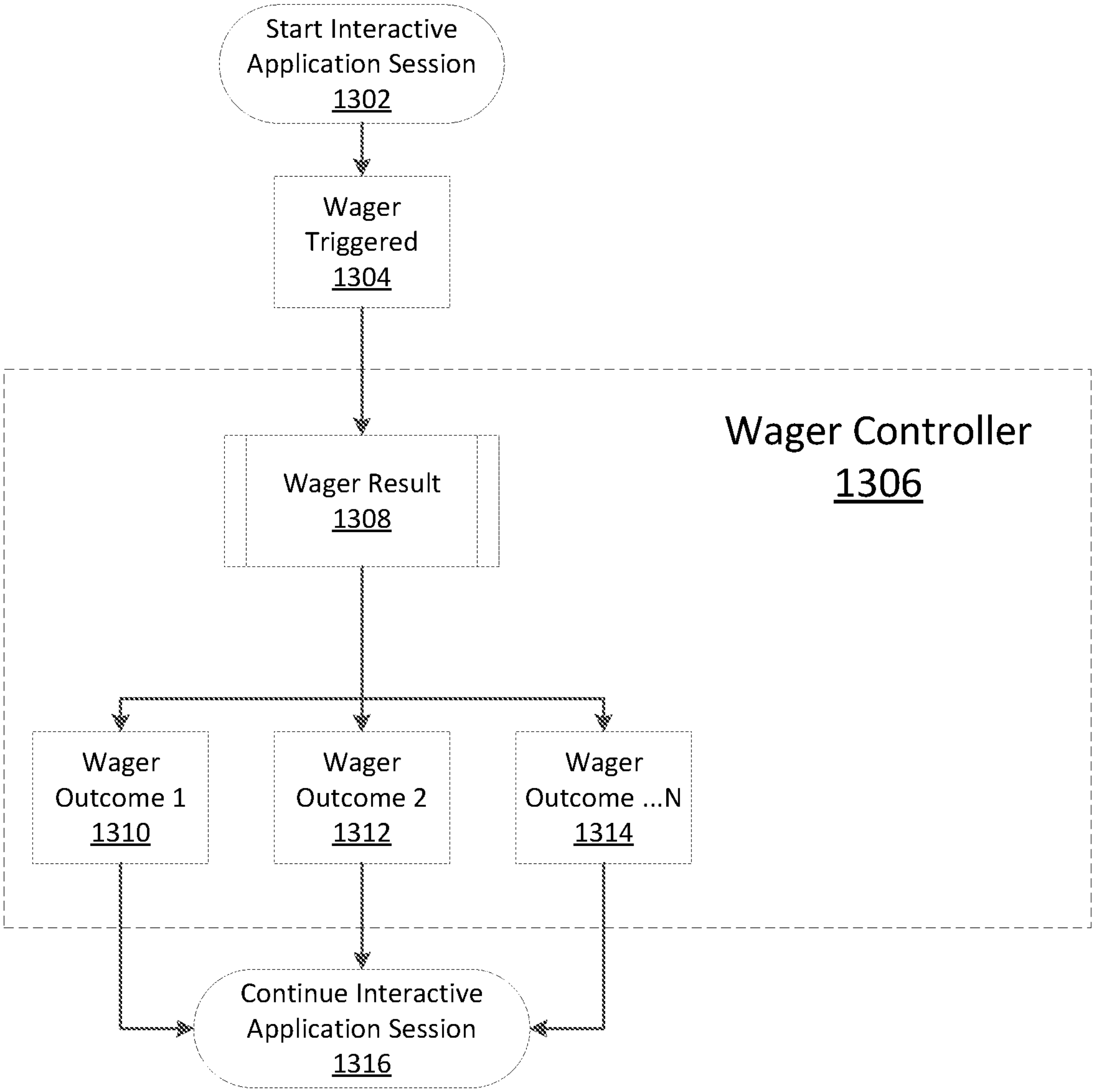
FIG. 11 illustrates a flowchart of steps that may be performed in accordance with some embodiments of the invention.

FIG. 11 illustrates a flowchart of steps that may be performed in accordance with some embodiments of the invention. As illustrated in FIG. 11, the different wager outcomes are generated by a wager controller 1306 within the system.

The process starts with an initiation of an interactive application session (1302). During the interactive application session, a wager is triggered, as described herein (1304). When a wager is triggered, the wager controller 1306 generates a wager result (1308). Based on the wager result, one or more wager outcomes 1310-1314 are determined. Once the wager outcomes are determined, the interactive application continues, as described herein (1316).

Figure 12:
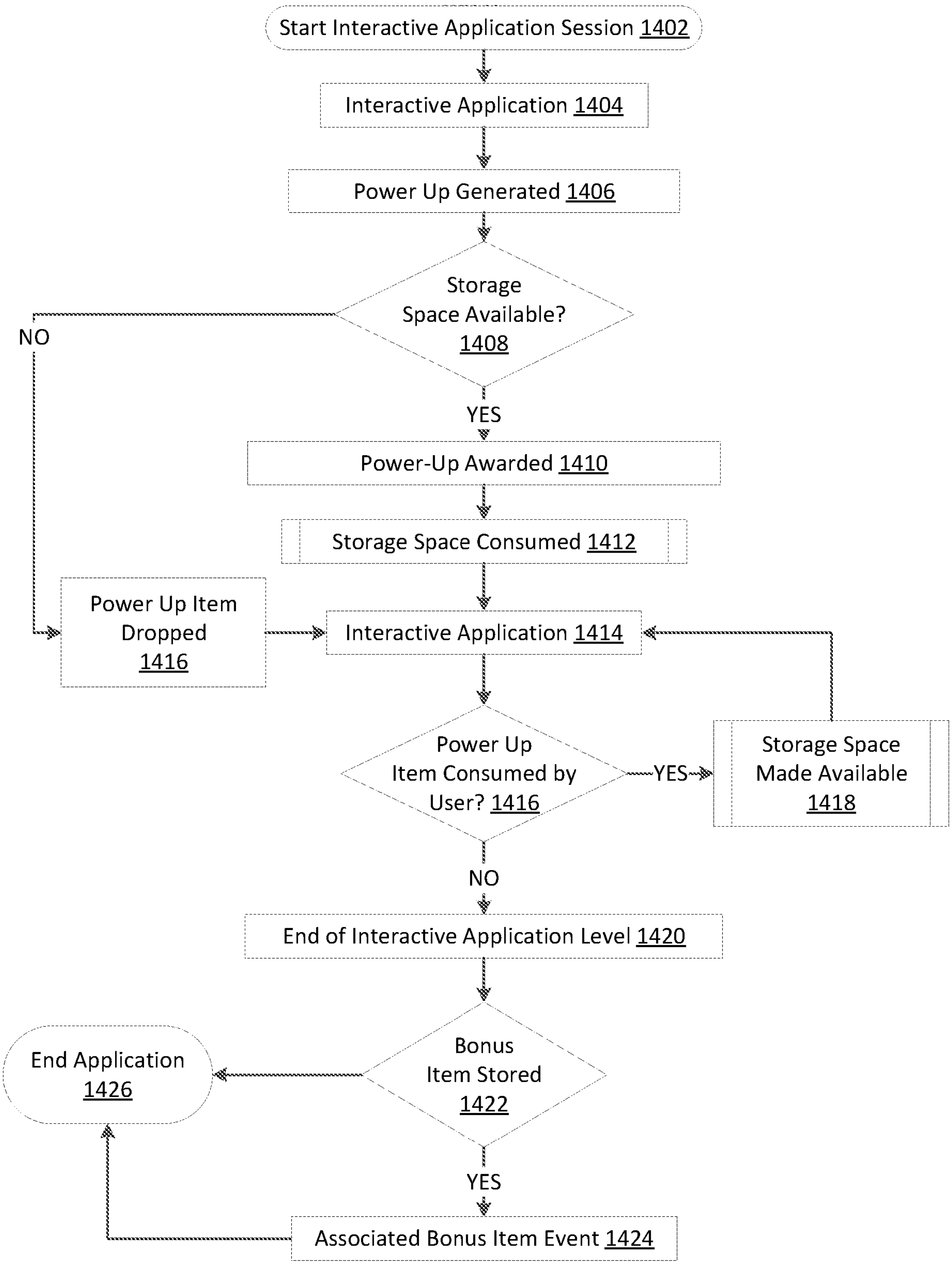
FIG. 12 illustrates a flowchart of steps that may be performed in accordance with some embodiments of the invention.

FIG. 12 illustrates a flowchart of steps that may be performed in accordance with some embodiments of the invention. As shown in FIG. 12, the items a user can store may be bonus items or power-ups for use within the interactive application. A user may choose which items to store, and saving a bonus item costs the user the opportunity to save a power-up in its place. If a ship associated with the user is destroyed in the interactive application before completing the session, the bonus item cannot be redeemed. A user with less skill may need all of the user's storage for power-ups and may not be able to store the bonus item. A user with more skill may keep the bonus item and successfully complete the session with one less storage space. At the end of the session, the more skillful user may then redeem the bonus item.

The interactive application session is initiated (1402). The interactive application may be provided by an interactive processing device. The user interacts with the interactive application (1404). A power-up to be used in the interactive application session is generated based on the user's performance in the interactive application (1406). The interactive application is associated with an interactive application goal and the power-up may assist the user in achieving the interactive application goal.

Whether there is storage space associated with the user in the interactive application session is determined (1408). In some embodiments, the process controller makes this determination. When storage space is available, the power-up item is awarded (1410). When storage space is not available, the power-up item is dropped. In some embodiments, when the power-up item is awarded or when the power-up item is dropped, the process controller communicates an indication to the interactive processing device to configure the display to display the awarding or the dropping of the power-up item.

When the power-up item is awarded, a storage space is consumed (1412). In some embodiments, the process controller determines that the storage space is consumed. The interactive application session continues (1414).

During the user's interaction with the interactive application, the power-up may be consumed. The process controller determines based on application telemetry provided by the interactive processing device, whether the power-up is consumed by the user (1416). When the power-up is consumed by the user, a storage space is made available (1418). When the power-up is not consumed by the user, the interactive application level is concluded (1420).

The process controller determines whether a bonus item is stored (1422). When it is determined that a bonus item is stored, an associated bonus item event is provided (1424). When the bonus item is not stored, the interactive application session is concluded (1426).

Figure 13:
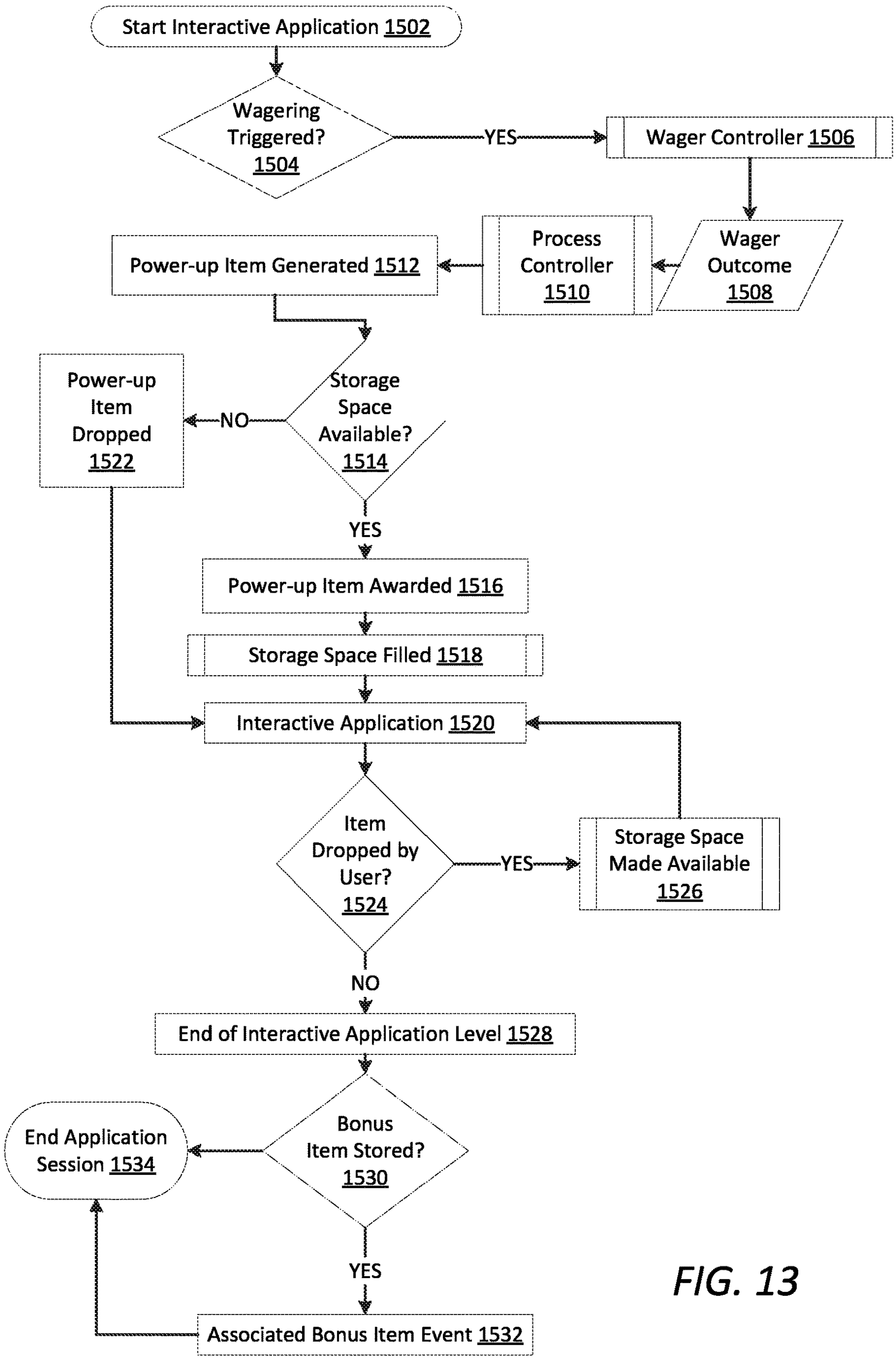
FIG. 13 illustrates a flowchart of steps that may be performed in accordance with some embodiments of the invention.

FIG. 13 illustrates a flowchart of steps that may be performed in accordance with some embodiments of the invention. In some embodiments, the power-ups generated during the session may occur solely within the process controller. As illustrated in FIG. 13, in other embodiments, the power-ups may be associated with outcomes defined by the wager controller and then the results communicated to the process controller, which then determines which pre-stored interactive application components should be generated in the graphical display.

An interactive application session is initiated (1502). In some embodiments, the interactive application session is provided by the interactive processing device. A user interacts with the interactive application and the interactive processing device communicates application telemetry to the process controller based on the user's interactions. The process controller determines a wager is triggered based on the application telemetry (1504). When the wager is triggered, the process controller communicates, to the wager controller, wager request data. The wager controller 1506 determines a wager outcome (1508) based on the wager request data.

The wager controller 1506 communicates the wager outcome data to the process controller 1510. The process controller 1510 determines whether a power-up item is generated (1512). The process controller also determines whether storage space is available for the user (1514). When storage space is available, the power-up item is awarded and associated with the user (1516). When storage space is not available, the power-up item is dropped (1522).

The process controller determines whether the storage space is filled (1518). When the storage space is filled, the process controller communicates an indication to the interactive processing device that the storage space is filled. The interactive application session continues (1520) and the interactive processing device communicates application telemetry to the process controller. The process controller determines whether an item is dropped by the user based on the application telemetry (1524). When an item is dropped by the user, storage space is made available (1526). When an item is not dropped by the user, the interactive application level is concluded (1528).

The process controller determines whether a bonus item associated with the user is stored (1530). When the process controller determines that a bonus item is stored, an associated bonus item event is provided (1532). In some embodiments, the associated bonus item event is provided by the interactive processing device.

When a bonus item is not stored or at the conclusion of the provided bonus item event, the application session is concluded (1534).

Figure 14:
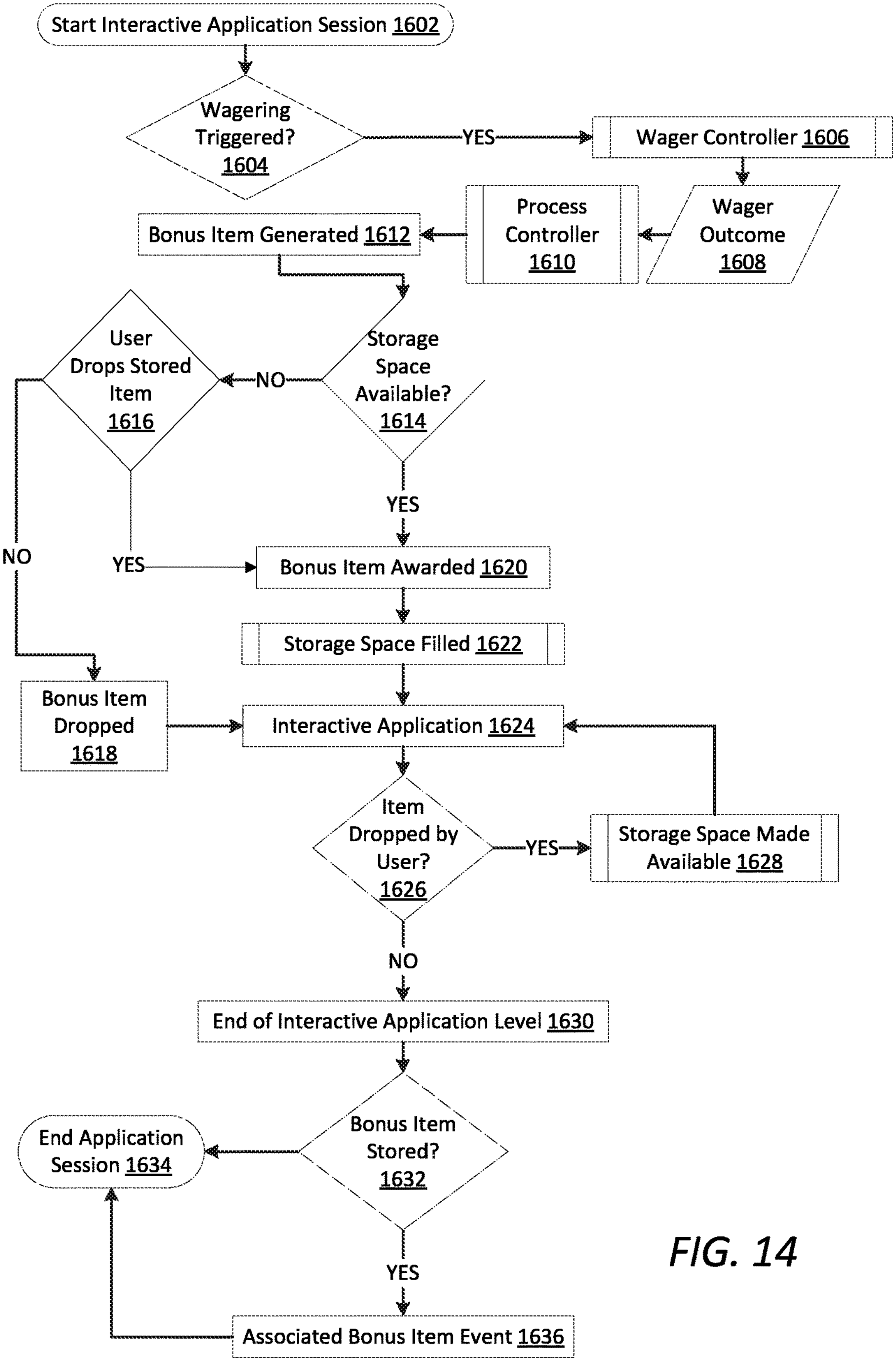
FIG. 14 illustrates a flowchart of steps that may be performed in accordance with some embodiments of the invention.

FIG. 14 illustrates a flowchart of steps that may be performed in accordance with some embodiments of the invention. As shown in FIG. 14, the user may have the opportunity to discard a current bonus item from storage and accept the new item instead of automatically dropping any items if there is no storage space.

Different wagering systems may be used in various embodiments to optimize the results. This allows the operator to determine the return to the player (RTP) within the system.

In one example embodiment, the wagering system absent any bonus items returns 84% of all funds to the users in the form of wagering wins. The user wagers during the interactive application session. Coincident with each wager triggered, there is a 10% chance to generate a bonus item. The bonus item in this embodiment gives the user a free wager. The free wager has the same 84% RTP. Because the user, on average, wins 1 free wager for each 10 bets made, the RTP is 84%×(10 paid bets+1 free bet)/(10 paid bets)=92.4%.

In another example embodiment, the wagering system absent any bonus items returns 84% of all funds to the users in the form of wagering wins. The user is required to wager 10 credits for each wager triggered. Coincident with each wager triggered, there is a 10% chance to generate a bonus item. The bonus item gives the user an extra 10 credits to wager. The extra 10 credits are wagered on the same 84% RTP game. Because the user, on average, wins 10 extra credits for every 100 credits wagered, the RTP is 84%×(110 credits bet)/(100 credits paid)=92.4%.

In another example embodiment, the wagering system absent any bonus items returns 89% of all funds to the users in the form of wagering wins. The user is required to wager 10 credits for each wager triggered. Coincident with each wager triggered, there is a 10% chance to generate a bonus item. The bonus item gives the user an extra 5 credits to wager. The extra 5 credits are wagered on the same 89% RTP game. Because the player, on average, wins 5 extra credits for every 100 credits wagered, the RTP is 89%×(105 credits bet)/(100 credits paid)=93.45%.

An interactive application session is initiated (1602). In some embodiments, the interactive application session is provided by the interactive processing device. A user interacts with the interactive application and the interactive processing device communicates application telemetry to the process controller based on the user's interactions. The process controller determines a wager is triggered based on the application telemetry (1604). When the wager is triggered, the process controller communicates, to the wager controller, wager request data. The wager controller 1606 determines a wager outcome (1608) based on the wager request data.

The wager controller 1606 communicates the wager outcome data to the process controller 1610. The process controller 1610 determines whether a bonus item is generated (1612). The process controller also determines whether storage space is available for the user (1614). When storage space is available, the bonus item is awarded and associated with the user (1620). When storage space is not available, the user determines whether to drop a stored item (1616). When the stored item is dropped, the bonus item is awarded and associated with the user (1620). When the stored item is not dropped, the bonus item is dropped (1618).

The storage space is filled (1622). The interactive application session continues (1624) and the interactive processing device communicates application telemetry to the process controller. The process controller determines whether an item is dropped by the user based on the application telemetry (1626). When an item is dropped by the user, storage space is made available (1628). When an item is not dropped by the user, the interactive application level is concluded (1630).

The process controller determines whether a bonus item associated with the user is stored (1632). When the process controller determines that a bonus item is stored, an associated bonus item event is provided (1636). In some embodiments, the associated bonus item event is provided by the interactive processing device.

When a bonus item is not stored or at the conclusion of the provided bonus item event, the application session is concluded (1634).

Figure 15:
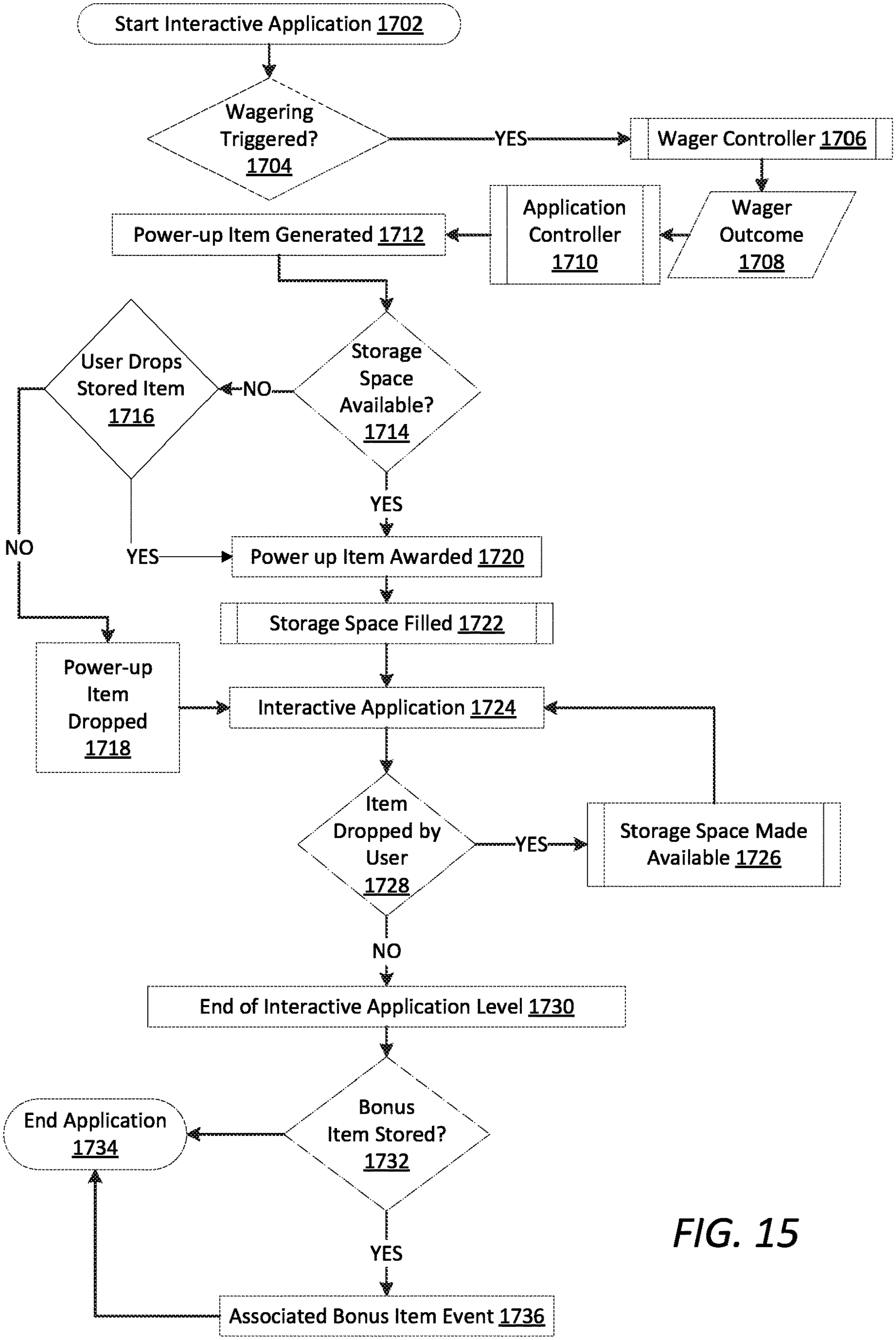
FIG. 15 illustrates a flowchart of steps that may be performed in accordance with some embodiments of the invention.

FIG. 15 illustrates a flowchart of steps that may be performed in accordance with some embodiments of the invention. As shown in FIG. 15, the user may have the opportunity to discard a current power-up item from storage and accept the new item instead of automatically dropping any items if there is no storage space.

An interactive application session is initiated (1702). In some embodiments, the interactive application session is provided by the interactive processing device. A user interacts with the interactive application and the interactive processing device communicates application telemetry to the process controller based on the user's interactions. The process controller determines a wager is triggered based on the application telemetry (1704). When the wager is triggered, the process controller communicates, to the wager controller, wager request data. The wager controller 1706 determines a wager outcome (1708) based on the wager request data.

The wager controller 1706 communicates the wager outcome data to the process controller 1710. The process controller 1710 determines whether a power-up item is generated (1712). The process controller also determines whether storage space is available for the user (1714). When storage space is available, the power-up item is awarded and associated with the user (1720). When storage space is not available, the user determines whether to drop a stored item (1716). When the stored item is dropped, the power-up item is awarded and associated with the user (1720). When the stored item is not dropped, the power-up item is dropped (1718).

The storage space is filled (1722). The interactive application session continues (1724) and the interactive processing device communicates application telemetry to the process controller. The process controller determines whether an item is dropped by the user based on the application telemetry (1728). When an item is dropped by the user, storage space is made available (1726). When an item is not dropped by the user, the interactive application level is concluded (1730).

The process controller determines whether a bonus item associated with the user is stored (1732). When the process controller determines that a bonus item is stored, an associated bonus item event is provided (1736). In some embodiments, the associated bonus item event is provided by the interactive processing device.

When a bonus item is not stored or at the conclusion of the provided bonus item event, the application session is concluded (1734).

Figure 16:
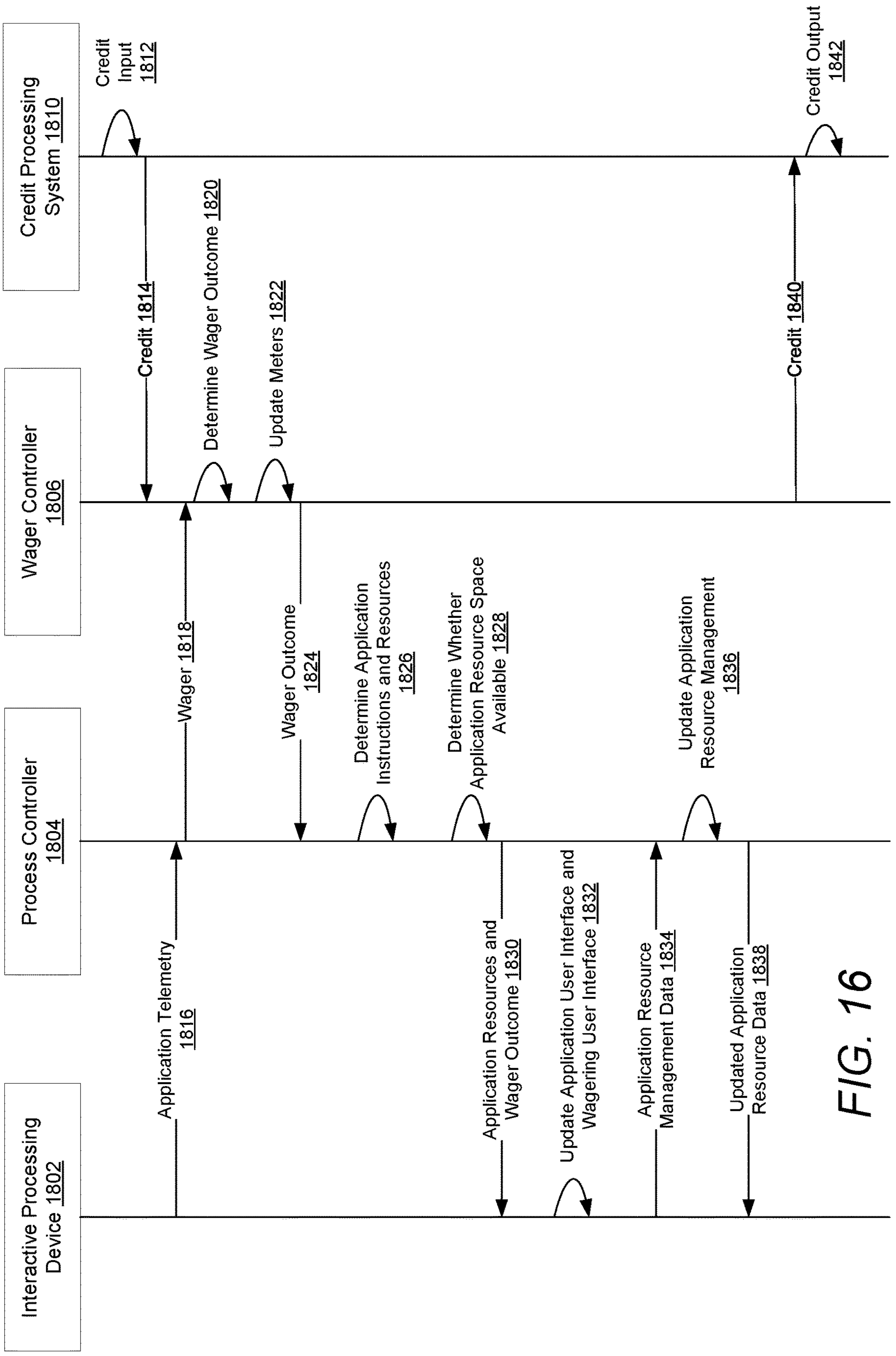
FIG. 16 is a sequence diagram of interactions between components of a multi-directional shooting interleaved wagering system in accordance with various embodiments of the invention.

FIG. 16 is a sequence diagram of interactions between components of a multi-directional shooting interleaved wagering system in accordance with various embodiments of the invention. The system includes an interactive processing device 1802, a process controller 1804, a wager controller 1806, and a credit processing system 1810, each as described herein.

In various embodiments, communication of outgoing data between a controller (or device) and another controller (or device) is achieved by the controller encoding data to be communicated into a signal and transmitting the signal to the another controller. Communication of incoming data is achieved by the controller receiving from the another controller signals encoding the incoming data. The controller decodes the signals to obtain the incoming data.

In some such embodiments, two or more controllers implement a controller-to-controller communication protocol as an interdevice communication protocol so that the two or more controllers may be implemented on different processing devices. The interdevice communication protocol may utilize a wired communication bus or wireless connection as a physical layer. In yet other such embodiments, the controller-to-controller communication protocol is implemented as a networking protocol so that the two or more controllers may be implemented on different devices operatively connected by a network. The networking protocol may utilize a wired communication bus or wireless connection as a physical layer. In many such embodiments, the network includes a cellular telephone network or the like and one or more of the controllers is a mobile device such as a smartphone or other device capable of using the cellular telephone network.

In some embodiments, communication is achieved by two or more of the controllers implementing a controller-to-controller communication protocol as an interprocess communication protocol so that the two or more controllers may be implemented on the same device.

In some embodiments, the interactive processing device 1802 provides an interactive application. In some embodiments, the interactive application is an interactive game. In some embodiments, the interactive game is a skill-based game. In some embodiments, the interactive game is a chance-based game. In some embodiments, the interactive game is a multi-directional shooting interactive game, as described herein.

In some embodiments, the interactive processing device 1802, the process controller 1804, the wager controller 1806, and the credit processing system 1810 are separated into different components in order to distribute computing responsibilities to provide improved latency results. In some embodiments, the interactive processing device 1802 dedicates its resources toward providing the interactive application, and may be unable to perform the additional processing performed by the process controller 1804 without sacrificing latency.

The credit processing system 1810 receives a credit input (1812). In some embodiments, the credit is a real currency credit. In some embodiments, the credit is a virtual currency credit. In some embodiments, the credit input is an insertion of a real currency or virtual currency into a credit input device, as described herein. The credit processing system 1810 communicates, to the wager controller 1806, credit data (1814). The wager controller 1806 receives, from the credit processing system 1810, the credit data (1814). As described herein, the wager controller 1806 configures one or more credit meters based on the credit data.

During operation, in various embodiments, the interactive processing device 1802 is constructed to provide an interactive application display associated with the interactive application provided by the interactive processing device 1802. The interactive processing device 1802 communicates, to the process controller 1804, application telemetry data (1816). In some embodiments, the application telemetry data includes, but is not limited to, interactions and events that occur in the interactive application as executed by the interactive processing device 1802. In some embodiments, the interactive processing device 1802 is constructed to continuously generate and communicate the application telemetry data associated with the interactive application.

In some embodiments, the application telemetry data follows an application telemetry data protocol. In some embodiments, the application telemetry data protocol comprises an account identification. In some embodiments, the application telemetry protocol includes an identification of the interactive application. In some embodiments, the application telemetry data protocol includes an action or event occurring in the interactive application. In some embodiments, the application telemetry data protocol includes application telemetry data encoded as a string. In some embodiments, the application telemetry data protocol includes application telemetry data encoded as an array of the elements making up the application telemetry data. In some embodiments, the application telemetry protocol includes application telemetry data formatted as a concatenation of data of elements making up the application telemetry data.

The process controller 1804 receives, from the interactive processing device 1802, the application telemetry data (1816). In some embodiments, the process controller 1804 is constructed to continuously monitor the interactive processing device 1802 for the application telemetry data.

The process controller 1804 scans the application telemetry data to determine whether to trigger a wager request. In some embodiments, the process controller 1804 determines whether to trigger wager by parsing the application telemetry data into elements; matching each element to a table of elements that trigger a wager request; and when an element of the application telemetry data is present in the table, determine that a wager request should be triggered.

When a wager request is triggered, the process controller 1804 generates wager request data and commands the wager controller 1806 by communicating the wager request data to the wager controller 1806 (1818). In some embodiments, the wager request data follows a wager request protocol. In some embodiments, the wager request protocol includes an account identification. In some embodiments, the wager request protocol includes an identification of the interactive application. In some embodiments, the wager request protocol includes a wager amount. In some embodiments, the wager request protocol includes a paytable and/or wagering mechanic. In some embodiments, data encoded in accordance with the wager request protocol is formatted as a string. In some embodiments, data encoded in accordance with the wager request protocol is formatted as an array of the elements making up the wager request data. In some embodiments, data encoded in accordance with the wager request protocol is formatted as a concatenation of the data of elements making up the wager request data.

The wager controller 1806 receives, from the process controller 1804, the wager request data (1818). In some embodiments, the wager controller 1806 is constructed to continuously monitor the process controller for communication of the wager request data.

The wager controller 1806, in response to receiving the wager request data, automatically determines a wager outcome based on the wager request data (1820). The wager controller 1806 also automatically updates one or more credit meters based on the wager outcome (1822). In an example embodiments, the wager outcome results in a win of 10 credit units to a user. The wager controller 1806 updates a meter associated with the user to reflect the winning of the 10 credit units.

The wager controller 1806 communicates the wager outcome data to the process controller 1804 (1824). The process controller 1804 receives, from the wager controller 1806, the wager outcome data (1824).

In response to receiving the wager outcome data, the process controller 1804 scans the wager outcome data and automatically determines wagering telemetry data based on the wager outcome data. In response to receiving the data, the process controller 1804 scans the wager outcome data and also automatically determines application resource data based on the wager outcome data (1826). A particular application resource may be associated with a particular wager outcome. In an example embodiment, when the wager outcome is a win of 20 credits, the application resource generated is a power-up item. In another example embodiment, when the wager outcome is a loss of credits, the application resource generated is a bonus item.

The process controller 1804 determines whether there is space available for the generated application resource (1828). In some embodiments, the user is allocated a predetermined finite number of spaces for application resources. As described herein, when there is available space for the generated application resource, the application resource is presented to the user. When the spaces for application resources are all occupied, the user may be presented with an option to keep the application resource and discard a stored application resource, or to discard the application resource.

The process controller 1804 commands the interactive processing device 1802 by communicating wagering telemetry data and the application resource data to the interactive processing device 1802 (1830). The interactive processing device 1802 receives, from the process controller 1804, the wagering telemetry data and the application resource data (1830).

In response to receiving the wagering telemetry data, the interactive processing device 1802 automatically configures a wagering user interface using the wagering telemetry data, as described herein (1832). The interactive processing device 1802 also automatically incorporates the application resource data into the interactive application as described herein, thus affecting the interactive application. The interactive processing device 1802 may automatically configure the display to present the user the option of managing the application resources when the application resource spaces are all occupied.

When the user provides the interactive processing device 1802 with application resource management instructions, the interactive processing device 1802 communicates, to the process controller 1804, application resource management data (1834). In some embodiments, the application resource management instructions include an indication to discard a previously stored application resource. In some embodiments, the application resource management instructions include an indication to discard the newly generated application resource.

The process controller 1804 receives, from the interactive processing device 1802, the application resource management data (1834). The process controller 1804 updates application resource management based on the application resource management data (1836). In some embodiments, updating application resource management includes adding and/or discarding application resources associated with the user.

The process controller 1804 communicates, to the interactive processing device 1802, updated application resource data (1838). The interactive processing device 1802 receives, from the process controller 1804, the updated application resource data (1838). The interactive processing device 1802 automatically configures the display based on the updated application resource data.

The wager controller 1806 communicates credit output data to the credit processing system 1810 (1840). The credit processing system 1810 receives, from the wager controller 1806, the credit output data (1840). In some embodiments, the wager controller 1806 communicates the credit output data based on receiving an indication from the process controller 1804 that the user has indicated a request for credit output.

The credit processing system 1810 provides a credit output based on the credit output data (1842). The credit output may be provided by the credit output device, as described herein.

While the above description may include many specific embodiments of the invention, these should not be construed as limitations on the scope of the invention, but rather as examples of embodiments thereof. It is therefore to be understood that the present invention can be practiced otherwise than specifically described, without departing from the scope and spirit of the present invention. Thus, embodiments of the present invention described herein should be considered in all respects as illustrative and not restrictive.

What is claimed:

1. An electronic gaming machine, comprising:
an interactive processing device constructed to:
receive from a wager controller via a process controller, an indication that credit has been loaded onto a credit meter;
initiate an interactive application that accepts input from a user using the loaded credit;
distribute the input from the user to the process controller;
receive, from the process controller, a wager result and bonus item data;
generate a visual display of a wagering user interface based on the wager result; and
provide a bonus item event based on the wager result; and
the wager controller constructed to:
receive, from the user, the credit; load the credit onto the credit meter;
distribute the indication of the loaded credit to the process controller;
receive, from the process controller, a wager request;
generate the wager result;
update the credit meter based on the wager result; and
distribute the wager result to the process controller; and
the process controller operatively connecting the interactive processing device and the wager controller, the process controller constructed to:
receive, from the wager controller, the indication of the loaded credit;
distribute, to the interactive processing device, the indication of the loaded credit;
receive, from the interactive processing device, the input from the user;
generate the wager request based on the input from the user, wherein the wager request includes wager terms;
distribute the wager request to the wager controller;
receive, from the wager controller, the wager result;
distribute the wager result and the bonus item data to the interactive processing device;
determine if a bonus item has been collected by the user; and
distribute, to the interactive processing device, instructions to initiate the bonus item event.

2. The electronic gaming machine of claim 1,
wherein the interactive processing device and the process controller are constructed from the same device, and
wherein the process controller is operatively connected to the wager controller using a communication link.

3. The electronic gaming machine of claim 1,
wherein the wager controller and the process controller are constructed from the same device, and
wherein the process controller is operatively connected to the interactive processing device using a communication link.

4. The electronic gaming machine of claim 1, further comprising:
an enclosure constructed to mount:
a user input device operatively connected to the interactive processing device;
a user output device operatively connected to the interactive processing device;
a credit input device operatively connected to the wager controller; and
a credit output device operatively connected to the wager controller.

5. The electronic gaming machine of claim 4, wherein the wager controller is further constructed to communicate with the credit output device to generate a credit output based on the wager result.

6. The electronic gaming machine of claim 1, wherein when there is space available for a generated application resource based on the wager result, an application resource is assigned to the user and the application resource is displayed to the user.

7. An electronic gaming machine, comprising:
an interactive processing device constructed to:
receive from a wager controller via a process controller, an indication that credit has been loaded onto a credit meter;

initiate an interactive application that accepts input from a user using the loaded credit;

distribute the input from the user to the process controller;

receive, from the process controller, a wager result and bonus item data;

generate a visual display of a wagering user interface based on the wager result;

and provide a bonus item event based on the wager result; and the process controller operatively connecting the interactive processing device and the wager controller, the process controller constructed to:

receive, from the wager controller, the indication of the loaded credit;

distribute, to the interactive processing device, the indication of the loaded credit;

receive, from the interactive processing device, the input from the user;

generate the wager request based on the input from the user, wherein the wager request includes wager terms;

distribute the wager request to the wager controller;

receive, from the wager controller, the wager result;

distribute the wager result and the bonus item data to the interactive processing device;

determine if the bonus item has been collected by the user; and distribute, to the interactive processing device, instructions to initiate the bonus item event.

8. The electronic gaming machine of claim 7, further comprising:

an enclosure constructed to mount:

a user input device operatively connected to the interactive processing device;

a user output device operatively connected to the interactive processing device;

a credit input device operatively connected to the wager controller; and a credit output device operatively connected to the wager controller.

9. The electronic gaming machine of claim 8, wherein the wager controller is further constructed to communicate with the credit output device to generate a credit output based on the wager result.

10. The electronic gaming machine of claim 7, wherein when there is space available for a generated application resource based on the wager result, an application resource is assigned to the user and the application resource is displayed to the user.

11. An electronic gaming machine, comprising:

a wager controller constructed to:

receive, from a user, a credit;

load the credit onto a credit meter;

distribute an indication of the loaded credit to a process controller;

receive, from the process controller, a wager request;

generate a wager result;

update the credit meter based on the wager result; and distribute the wager result to the process controller; and the process controller operatively connecting an interactive processing device and the wager controller, the process controller constructed to:

receive, from the wager controller, the indication of the loaded credit;

distribute, to the interactive processing device, the indication of the loaded credit;

receive, from the interactive processing device, an input from the user;

generate the wager request based on the input from the user, wherein the wager request includes wager terms;

distribute the wager request to the wager controller;

receive, from the wager controller, the wager result;

distribute the wager result and bonus item data to the interactive processing device;

determine if a bonus item has been collected by the user; and distribute, to the interactive processing device, instructions to initiate a bonus item event.

12. The electronic gaming machine of claim 11, further comprising:

an enclosure constructed to mount:

a user input device operatively connected to the interactive processing device;

a user output device operatively connected to the interactive processing device;

a credit input device operatively connected to the wager controller; and a credit output device operatively connected to the wager controller.

13. The electronic gaming machine of claim 12, wherein the wager controller is further constructed to communicate with the credit output device to generate a credit output based on the wager result.

14. The electronic gaming machine of claim 11, wherein when there is space available for a generated application resource based on the wager result, an application resource is assigned to the user and the application resource is displayed to the user.

* * * * *